(12) United States Patent
Huang

(10) Patent No.: US 9,154,344 B2
(45) Date of Patent: Oct. 6, 2015

(54) CHARGE-DOMAIN FILTER APPARATUS AND OPERATION METHOD THEREOF

(71) Applicant: Industrial Technology Research Institute, Hsinchu (TW)

(72) Inventor: Ming-Feng Huang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/255,975

(22) Filed: Apr. 18, 2014

(65) Prior Publication Data

US 2015/0200794 A1     Jul. 16, 2015

(30) Foreign Application Priority Data

Jan. 13, 2014 (TW) .............................. 103101163 A

(51) Int. Cl.
    *H04B 1/10*           (2006.01)
    *H04L 25/08*         (2006.01)
    *H04B 1/12*           (2006.01)

(52) U.S. Cl.
    CPC ................ *H04L 25/08* (2013.01); *H04B 1/123* (2013.01)

(58) Field of Classification Search
    CPC ................................ H04L 25/08; H04B 1/123
    USPC .......... 375/350, 295, 316, 343, 346; 327/146, 327/552, 554
    See application file for complete search history.

(56) References Cited

U.S. PATENT DOCUMENTS

| | | | |
|---|---|---|---|
| 5,805,715 | A | 9/1998 | Rhee |
| 6,856,925 | B2 | 2/2005 | Muhammad et al. |
| 7,006,813 | B2 | 2/2006 | Staszewski et al. |
| 7,327,182 | B2 | 2/2008 | Dosho et al. |
| 7,535,288 | B2 | 5/2009 | Iida |
| 7,636,012 | B2 | 12/2009 | Iida |
| 7,940,104 | B2 | 5/2011 | Yoshizawa et al. |

(Continued)

FOREIGN PATENT DOCUMENTS

| | | |
|---|---|---|
| CN | 102215030 | 10/2011 |
| CN | 103117723 | 5/2013 |
| CN | 103166594 | 6/2013 |
| TW | 201136175 | 10/2011 |

(Continued)

OTHER PUBLICATIONS

Jakonis et al., "A 2.4-GHz RF sampling receiver front-end in 0.18-μm CMOS," IEEE Journal of Solid-State Circuits, Jun. 2005, pp. 1265-1277.

(Continued)

*Primary Examiner* — Dhaval Patel
(74) *Attorney, Agent, or Firm* — Jianq Chyun IP Office

(57) ABSTRACT

A charge-domain filter (CDF) apparatus and an operation method thereof are provided. The CDF apparatus includes an input-signal combination network (ISCN), a switch-capacitor network (SCN) module, an output-signal combination network (OSCN), and a bandwidth compensation network (BCN). The input terminal of the ISCN receives an input signal. The SCN module is connected between the ISCN and the OSCN. The OSCN outputs an output signal of the CDF apparatus. The BCN senses the signal of the SCN module, senses the signal of the OSCN, or senses the signal of each of the SCN module and the OSCN, and correspondingly generates a forward signal or a feedback signal for the ISCN or the OSCN according to the sensing result to perform bandwidth compensation.

35 Claims, 36 Drawing Sheets

(56) References Cited

U.S. PATENT DOCUMENTS

| | | | |
|---|---|---|---|
| 7,941,475 B2 | 5/2011 | Bagheri et al. | |
| 7,962,115 B2 | 6/2011 | Huang et al. | |
| 7,982,534 B2 | 7/2011 | Huang | |
| 8,135,102 B2 | 3/2012 | Wiwel et al. | |
| 8,319,549 B2 | 11/2012 | Sengupta et al. | |
| 8,324,961 B2 * | 12/2012 | Huang | 327/554 |
| 8,339,215 B2 * | 12/2012 | Huang | 333/101 |
| 8,412,131 B2 | 4/2013 | Huang | |
| 8,487,694 B2 | 7/2013 | Huang | |
| 2008/0007326 A1 | 1/2008 | Iida | |
| 2008/0088389 A1 | 4/2008 | Iida | |
| 2009/0015306 A1 | 1/2009 | Yoshizawa et al. | |
| 2009/0021297 A1 | 1/2009 | Yoshizawa et al. | |
| 2009/0134916 A1 | 5/2009 | Iida et al. | |
| 2009/0134938 A1 | 5/2009 | Iida et al. | |
| 2009/0160577 A1 | 6/2009 | Yoshizawa et al. | |
| 2009/0161801 A1 | 6/2009 | Huang et al. | |
| 2010/0066465 A1 | 3/2010 | Huang | |
| 2011/0121893 A1 * | 5/2011 | Huang | 327/554 |
| 2011/0291750 A1 * | 12/2011 | Huang | 327/554 |
| 2012/0106686 A1 | 5/2012 | Zhang et al. | |
| 2013/0049850 A1 | 2/2013 | Huang | |
| 2013/0120033 A1 | 5/2013 | Huang | |
| 2013/0154725 A1 | 6/2013 | Huang | |

FOREIGN PATENT DOCUMENTS

| | | |
|---|---|---|
| TW | 201322625 | 6/2013 |
| TW | 201325079 | 6/2013 |

OTHER PUBLICATIONS

Park et al., "Non-Decimation FIR Filter for Digital RF Sampling Receiver with Wideband Operation Capability," RFIC 2009 IEEE Radio Frequency Integrated Circuits Symposium, Jun. 7-9, 2009, pp. 487-490.

Yoshizawa et al., "An Equalized Ultra-Wideband Channel-Select Filter with a Discrete-Time Charge-Domain Band-Pass IIR Filter," CICC '07 IEEE Custom Integrated Circuits Conference, Sep. 16-19, 2007, pp. 707-710.

Yoshizawa et al., "A Gain-Boosted Discrete-Time Charge-Domain FIR LPF with Double-Complementary MOS Parametric Amplifiers," IEEE International Solid-State Circuits Conference ISSCC, Feb. 2008, pp. 68-596.

Huang et al., "A Quadrature Charge-Domain Filter with Frequency Down-Conversion and Filtering for RF Receivers," 2009 IEEE Radio Frequency Integrated Circuits Symposium, Jun. 2009, pp. 547-550.

Ming-Feng Huang, "A Discrete-Time Charge-Domain Filter with Bandwidth Calibration for LTE Application," 2011 IEEE Custom Integrated Circuits Conference (CICC), Sep. 19-21, 2011, pp. 1-4.

Huang et al., "A Discrete-Time AAF with Clock-Efficient Charge-Domain Filter for High Attenuation and Bandwidth," IEEE Asian Solid-State Circuits Conference, Nov. 16-18, 2009, pp. 41-44.

Huang et al., "A Cascade Non-Decimation Charge-Domain Filter with Noise-Folding Reduction," IEEE Asian Solid-State Circuits Conference, Nov. 8-10, 2010, pp. 1-4.

Ming-Feng Huang, "A Quadrature Charge-Domain Filter with an Extra In-Band Filtering for RF Receivers," IEEE Radio Frequency Integrated Circuits Symposium (RFIC), May 23-25, 2010, pp. 31-34.

Geis et al., "A 0.5 mm2 Power-Scalable 0.5-3.8-GHz CMOS DT-SDR Receiver With Second-Order RF Band-Pass Sampler," IEEE Journal of Solid-State Circuits, Nov. 2010, pp. 2375-2387.

* cited by examiner

CHARGE-DOMAIN FILTER APPARATUS AND OPERATION METHOD THEREOF

CROSS-REFERENCE TO RELATED APPLICATION

This application claims the priority benefit of Taiwan application serial no. 103101163, filed on Jan. 13, 2014. The entirety of the above-mentioned patent application is hereby incorporated by reference herein and made a part of this specification.

TECHNICAL FIELD

The disclosure is related to a charge-domain filter (CDF) apparatus and an operation method thereof.

BACKGROUND

A CDF uses a filtering technique of a switched-capacitor network (SCN). The SCN is a common circuit in discrete time signal processing and includes a plurality of switches and a plurality of capacitors. By turning on and off the switches, the CDF could control the state of charge storage of the capacitors so as to filter an input signal. Compared to a capacitive resistive analog filter circuit, the filtering effect of the SCN is mainly decided according to the size ratio between the capacitors therein. Even if the process is altered to change the area of each capacitor, since the size ratio between the capacitors does not change with the process, the filtering effect of the SCN remains unchanged. Therefore, the SCN is suitable to be fabricated in a chip.

However, the average CDF decimates and samples the signal, and therefore a folding noise may be generated, thereby reducing system performance. Moreover, the average CDF generally does not use a bandwidth compensation circuit. As a result, the bandwidth thereof may be narrower, causing sinc-function distortion.

SUMMARY

An embodiment of the disclosure provides a charge-domain filter (CDF) apparatus including an input-signal combination network (ISCN), an switched-capacitor network (SCN) module, an output-signal combination network (OSCN), and a bandwidth compensation network (BCN). At least one input terminal of the ISCN receives at least one input signal. At least one input terminal of the SCN module is respectively connected to at least one output terminal of the ISCN. At least one input terminal of the OSCN is respectively connected to at least one output terminal of the SCN module, and the OSCN outputs at least one output signal. A BCN is coupled to the SCN module, wherein the BCN senses a signal of the SCN module, senses a signal of the OSCN, or senses a signal of each of the SCN module and the OSCN, and correspondingly generates at least one forward signal or at least one feedback signal for the ISCN or the OSCN according to the sensing result to perform bandwidth compensation.

An embodiment of the disclosure provides an operation method of a CDF apparatus. The operation method includes: configuring an ISCN, wherein at least one input terminal of the ISCN receives at least one input signal; configuring an SCN module, wherein at least one input terminal of the SCN module is respectively connected to at least one output terminal of the ISCN; configuring the OSCN, wherein at least one input terminal of the OSCN is respectively connected to at least one output terminal of the SCN module, and the OSCN outputs at least one output signal; sensing a signal of the SCN module, sensing a signal of the OSCN, or sensing a signal of each of the SCN module and the OSCN to obtain a sensing result; and correspondingly generating at least one feedback signal or at least one forward signal for the ISCN or the OSCN according to the sensing result to perform bandwidth compensation.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
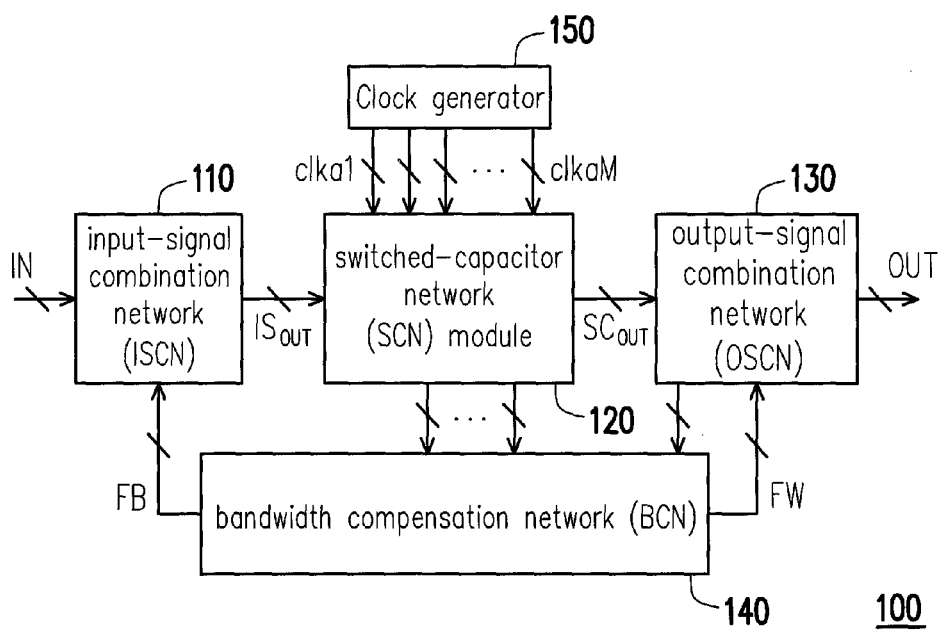
FIG. 1 is a function block diagram of a CDF apparatus according to an embodiment of the disclosure.

FIG. 1 is a function block diagram of a CDF apparatus 100 according to an embodiment of the disclosure. Referring to FIG. 1, the CDF apparatus 100 includes an ISCN 110, an SCN module 120, an OSCN 130, a BCN 140, and a clock generator 150. At least one input terminal of the ISCN 110 receives at least one input signal IN. The ISCN 110 could include an operational amplifier, a current adder, a transconductance amplifier (TA or gm amplifier), or any other circuit/apparatus capable of combining the input signal IN and/or a feedback signal FB.

The clock generator 150 is coupled to the SCN module 120 to provide M clock signals clka1, clka2, . . . , and clkaM, wherein M is a positive integer. The clock generator 150 could adjust the phase difference of the clock signals clka1, clka2, . . . , and clkaM according to a control signal, and/or adjust the pulse width of the clock signals clka1, clka2, . . . , and clkaM according to the control signal. At least one input terminal of the SCN module 120 is respectively connected to at least one output terminal of the ISCN 110. The SCN module 120 contains one or more SCNs therein, wherein each SCN has a plurality of switches and a plurality of capacitors. For instance, the SCN module 120 may contain M or M*N SCNs, wherein N is a positive integer. The clock signals provided by the clock generator 150 could control the switches in the SCNs. By turning on and off the switches, the SCN module 120 could control the state of charge storage of the capacitors to achieve discrete time signal processing, such as performing a filtering process on an output signal $IS_{out}$ of the ISCN 110.

At least one input terminal of the OSCN 130 is respectively connected to at least one output terminal of the SCN module 120. The OSCN 130 could include an operational amplifier, a current adder, a transconductance amplifier, or any other circuit/apparatus capable of combining an output signal $SC_{Out}$ of the SCN module 120 and/or a forward signal FW.

The BCN 140 is coupled to the SCN module 120. In some embodiments, the BCN 140 could sense the signal of the SCN module 120. In some other embodiments, the BCN 140 could sense the signal of the OSCN 130. In other embodiments, the BCN 140 could sense the signal of the SCN module 120 and the signal of the OSCN 130. The BCN 140 could correspondingly generate at least one forward signal FW for the OSCN 130 according to the sensing result to perform bandwidth compensation, and/or correspondingly generate at least one feedback signal FB for the ISCN 110 according to the sensing result to perform bandwidth compensation.

Based on the above, the CDF apparatus 100 in the embodiment shown in FIG. 1 includes a BCN having a flexible structure. The BCN 140 could choose to sense the signal of the SCN module 120 and/or the signal of the OSCN 130 according to design needs. The BCN 140 could adjust the signal delay time and/or the gain of the BCN 140 according to design needs. The BCN 140 could output the feedback signal FB to the ISCN 110 and/or output the forward signal FW to the OSCN 130 according to design needs. Therefore, the CDF apparatus 100 could meet the bandwidth according to design needs and improve sinc-function distortion, thereby achieving frequency compensation and/or power or gain compensation of frequency response. According to the present embodiment, the ISCN 110, the SCN module 120, the OSCN 130, the BCN 140, and/or the clock generator 150 could be implemented by different means.

Figure 2A:
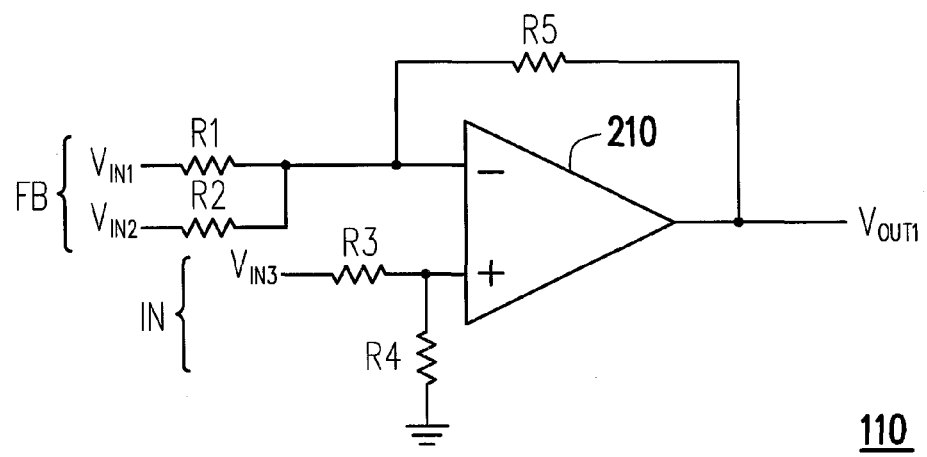
FIG. 2A to FIG. 2D are circuit diagrams of an ISCN shown in FIG. 1 according to different embodiments of the disclosure.

For instance, FIG. 2A to FIG. 2D are circuit diagrams of the ISCN 110 shown in FIG. 1 according to different embodiments of the disclosure. Referring to FIG. 1 and FIG. 2A, it is assumed here that the feedback signal FB shown in FIG. 1 contains input signals $V_{IN1}$ and $V_{IN2}$ shown in FIG. 2A and the input signal IN shown in FIG. 1 contains an input signal $V_{IN3}$ shown in FIG. 2A. The first terminals of resistors R1 and R2 respectively receive the input signals $V_{IN1}$ and $V_{IN2}$ and the second terminals of the resistors R1 and R2 are coupled to the inverting input terminal of an operational amplifier 210. The first terminal of a resistor R3 receives the input signal $V_{IN3}$ and the second terminal of the resistor R3 is coupled to the non-inverting input terminal of the operational amplifier 210. The first terminal of a resistor R4 is coupled to the second terminal of the resistor R3 and the second terminal of the resistor R4 is coupled to a reference voltage (such as a ground voltage or other fixed voltages). The first terminal of a resistor R5 is coupled to the inverting input terminal of the operational amplifier 210 and the second terminal of the resistor R5 is coupled to the output terminal of the operational amplifier 210. The resistors R1, R2, R3, R4, and/or R5 could be variable resistors. Therefore, the output terminal of the operational amplifier 210 could correspondingly provide an output signal $V_{OUT1}$ to the input terminal of the SCN module 120 shown in FIG. 1 according to the combined results of the input signals $V_{IN1}$, $V_{IN2}$, and $V_{IN3}$. The input signals, the electrical devices, and the electrical coupling relationship in the ISCN 110 shown in FIG. 2A are exemplary. In other embodiments, the ISCN 110 could have different numbers or types of electrical devices, different numbers of input signals, and different electrical coupling relationships, and the circuit structure of the ISCN 110 of the embodiments of the disclosure is not limited thereto.

Figure 2B:
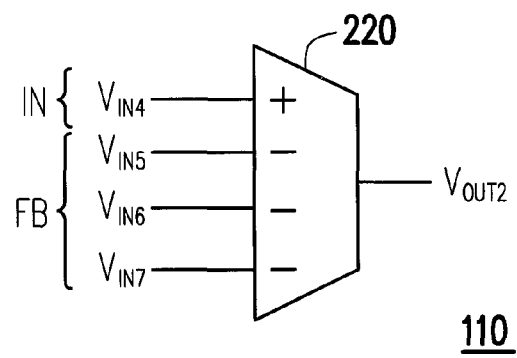

Referring to FIG. 1 and FIG. 2B, it is assumed here that the input signal IN shown in FIG. 1 contains an input signal $V_{IN4}$ shown in FIG. 2B and the feedback signal FB shown in FIG. 1 contains input signals $V_{IN5}$, $V_{IN6}$, and $V_{IN7}$ shown in FIG. 2B. The input signal $V_{IN4}$ is inputted to the non-inverting input terminal of a transconductance amplifier 220 and the input signals $V_{IN5}$, $V_{IN6}$, and $V_{IN7}$ are respectively inputted to the inverting input terminal of the transconductance amplifier 220. Therefore, the output terminal of the transconductance amplifier 220 could correspondingly provide an output signal $V_{OUT2}$ to the input terminal of the SCN module 120 shown in FIG. 1 according to the combined results of the input signals $V_{IN4}$ to $V_{IN7}$. The input signals, the electrical devices, and the electrical coupling relationship in the ISCN 110 shown in FIG. 2B are exemplary. In other embodiments, the ISCN 110 could have different numbers or types of electrical devices, different numbers of input signals, and different electrical coupling relationships, and the circuit structure of the ISCN 110 of the embodiments of the disclosure is not limited thereto.

Figure 2C:
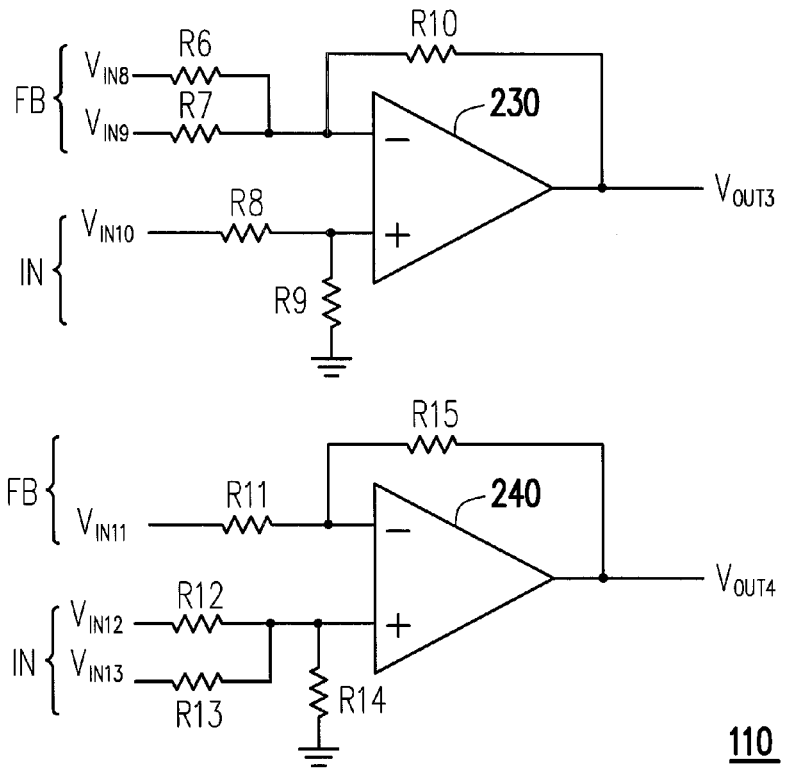

Referring to FIG. 1 and FIG. 2C, it is assumed here that the feedback signal FB shown in FIG. 1 contains input signals $V_{IN8}$, $V_{IN9}$, and $V_{IN11}$ shown in FIG. 2C and the input signal IN shown in FIG. 1 contains input signals $V_{IN10}$, $V_{IN12}$, and $V_{IN13}$ shown in FIG. 2C. The first terminals of resistors R6 and R7 respectively receive the input signals $V_{IN8}$ and $V_{IN9}$ and the second terminals of the resistors R6 and R7 are coupled to the inverting input terminal of the operational amplifier 210. The first terminal of a resistor R8 receives the input signal $V_{IN10}$ and the second terminal of the resistor R8 is coupled to the non-inverting input terminal of an operational amplifier 230. The first terminal of a resistor R9 is coupled to the second terminal of the resistor R8 and the second terminal of the resistor R9 is coupled to a reference voltage (such as a ground voltage or other fixed voltages). The first terminal of a resistor R10 is coupled to the inverting input terminal of the operational amplifier 230 and the second terminal of the resistor R10 is coupled to the output terminal of the operational amplifier 230. The resistors R6, R7, R8, R9, and/or R10 could be variable resistors. Therefore, the output terminal of the operational amplifier 230 could correspondingly provide an output signal $V_{OUT3}$ to the input terminal of the SCN module 120 shown in FIG. 1 according to the combined results of the input signals $V_{IN8}$ to $V_{IN10}$.

The first terminal of a resistor R11 receives an input signal $V_{IN11}$, the second terminal of the resistor R11 is coupled to the inverting input terminal of an operational amplifier 240, the first terminals of resistors R12 and R13 respectively receive input signals $V_{IN12}$ and $V_{IN13}$, and the second terminals of the resistors R12 and R13 are coupled to the non-inverting input terminal of the operational amplifier 240. The first terminal of a resistor R14 is coupled to the second terminal of the resistor R12 and the second terminal of the resistor R14 is coupled to a reference voltage (such as a ground voltage or other fixed voltages). The first terminal of a resistor R15 is coupled to the inverting input terminal of the operational amplifier 240 and the second terminal of the resistor R15 is coupled to the output terminal of the operational amplifier 240. The resistors R11, R12, R13, R14, and/or R15 could be variable resistors. Therefore, the output terminal of the operational amplifier 240 could correspondingly provide an output signal $V_{OUT4}$ to another input terminal of the SCN module 120 shown in FIG. 1 according to the combined results of the input signals $V_{IN11}$ to $V_{IN13}$. The input signals, the electrical devices, and the electrical coupling relationship in the ISCN 110 shown in FIG. 2C are exemplary. In other embodiments, the ISCN 110 could have different numbers or types of electrical devices, different numbers of input signals, and different electrical coupling relationships, and the circuit structure of the ISCN 110 of the embodiments of the disclosure is not limited thereto.

Figure 2D:
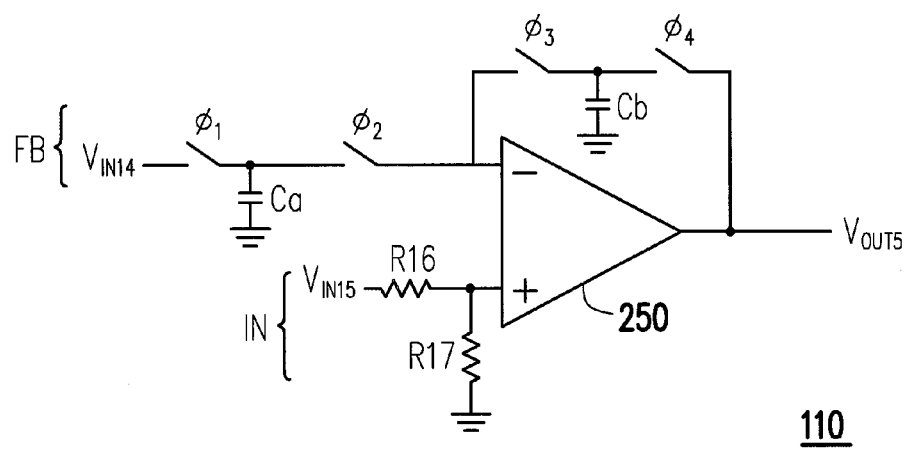

Referring to FIG. 1 and FIG. 2D, it is assumed here that the feedback signal FB shown in FIG. 1 contains an input signal $V_{IN14}$ shown in FIG. 2D and the input signal IN shown in FIG. 1 contains an input signal $V_{IN15}$ shown in FIG. 2D. The first terminal of a switch Φ1 receives the input signal $V_{IN14}$ and the second terminal of a switch Φ2 is coupled to the inverting input terminal of an operational amplifier 250. The first terminal of a capacitor Ca is coupled to the second terminal of the switch Φ1 and the first terminal of the switch Φ2, and the second terminal of the capacitor Ca is coupled to a reference voltage (such as a ground voltage or other fixed voltages). The first terminal of a switch Φ3 is coupled to the inverting input terminal of the operational amplifier 250 and the second terminal of a switch Φ4 is coupled to the output terminal of the operational amplifier 250. The first terminal of a capacitor Cb is coupled to the second terminal of the switch Φ3 and the first terminal of the switch Φ4, and the second terminal of the capacitor Cb is coupled to a reference voltage (such as a ground voltage or other fixed voltages). During the sampling of the ISCN 110, the switch Φ1 and the switch Φ4 are turned on and the switch Φ2 and the switch Φ3 are turned off. As a result, the capacitor Ca could perform sampling on the input signal $V_{IN14}$ and the capacitor Cb could perform sampling on the output signal $V_{OUT5}$. During the feedback of the ISCN 110, the switch Φ1 and the switch Φ4 are turned off and the switch Φ2 and the switch Φ3 are turned on. As a result, the capacitor Ca and the capacitor Cb could share a charge with each other.

The first terminal of a resistor R16 receives the input signal $V_{IN15}$ and the second terminal of the resistor R16 is coupled to the non-inverting input terminal of the operational amplifier 250. The first terminal of a resistor R17 is coupled to the second terminal of the resistor R16 and the second terminal of the resistor R17 is coupled to a reference voltage (such as a ground voltage or other fixed voltages). The capacitors Ca and/or Cb could be variable capacitors and the resistors R16 and/or R17 could be variable resistors. Therefore, the output terminal of the operational amplifier 250 could correspondingly provide the output signal $V_{OUT5}$ to an input terminal of the SCN module 120 shown in FIG. 1 according to the combined results of the input signals $V_{IN14}$ to $V_{IN15}$. The input signals, the electrical devices, and the electrical coupling relationship in the ISCN 110 shown in FIG. 2D are exemplary. In other embodiments, the ISCN 110 could have different numbers or types of electrical devices, different numbers of input signals, and different electrical coupling relationships, and the circuit structure of the ISCN 110 of the embodiments of the disclosure is not limited thereto. Accordingly, those skilled in the art could adjust the number of input signals and electrical coupling relationships with the ISCN 110 of the embodiments of the disclosure to obtain the input signal.

Figure 3:
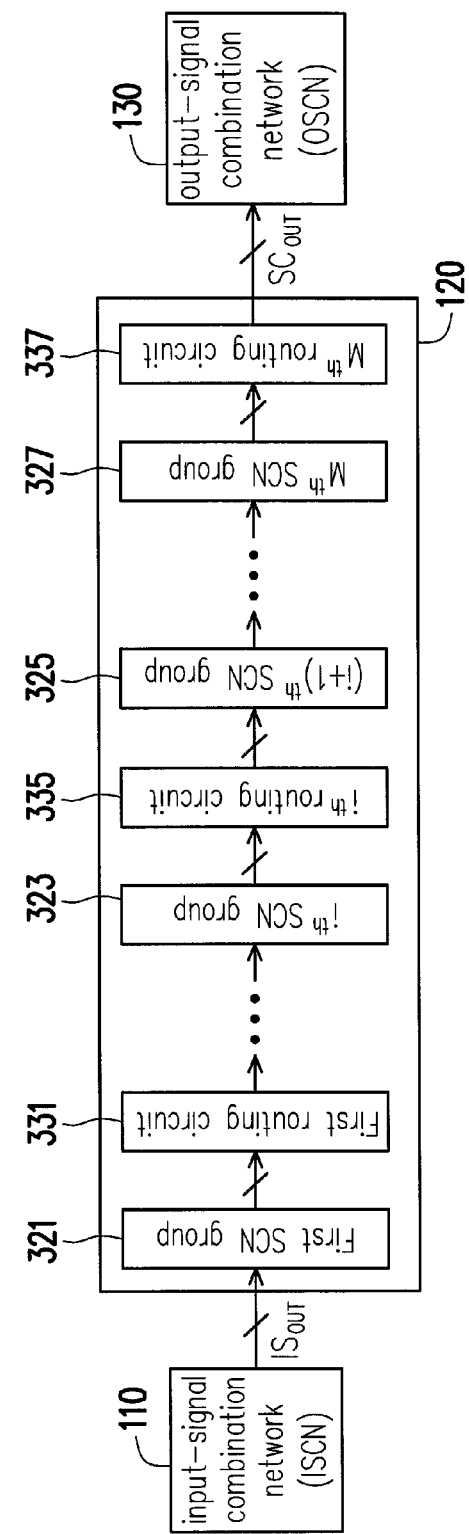
FIG. 3 is a block diagram of an SCN module shown in FIG. 1 according to an embodiment of the disclosure.

FIG. 3 is a circuit block diagram of the SCN module 120 shown in FIG. 1 according to an embodiment of the disclosure. Referring to FIG. 3, the SCN module 120 includes M SCN groups and M routing circuits, wherein M is a positive integer. At least one input terminal of a first SCN group 321 in the M SCN groups is respectively connected to at least one output terminal of the ISCN 110. For instance, two input terminals of the first SCN group 321 are respectively connected to two output terminals of the ISCN 110.

In the present embodiment, an $i^{th}$ routing circuit 335 in the M routing circuits is coupled to at least one input terminal of an $i^{th}$ SCN group 323 in the M SCN groups and at least one input terminal of an $(i+1)^{th}$ SCN group 325 in the M SCN groups, wherein i is between 1 and M. The $i^{th}$ routing circuit 335 could configure the coupling relation between the output terminal of the $i^{th}$ SCN group 323 and the input terminal of the $(i+1)^{th}$ SCN group 325. In some embodiments, the number of output terminals of the $i^{th}$ SCN group 323 is different from the number of input terminals of the $(i+1)^{th}$ SCN group 325. In some other embodiments, the number of output terminals of the $i^{th}$ SCN group 323 could be the same as the number of input terminals of the $(i+1)^{th}$ SCN group 325.

Figure 4:
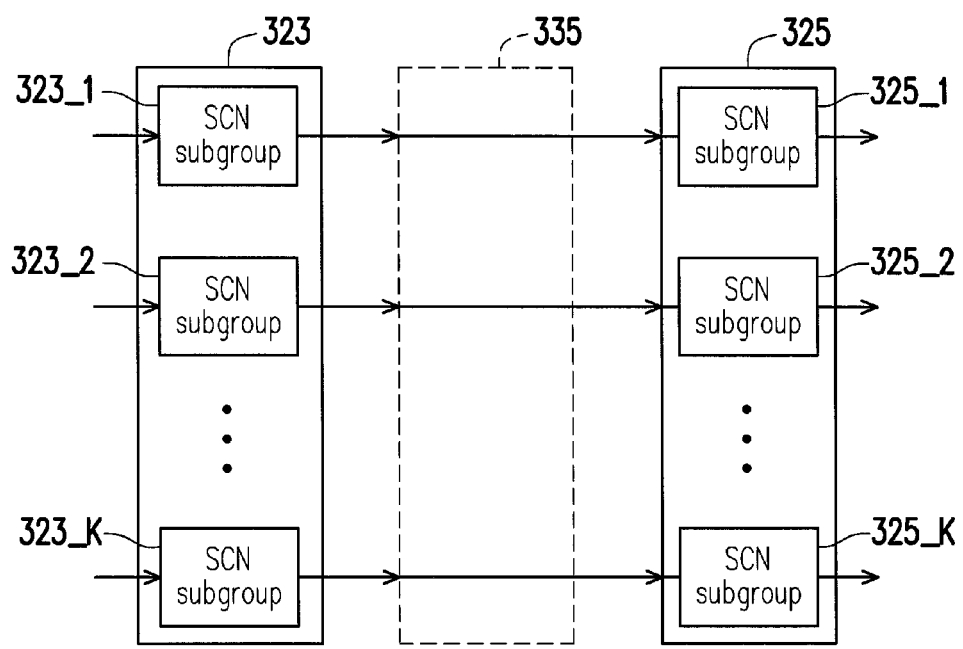
FIG. 4 is a block diagram of a portion of a coupling relationship of an SCN module shown in FIG. 2 according to an embodiment of the disclosure.

For instance, FIG. 4 is a block diagram of a portion of a coupling relationship of the SCN module 120 shown in FIG. 2 according to an embodiment of the disclosure. Referring to FIG. 4, in the present embodiment, the $i^{th}$ SCN group 323 includes K SCN subgroups 323_1, 323_2, ..., and 323_K and the $(i+1)^{th}$ SCN group 325 includes K SCN subgroups 325_1, 325_2, ..., and 325_K. The $i^{th}$ routing circuit 335 couples the output terminal of the SCN subgroup 323_1 to the input terminal of the SCN subgroup 325_1 and couples the output terminal of the SCN subgroup 323_2 to the input terminal of the SCN subgroup 325_2. The coupling relationships of the other SCN subgroups are configured in a similar manner. For instance, the $i^{th}$ routing circuit 335 could couple the output terminal of the SCN subgroup 323_K to the input terminal of the SCN subgroup 325_K. The SCN subgroups 323_1, 323_2, ..., and 323_K and the SCN subgroups 325_1, 325_2, ..., and 325_K are coupled in a one-on-one manner.

Figure 5:
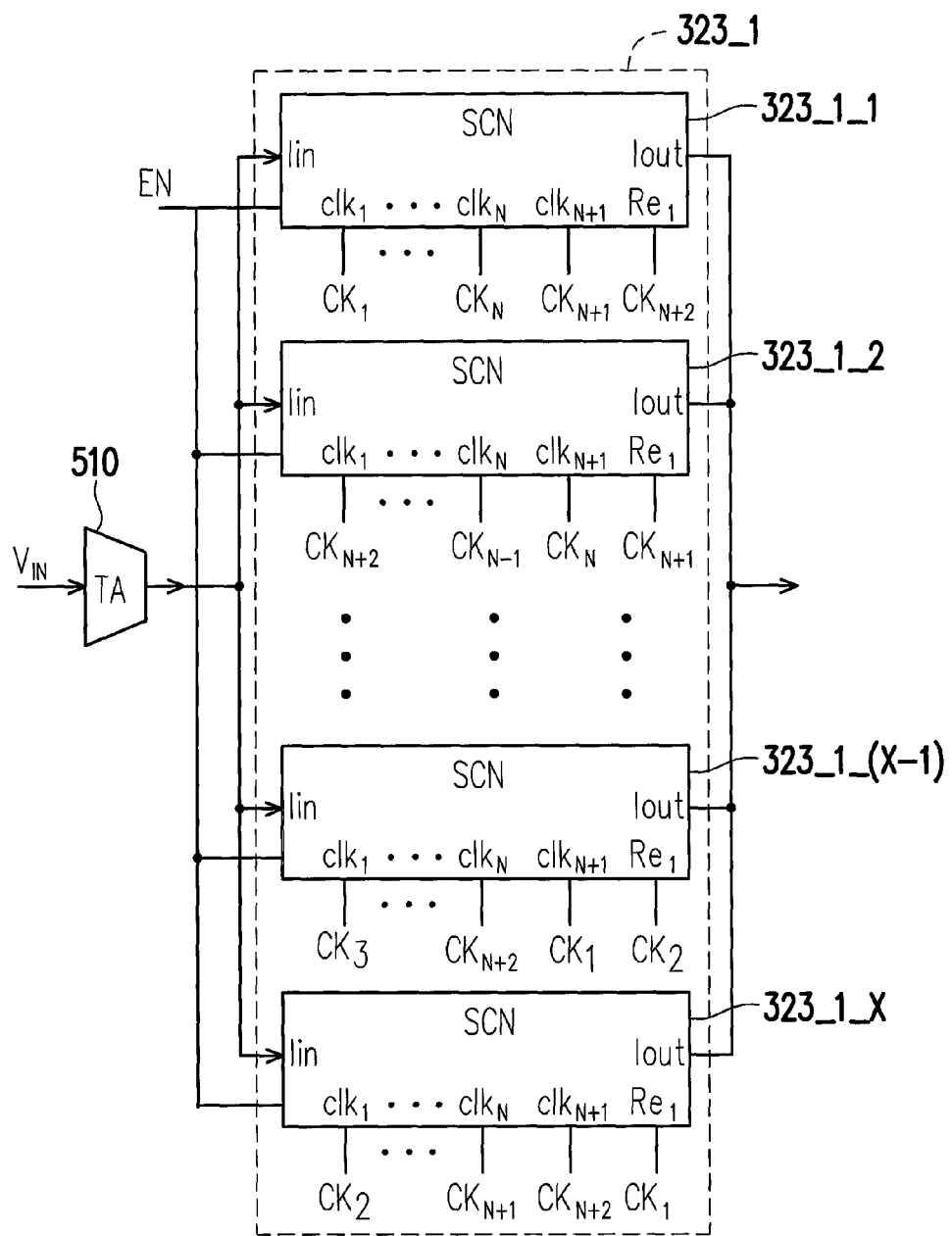
FIG. 5 is a function block diagram of an SCN subgroup shown in FIG. 4 according to an embodiment of the disclosure.

Any SCN or any CDF could be used to implement the SCN subgroups 325_1, 325_2, ..., and 325_K. For instance, FIG. 5 is a function block diagram of the SCN subgroup 323_1 shown in FIG. 4 according to an embodiment of the disclosure. The implementation of the other SCN subgroups 325_2 to 325_K is as described for the SCN subgroup 325_1. It is assumed here that an $i^{th}$ clock signal clka$_i$ in the clock signals clka1 to clkaM provided by the clock generator 150 contains N+2 clock signals $CK_1, CK_2, \ldots, CK_N, CK_{N+1}$, and $CK_{N+2}$, wherein N is a positive integer.

Referring to FIG. 5, the SCN subgroup 323_1 includes an amplifier 510 and SCNs 323_1_1, 323_1_2, ..., 323_1_(X-1), and 323_1_X, wherein X is a positive integer. The amplifier 510 could be a transconductance amplifier, an operational amplifier, or other amplifiers. An input terminal $V_{IN}$ of the amplifier 510 is used as the input terminal of the SCN subgroup 323_1. The output terminal of the amplifier 510 is connected to the input terminals of the SCNs 323_1_1, 323_1_2, ..., 323_1_(X-1), and 323_1_X. The SCNs 323_1_1, 323_1_2, ..., 323_1 (X-1), and 323_1_X do not need to be implemented by the same type of circuit. For instance, each of the SCNs 323_1_1, 323_1_2, ..., 323_1_(X-1), and 323_1_X could be a clock-efficient charge-domain filter (CECDF). By designing the structure of each of the SCNs 323_1_1, 323_12, ..., 323_1_(X-1), and 323_1_X in the CDF apparatus 100, a different filtering effect could be generated.

The clock generator 150 could adjust the phase difference of the clock signals $CK_1$ to $CK_{N+2}$, and/or adjust the pulse width of the clock signals $CK_1$ to $CK_{N+2}$. By adjusting the phase difference of the clock signals $CK_1$ to $CK_{N+2}$, the pulses of the clock signals $CK_1$ to $CK_{N+2}$ do not overlap with one another in time. The tap length of each of the SCNs 323_1_1 to 323_1_X is N+2. In other words, each of the SCNs 323_1_1 to 323_1_X has N+2 clock input terminals clk1, clk2, ..., clk$_N$, clk$_{N+1}$, and Re1 so as to each receive the clock signals $CK_1$ to $CK_{N+2}$. The clock generator 150 provides the clock signals $CK_1$ to $CK_{N+2}$ to the SCNs 323_1_1 to 323_1_X, wherein the clock signals $CK_1$ to $CK_{N+2}$ have different phases. The order that each of the SCNs 323_1_1 to 323_1_X receives the clock signals $CK_1$ to $CK_{N+2}$ is different from one another.

For instance, the clock input terminals clk$_1$, clk$_2$, ..., clk$_N$, clk$_{N+1}$, and Re1 of the SCN 323_1_1 respectively receive the clock signals $CK_1, CK_2, \ldots, CK_N, CK_{N+1}$, and $CK_{N+2}$, and the clock input terminals clk$_1$, clk$_2$, ..., clk$_N$, clk$_{N+1}$, and Re1 of the SCN 323_1_2 respectively receive the clock signals $CK_{N+2}, CK_1, CK_2, \ldots$, and $CK_{N+1}$. Similarly, the clock input terminals clk$_1$, clk$_2$, ..., clk$_N$, clk$_{N+1}$, and Re1 of the SCN 323_1_(X-1) respectively receive the clock signals $CK_3, CK_4, \ldots, CK_{N+2}, CK_1$, and $CK_2$, and the clock input terminals clk$_1$, clk$_2$, ..., clk$_N$, clk$_{N+1}$, and Re1 of the SCN 323_1_X respectively receive the clock signals $CK_2, CK_3, \ldots, CK_{N+2}$, and $CK_1$.

Figure 6:
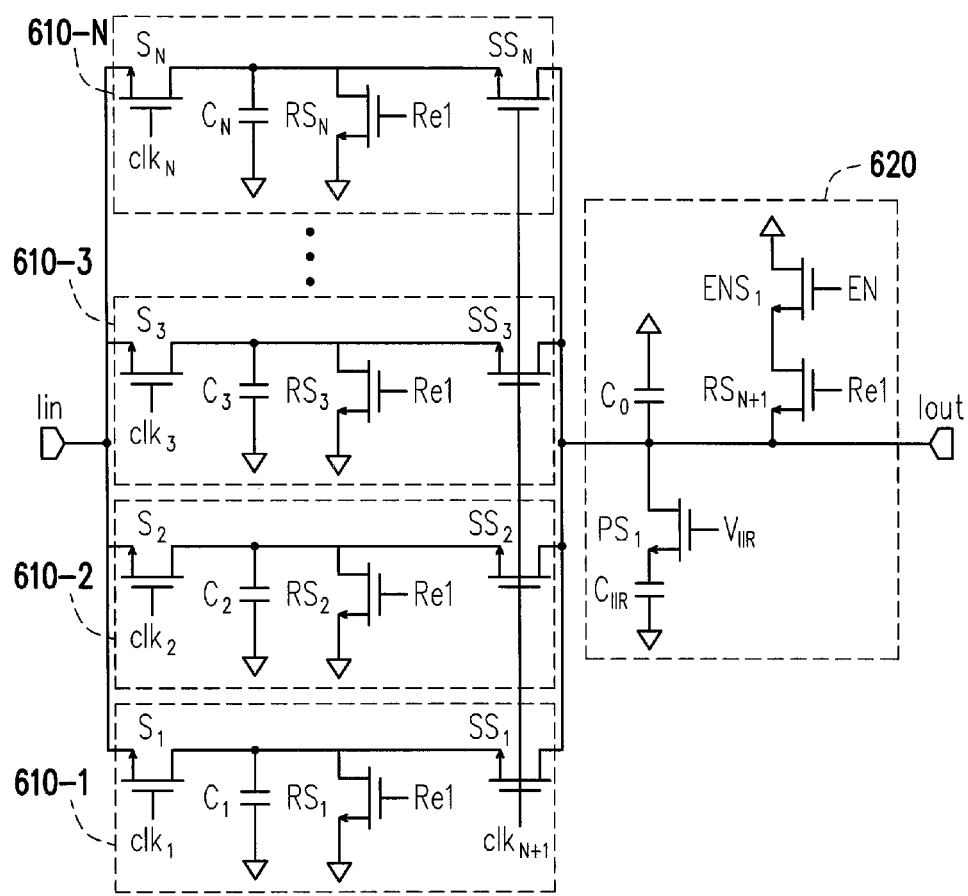
FIG. 6 is a circuit diagram of an SCN shown in FIG. 5 according to an embodiment of the disclosure.

Any method could be used to implement the SCNs 323_1_1 to 323_1_X when implementing the disclosure, and the SCNs 323_1_1 to 323_1_X are not limited thereto. For instance, FIG. 6 is a circuit diagram of the SCN 323_1_1 shown in FIG. 5 according to an embodiment of the disclosure. The implementation of the other SCNs 323_1_2 to 323_1_X is as described for the SCN 323_1_1. The SCN 323_1_1 includes a plurality of sampling units 610_1, 610_2, ..., and 610N and a summing unit 620, wherein N is a positive integer. The sampling terminals of the sampling units 610_1 to 610_N are connected to an input terminal Iin of the SCN 323_1_1. Each of the sampling units 610_1 to 610_N performs sampling on the input terminal Iin of the SCN 323_1_1 with a different phase. The input terminal of the summing unit 620 is connected to the output terminals of the plurality of sampling units 610_1 to 610_N to sum the sampling results of the sampling units 610_1 to 610_N and to output the summing results to an output terminal Iout of the SCN 323_1_1.

The implement example of the sampling unit 610_1 is described herein, and the other sampling units 610_2 to 610_N are as described for the sampling unit 610_1 and the disclosed content of FIG. 6. The sampling unit 610_1 includes a sampling switch $S_1$, a sampling capacitor $C_1$, a reset switch $RS_1$, and an output switch $SS_1$. The control terminal of the sampling switch $S_1$ is connected to the clock input terminal clk$_1$ of the SCN 323_1_1 to receive the clock signal $CK_1$. The first terminal of the sampling switch $S_1$ is used as the input terminal of the sampling unit 610_1 so as to be connected to the input terminal Iin of the SCN 323_1_1. The first terminal of the sampling capacitor $C_1$ is connected to the second terminal of the sampling switch $S_1$. The first terminal of the reset switch $RS_1$ is connected to the first terminal of the sampling capacitor $C_1$. The second terminal of the reset switch $RS_1$ and the second terminal of the sampling capacitor $C_1$ are connected to a reference voltage (such as a ground voltage or other fixed voltages). The control terminal of the reset switch $RS_1$ is connected to the clock input terminal Re1 of the SCN 323_1_1 to receive the clock signal $CK_{N+2}$. The control terminal of the output switch $SS_1$ is connected to the clock input terminal clk$_{N+1}$ of the SCN 323_1_1 to receive the clock signal $CK_{N+1}$. The first terminal of the output switch $SS_1$ is connected to the first terminal of the sampling capacitor $C_1$ and the second terminal of the output switch $SS_1$ is used as the output terminal of the sampling unit 610_1 so as to be connected to the input terminal of the summing unit 620.

Figure 7:
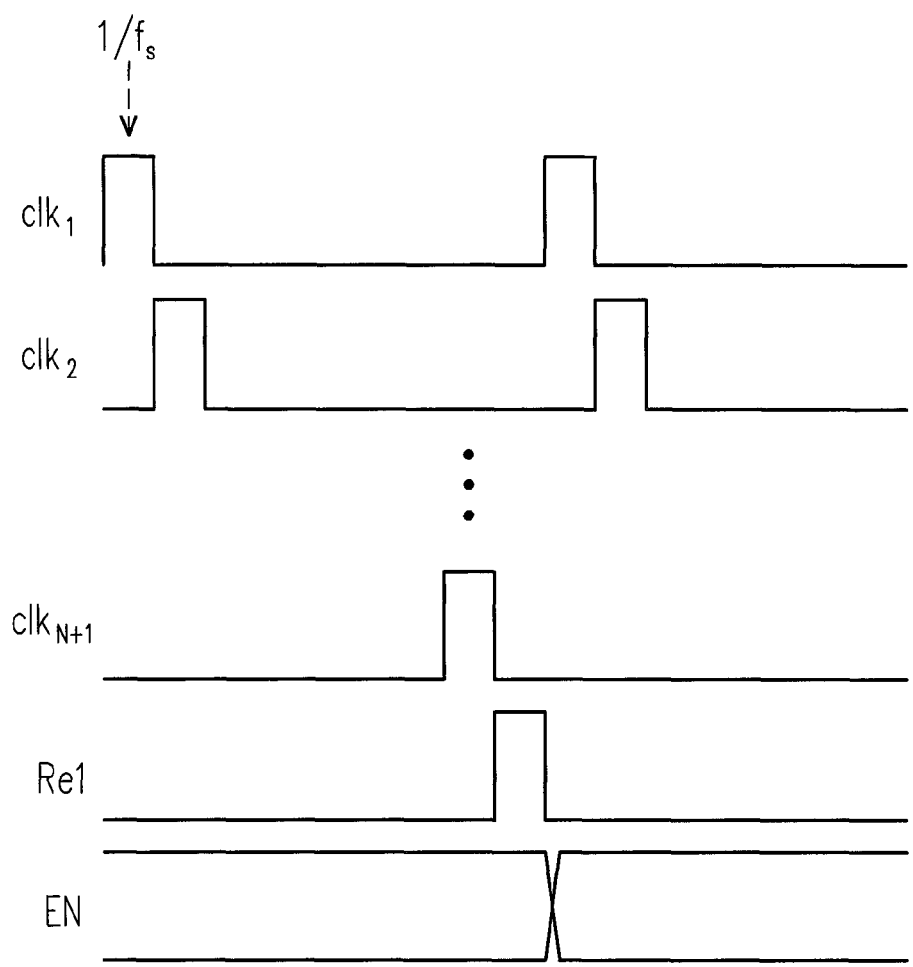
FIG. 7 is a timing diagram of signals of clock input terminals and an enabling signal shown in FIG. 6 according to an embodiment of the disclosure.

The control terminals of the sampling switches $S_1, S_2, S_3, \ldots$, and $S_N$ of the sampling units 610_2 to 610_N are respectively connected to the clock input terminals clk$_2$, and clk$_N$ of the SCN 323_1_1. FIG. 7 is a timing diagram of the signals of the clock input terminals clk$_1$, clk$_2$, ..., clk$_N$, clk$_{N+1}$, and Re1 and an enabling signal EN in FIG. 6 according to an embodiment of the disclosure. Please refer to FIG. 6 and FIG. 7. The sampling units 610_1 to 610_N perform sampling on the input terminal Iin of the SCN 323_1_1 in order and store the sampling results in the sampling capacitors $C_1, C_2, \ldots$, and $C_N$. After the sampling units 610_1 to 610_N completed sampling, the clock signal of the clock input terminal clk$_{N+1}$ triggers the output switches $SS_1, SS_2, SS_3, \ldots$, and $SS_N$ of the sampling units 610_1 to 610_N so as to output each of the sampling results to the summing unit 620. After each of the sampling units 610_1 to 610_N outputted the sampling result to the summing unit 620, the signal of the clock input terminal Re1 triggers the reset switches $RS_1, RS_2, RS_3, \ldots$, and $RS_N$ of the sampling units 610_1 to 610_N so as to reset each of the sampling results to a certain initial value (such as 0 volts).

As shown in FIG. 6, the summing unit 620 includes a summing capacitor $C_O$, a switch $PS_1$, a capacitor $C_{IIR}$, a switch $ENS_1$, and a switch $RS_{N+1}$. The first terminal of the summing capacitor $C_O$ is connected to the output terminal of the sampling units 610_1 to 610_N. When the output switches $SS_1$ to $SS_N$ of the sampling units 610_1 to 610_N are turned on, the summing capacitor $C_O$ could sum the sampling results of the sampling units 610_1 to 610_N.

The first terminal of the switch $PS_1$ is connected to the output terminals of the sampling units 610_1 to 610_N and the control terminal of the switch $PS_1$ is controlled by the control signal $V_{IIR}$. The first terminal of the capacitor $C_{IIR}$ is connected to the second terminal of the switch $PS_1$ and the second terminal of the capacitor $C_{IIR}$ is connected to a reference voltage (such as a ground voltage). The conducting state of the control switch $PS_1$ could be controlled with the control signal $V_{IIR}$, and the capacitance of the summing capacitor $C_O$ could be equivalently changed. Since the equivalent capacitance of the summing capacitor $C_O$ is changed, the bandwidth could be changed. Therefore, the switch $PS_1$ and the capacitor $C_{IIR}$ could also be referred to as bandwidth programming circuits.

The first terminal of the switch $RS_{N+1}$ is connected to the first terminal of the summing capacitor $C_O$ and the control terminal of the switch $RS_{N+1}$ is connected to the clock input terminal Re1 of the SCN 323_1_1. The first terminal of the switch $ENS_1$ is connected to the second terminal of the switch $RS_{N+1}$. The second terminal of the switch $ENS_1$ is connected to a reference voltage (such as a ground voltage). The control terminal of the switch $ENS_1$ is controlled by the enabling signal EN.

Through the operation of the enabling signal EN, the SCN 323_1_1 could be programmed as an infinite impulse response (IIR) filter or a finite impulse response (FIR) filter. If the enabling signal EN could be set to a low level for a narrow band, then the reset operation performed by the switch $RS_{N+1}$ on the summing capacitor $C_O$ is disabled. As a result, the charge of the capacitor $C_O$ and/or the capacitor $C_{IIR}$ is maintained before a summation period. In other words, when the enabling signal EN is at a low level, the SCN 323_1_1 could be viewed as an IIR filter. The transfer function of the IIR filter in a z domain is as follows:

$$H_{IIR}(z) = \frac{\left(\dfrac{\sum_{i=1}^{N} C_{(N+1-i)} z^{-(i-1)}}{C_0 + \sum_{i=1}^{N} C_i}\right)}{\left(1 - \dfrac{C_O z^{-(N+1)}}{C_0 + \sum_{i=0}^{N} C_i}\right)} \quad (1)$$

If the enabling signal EN could be set to a high level for a wide band, then the reset operation performed by the switch $RS_{N+1}$ on the summing capacitor $C_O$ is enabled. As a result, the charge of the capacitor $C_O$ and/or the capacitor $C_{IIR}$ discarded before the next summation period. In other words, when the enabling signal EN is at a high level, the SCN 323_1_1 could be viewed as an FIR filter. The transfer function of the FIR filter in the z domain is as follows:

$$H_{FIR}(z) = \frac{\left(\sum_{i=1}^{N} C_{(N+1-i)} z^{-(i-1)}\right)}{\left(C_0 + \sum_{i=0}^{N} C_i\right)} \quad (2)$$

Therefore, the switch $RS_{N+1}$ and the switch $ENS_1$ could be referred to as an FIR/IIR filter select circuit. Moreover, according to function (1), the control signal $V_{IIR}$ controls the resistance of the switch $PS_1$ to change the charge stored by the capacitor $C_{IIR}$, thereby effectively changing the equivalent capacitance of the summing capacitor $C_O$. As a result, the frequency response of the IIR filter is changed. According to function (1) and function (2), the signal bandwidth is programmable. Those who apply the present embodiment could omit the FIR/IIR filter select circuit (i.e., the switches $RS_{N+1}$ and $ENS_1$) and/or the frequency programming circuit (i.e., the switch $PS_1$ and the capacitor $C_{IIR}$) according to design needs. The filtered output signal (the Iout signal of the output terminal of the SCN 323_1_1) is down-converted to a baseband.

According to design needs, in some embodiments, the switch $PS_1$ and the capacitor $C_{IIR}$ in the SCN 323_1_1 shown in FIG. 6 may be omitted, and/or the switches $RS_{N+1}$ and $ENS_1$ in the SCN 323_1_1 may be omitted. If the switches $RS_{N+1}$ and $ENS_1$ in the SCN 323_1_1 are omitted, then the SCN 323_1_1 is fixed to operate in the IIR filter mode.

Moreover, FIG. 5 shows that the SCN subgroup 323_1 uses clocks $CK_1$, $CK_2$, ..., and $CK_{N+2}$ and SCNs 323_1_1 to 323_1_X. A sampling frequency fs of each of the SCNs 323_1_1 to 323_1_X is decimated to sampling frequency fs/(N+2). Since the order that each of the SCNs 323_1_1 to 323_1_X receives the clock signals $CK_1$, $CK_2$, ..., and $CK_{N+2}$ is different from one another, the output phase of each of the SCNs 323_1_1 to 323_1_X is different from one another.

However, the implementation of the SCN subgroup 323_1 shown in FIG. 4 is not limited to the embodiment shown in FIG. 5. For instance, in other embodiments, the output terminals of the SCNs 323_1_1 to 323_1_X shown in FIG. 5 are not connected to one another. Instead, the output terminals of the SCNs 323_1_1 to 323_1_X are respectively connected to different output terminals of a current adder (not shown) or an operational amplifier (not shown) in a one-on-one manner. The output terminals of the current adder (or operational amplifier) could be used as the output terminals of the SCN subgroup 323_1. The current adder could sum the x output signals having different phases, which is similar to increasing the sampling frequency fs/(N+2) several folds to the frequency fs. When N+2 equals to X, the CDF apparatus 100 of FIG. 1 achieves the structure of a non-decimation charge-domain filter (NDCDF). Those applying the embodiment above could decide the number of SCNs according to design needs thereof. For instance, the number X of the SCNs 323_1_1 to 323_1_X is less than the number N+2 of the clocks $CK_1$, $CK_2$, ..., and $CK_{N+2}$ such that the CDF apparatus 100 of FIG. 1 achieves the structure of a decimation charge-domain filter (DCDF).

Referring to FIG. 3, an $M^{th}$ routing circuit 337 in the M routing circuits is coupled between at least one output terminal of an $M^{th}$ SCN group 327 in the M SCN groups and at least one input terminal of the OSCN 130. The $M^{th}$ routing circuit 337 could configure the coupling relation between the output terminal of the $M^{th}$ SCN group 327 and the input terminal of the OSCN 130. The number M of the routing circuits and the SCN groups and/or the number K of SCN subgroups in the SCN groups could be decided according to design needs.

Figure 8A:
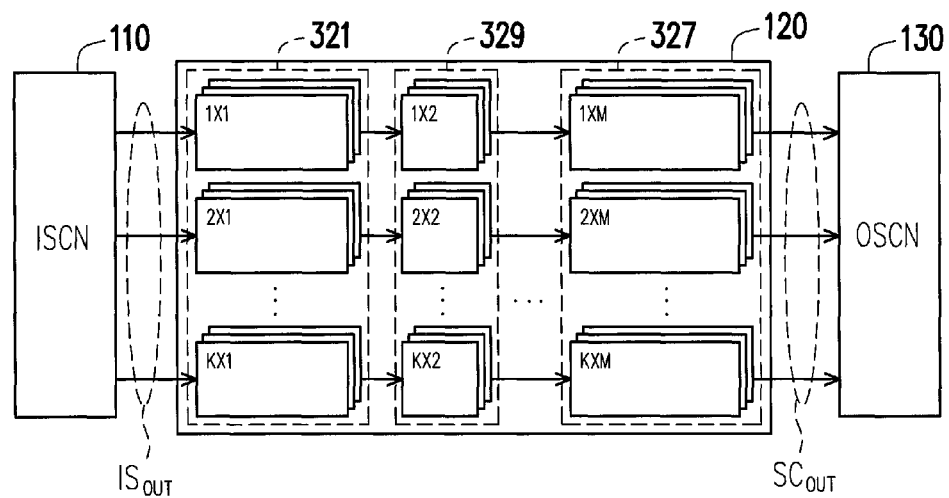
FIG. 8A to FIG. 8F are implement examples of a coupling relationship of an SCN subgroup shown in FIG. 4 according to an embodiment of the disclosure.

For instance, FIG. 8A to FIG. 8F are diagrams of implement examples of the SCN module 120 shown in FIG. 1 according to other different embodiments of the disclosure. In particular, the output terminals of the $M^{th}$ SCN group 327 are coupled to the input terminals of the OSCN 130 in a one-on-one manner. The embodiment of FIG. 8A is as described in FIG. 3, FIG. 4, and FIG. 5. Referring to FIG. 8A, the SCN module 120 in the present embodiment contains M SCN groups, such as a first SCN group 321, a second SCN group 329, and an $M^{th}$ SCN group 327. The SCN groups respectively have K SCN subgroups, wherein K is a positive integer. That is, the first SCN group 321 has K SCN subgroups 1*1, 2*1, . . . , and K*1, and the second SCN group 329 has K SCN subgroups 1*2, 2*2, . . . , and K*2. Similarly, the $M^{th}$ SCN group 327 has K SCN subgroups 1*M, 2*M, . . . , and K*M. A plurality of signals $IS_{OUT}$ from the ISCN 110 are respectively inputted to the K SCN subgroups 1*1 to K*1 in the first SCN group 321. The M SCN groups 327 respectively output the signal $SC_{OUT}$ to the OSCN 130. The SCN subgroups shown in FIG. 8 are as described for FIG. 5.

Figure 8B:
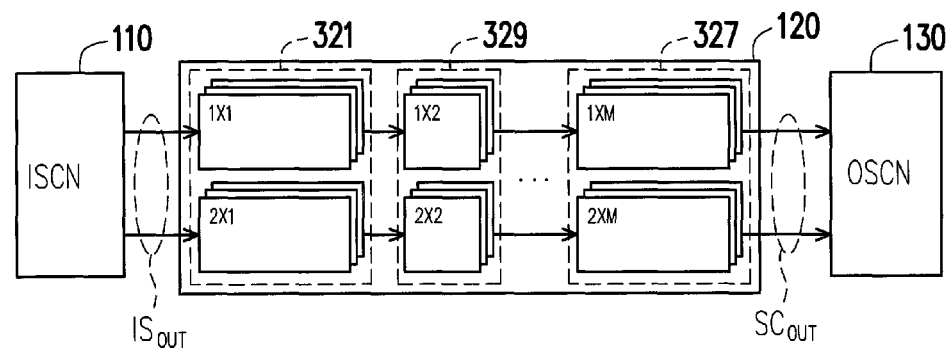

Referring to FIG. 8B, the embodiment of FIG. 8B is as described for FIG. 8A. In the present embodiment, K is equal to two. In other words, the first SCN group 321 has two SCN subgroups 1*1 and 2*1, and the second SCN group 329 has two SCN subgroups 1*2 and 2*2. Similarly, the $M^{th}$ SCN group 327 has two SCN subgroups 1*M and 2*M. The input terminal of the SCN subgroup 1*1 is coupled to an output terminal of the ISCN 110, and the input terminal of the SCN subgroup 2*1 is coupled to another output terminal of the ISCN 110. The output terminal of the SCN subgroup 1*2 is coupled to the output terminal of the SCN subgroup 1*1 and the input terminal of the SCN subgroup 2*2 is coupled to the output terminal of the SCN subgroup 2*1. Similarly, the input terminal of the SCN subgroup 1*M is coupled to the output terminal of the SCN subgroup 1*(M−1) and the input terminal of the SCN subgroup 2*M is coupled to the output terminal of the SCN subgroup 2*(M−1). The output terminal of the SCN subgroup 1*M is coupled to an input terminal of the OSCN 130, and the output terminal of the SCN subgroup 2*M is coupled to another input terminal of the OSCN 130.

Figure 8C:
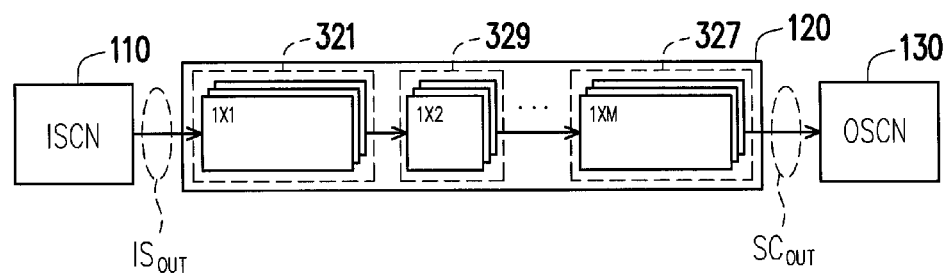

Referring to FIG. 8C, the embodiment of FIG. 8C is as described for FIG. 8A. In the present embodiment, K is equal to one. In other words, the first SCN group 321 has one SCN subgroup 1*1, and the second SCN group 329 has one SCN subgroup 1*2. Similarly, the $M^{th}$ SCN group 327 has one SCN subgroup 1*M. The input terminal of the SCN subgroup 1*1 is coupled to an output terminal of the ISCN 110. The input terminal of the SCN subgroup 1*2 is coupled to the output terminal of the SCN subgroup 1*1. Similarly, the input terminal of the SCN subgroup 1*M is coupled to the output terminal of the SCN subgroup 1*(M−1). The output terminal of the SCN subgroup 1*M is coupled to an input terminal of the OSCN 130.

Figure 8D:
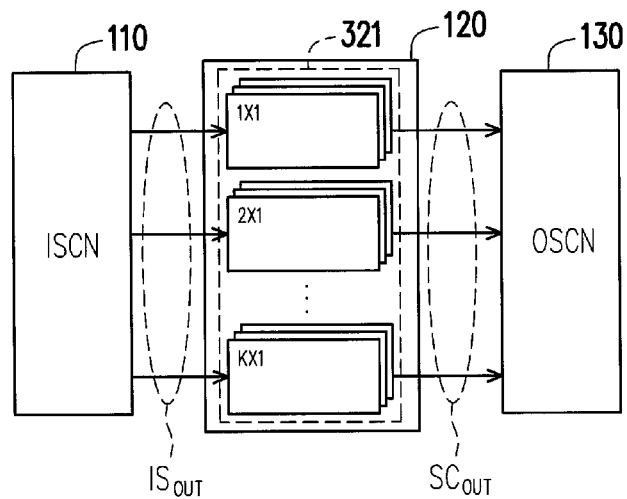

Referring to FIG. 8D, the embodiment of FIG. 8D is as described for FIG. 8A. In the present embodiment, M is equal to one. In other words, the SCN module 120 contains a single SCN group 321, and the SCN group 321 has K SCN subgroups 1*1, 2*1, . . . , and K*1. The input terminal of the SCN subgroup 1*1 is coupled to an output terminal of the ISCN 110, and the input terminal of the SCN subgroup 2*1 is coupled to another output terminal of the ISCN 110. Similarly, the input terminal of the SCN subgroup K*1 is coupled to yet another output terminal of the ISCN 110. The output terminal of the SCN subgroup 1*1 is coupled to an input terminal of the OSCN 130, and the output terminal of the SCN subgroup 2*1 is coupled to another input terminal of the OSCN 130. Similarly, the output terminal of the SCN subgroup K*1 is coupled to yet another input terminal of the OSCN 130.

Figure 8E:
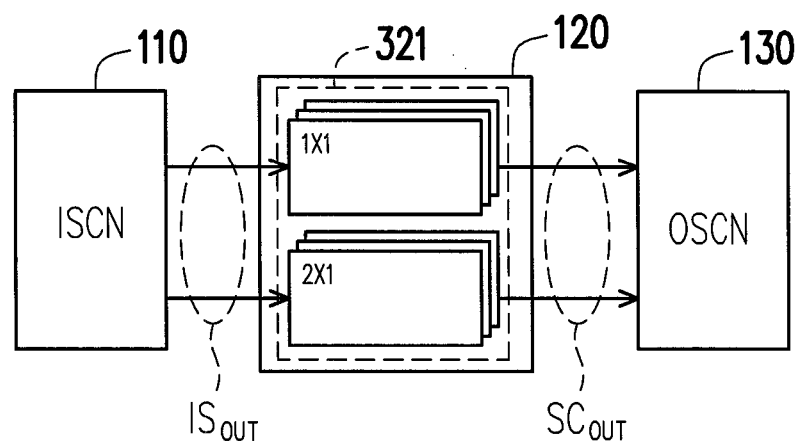

Referring to FIG. 8E, the embodiment of FIG. 8E is as described for FIG. 8A and FIG. 8D. In the present embodiment, M is equal to one and K is equal to two. In other words, the SCN module 120 contains a single SCN group 321, and the SCN group 321 has two SCN subgroups 1*1 and 2*1.

Figure 8F:
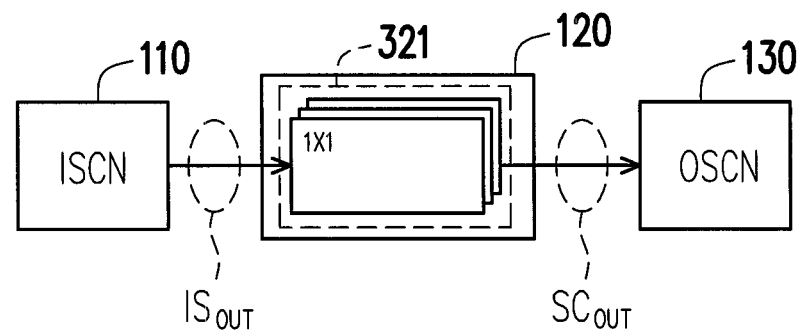

Referring to FIG. 8F, the embodiment of FIG. 8F is as described for FIG. 8A and FIG. 8D. In the present embodiment, M is equal to one and K is equal to one. In other words, the SCN module 120 contains a single SCN group 321, and the SCN group 321 has a single SCN subgroup 1*1.

In the embodiment of FIG. 3, the $i^{th}$ routing circuit 335 could configure the coupling relationship between the output terminals of the $i^{th}$ SCN group 323 and the input terminals of the $(i+1)^{th}$ SCN group 325. For instance, the $i^{th}$ routing circuit 335 could couple the output terminals of the $i^{th}$ SCN group 323 to the input terminals of the $(i+1)^{th}$ SCN group 325 in a one-on-one coupling method. In other embodiments, the routing circuit may include an interleaver, and the interleaver could be, for instance, a direct interleaver or a hybrid interleaver, wherein the hybrid interleaver could be one of an operational amplifier, a transconductance amplifier, and a current adder. For instance, the interleaver of the $i^{th}$ routing circuit 335 could configure the coupling relation between the output terminals of the $i^{th}$ SCN group 323 and the input terminals of the $(i+1)^{th}$ SCN group 325.

Figure 9A:
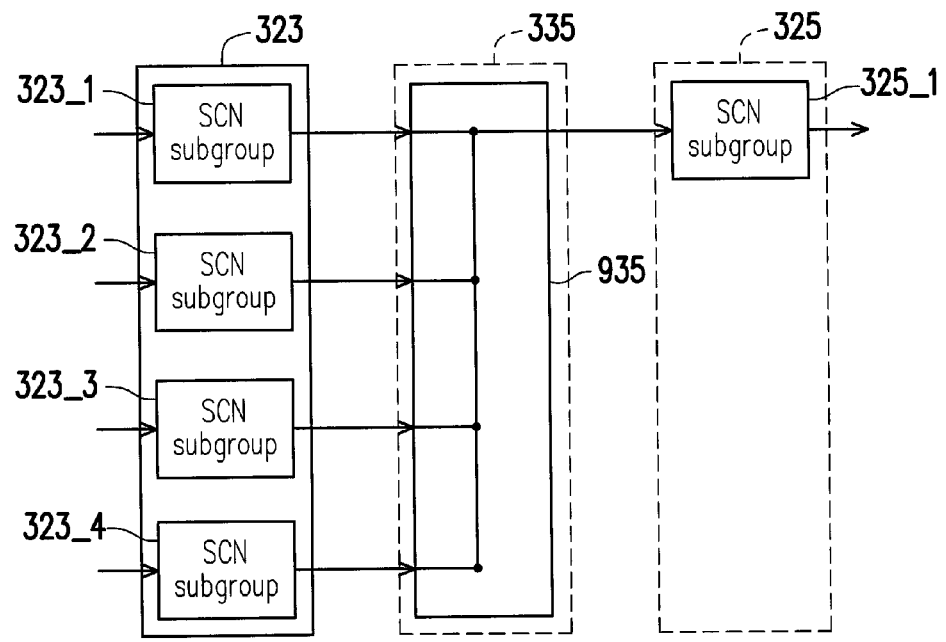
FIG. 9A and FIG. 9B are block diagrams of a portion of a coupling relationship of an SCN module shown in FIG. 2 according to another embodiment of the disclosure.
Figure 9B:
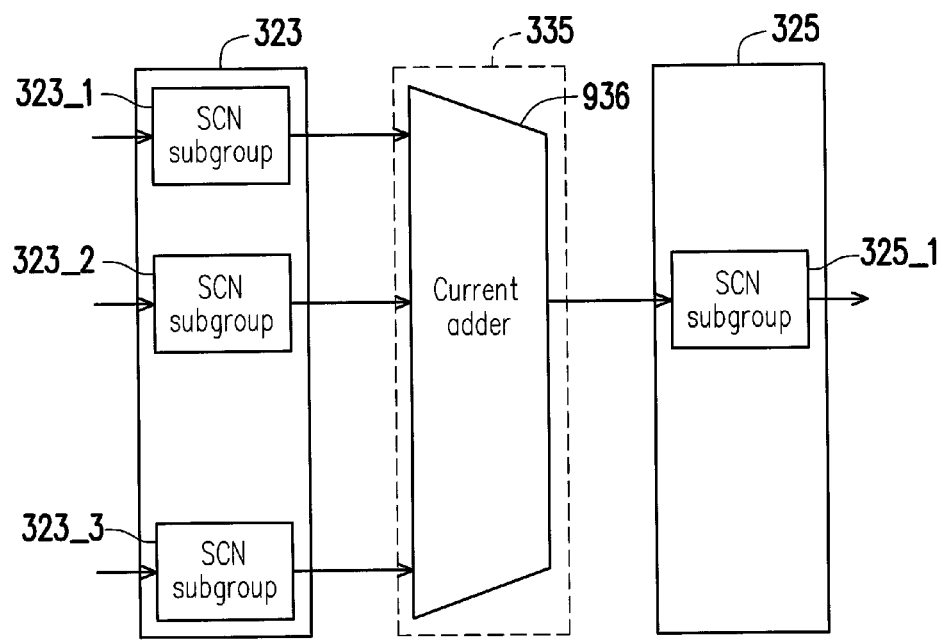

For instance, FIG. 9A and FIG. 9B are diagrams of a portion of a routing circuit of the SCN module 120 shown in FIG. 3 according to different embodiments of the disclosure. In the present embodiment, the $i^{th}$ SCN group 323 includes y SCN subgroups and the $(i+1)^{th}$ SCN group 325 includes z SCN subgroups, wherein y and z are positive integers and y is not equal to z. For instance, referring to FIG. 9A, the $i^{th}$ SCN group 323 and the $(i+1)^{th}$ SCN group 325 are as described for FIG. 3 to FIG. 7. The $i^{th}$ SCN group 323 shown in FIG. 9A includes four SCN subgroups 323_1, 323_2, 323_3, and 323_4, and the $(i+1)^{th}$ SCN group 325 includes one SCN subgroup 325_1. The $i^{th}$ routing circuit 335 includes a direct interleaver 935. The direct interleaver 935 could optionally jointly connect the output terminals of the SCN subgroups 323_1 to 323_4 to the same input terminal of the $(i+1)^{th}$ SCN group 325.

Referring to FIG. 9B, the $i^{th}$ SCN group 323 and the $(i+1)^{th}$ SCN group 325 shown in FIG. 9B are as described for FIG. 3 to FIG. 7. The $i^{th}$ SCN group 323 shown in FIG. 9B includes three SCN subgroups 323_1, 323_2, and 323_3, and the $(i+1)^{th}$ SCN group 325 includes one SCN subgroup 325_1. The $i^{th}$ routing circuit 335 includes a current adder 936. The current adder 936 could sum the output signals of the SCN subgroups 323_1 to 323_3 and then output the summing result to the SCN subgroup 325_1.

The input signal of the coupling circuit, the electrical devices, and the electrical coupling relationship of the $i^{th}$ SCN group 323 and the $(i+1)^{th}$ SCN group 325 shown in FIG. 9A and FIG. 9B are exemplary. In other embodiments, the $i^{th}$ SCN group 323 and the $(i+1)^{th}$ SCN group 325 could have different numbers or types of electrical devices, different numbers of input signals, and different electrical coupling relationships. The coupling circuit of the $i^{th}$ SCN group 323 and the $(i+1)^{th}$ SCN group 325 of the embodiments of the disclosure is not limited thereto.

Accordingly, based on design needs, the $i^{th}$ routing circuit 335 could be a wire combination having a fixed connection configuration, and the $i^{th}$ routing circuit 335 could also be implemented as a configurable connector. The configurable connector could dynamically configure the coupling relation of the output terminal of the $i^{th}$ SCN group 323 and the input terminal of the $(i+1)^{th}$ SCN group 325 through the control of an external digital controller. The $i^{th}$ routing circuit 335 could include a plurality of electrical devices, circuits, or wires to indirectly or directly connect the output terminal of the $i^{th}$ SCN group 323 and the input terminal of the $(i+1)^{th}$ SCN group 325. In particular, different connection relations generate different filtering effects.

Referring to FIG. 1, at least one input terminal of the OSCN 130 is respectively connected to at least one output terminal of the SCN module 120, and the OSCN 130 outputs at least one output signal. The OSCN 130 could include an operational amplifier, a current adder, a transconductance amplifier, or other circuits/apparatuses.

Figure 10A:
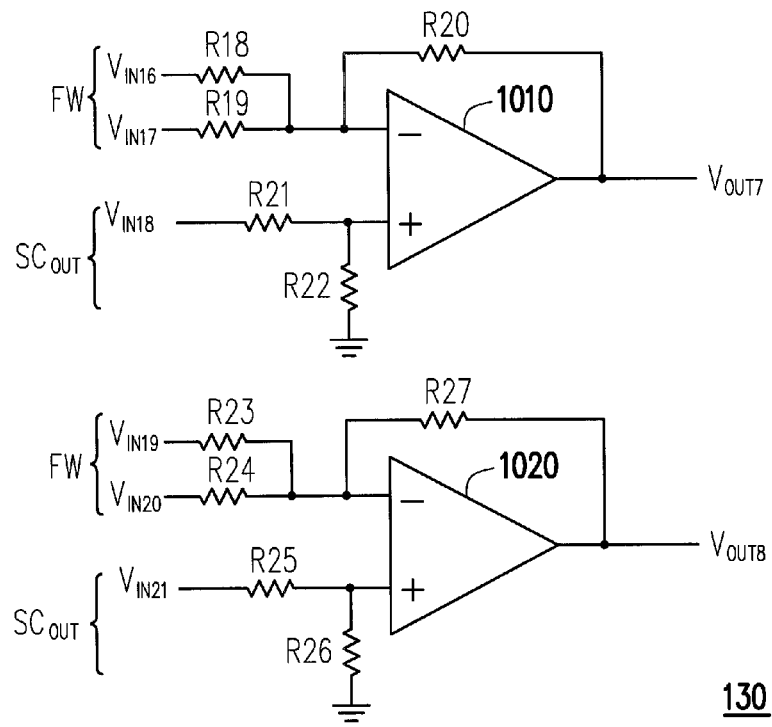
FIG. 10A to FIG. 10C are implement examples of an OSCN shown in FIG. 1 according to different embodiments of the disclosure.
Figure 10B:
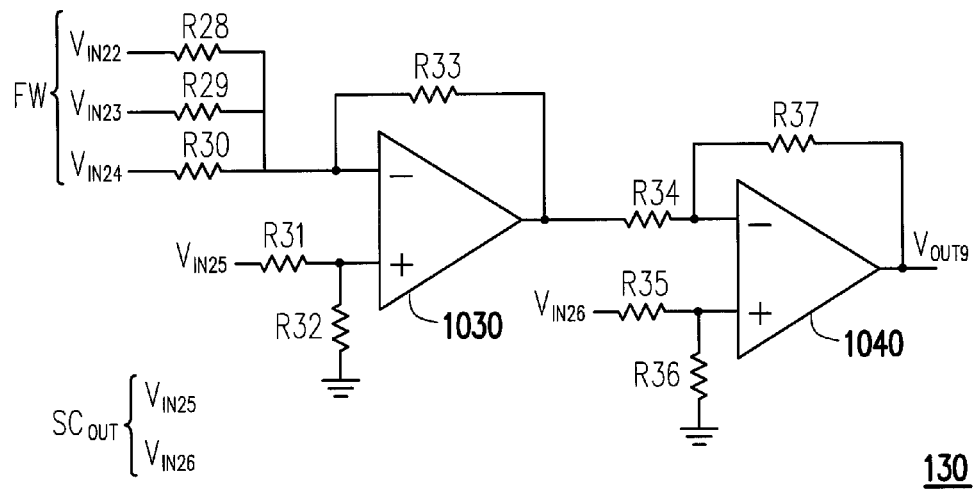
Figure 10C:
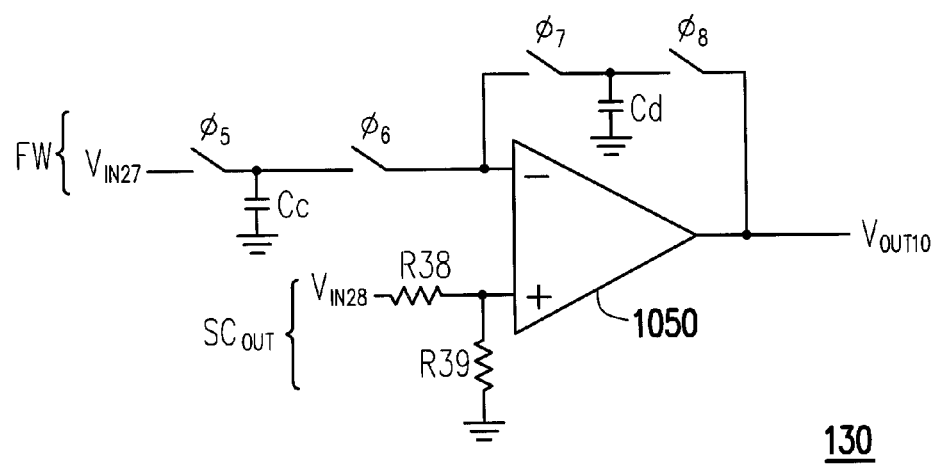

For instance, FIG. 10A to FIG. 10C are circuit diagrams of the OSCN 130 shown in FIG. 1 according to different embodiments of the disclosure. Referring to FIG. 1 and FIG. 10A, it is assumed here that the forward signal FW shown in FIG. 1 contains input signals $V_{IN16}$, $V_{IN17}$, $V_{IN19}$, and $V_{IN20}$, and the output signal $SC_{OUT}$ shown in FIG. 1 contains input signals $V_{IN18}$ and $V_{IN21}$ shown in FIG. 10A. The first terminals of resistors R18 and R19 respectively receive the input signals $V_{IN16}$ and $V_{IN17}$ and the second terminals of the resistors R18 and R19 are coupled to the inverting input terminal of an operational amplifier 1010. The first terminal of a resistor R21 receives the input signal $V_{IN18}$ and the second terminal of the resistor R21 is coupled to the non-inverting input terminal of the operational amplifier 1010. The first terminal of a resistor R22 is coupled to the second terminal of the resistor R21 and the second terminal of the resistor R22 is coupled to a reference voltage (such as a ground voltage or other fixed voltages). The first terminal of the resistor R20 is coupled to the inverting input terminal of the operational amplifier 1010 and the second terminal of the resistor R20 is coupled to the output terminal of the operational amplifier 1010. The resistors R18, R19, R20, R21, and/or R22 could be variable resistors. Therefore, the output terminal of the operational amplifier 1010 could correspondingly provide an output signal $V_{OUT7}$ to the output terminal of the OSCN 130 shown in FIG. 1 according to the combined results of the input signals $V_{IN16}$ to $V_{IN18}$.

The first terminals of resistors R23 and R24 respectively receive the input signals $V_{IN19}$ and $V_{IN20}$ and the second terminals of the resistors R23 and R24 are coupled to the inverting input terminal of an operational amplifier 1020. The first terminal of a resistor R25 receives the input signal $V_{IN21}$ and the second terminal of the resistor R25 is coupled to the non-inverting input terminal of the operational amplifier 1020. The first terminal of a resistor R26 is coupled to the second terminal of the resistor R25 and the second terminal of the resistor R26 is coupled to a reference voltage (such as a ground voltage or other fixed voltages). The first terminal of the resistor R27 is coupled to the inverting input terminal of the operational amplifier 1020 and the second terminal of the resistor R27 is coupled to the output terminal of the operational amplifier 1020. The resistors R23, R24, R25, R26, and/or R27 could be variable resistors. Therefore, the output terminal of the operational amplifier 1020 could correspondingly provide an output signal $V_{OUT8}$ to the output terminal of the OSCN 130 shown in FIG. 1 according to the combined results of the input signals $V_{IN19}$ to $V_{IN21}$. The input signals, the electrical devices, and the electrical coupling relationship in the OSCN 130 shown in FIG. 10A are exemplary. In other embodiments, the OSCN 130 could have different numbers or types of electrical devices, different numbers of input signals, and different electrical coupling relationships, and the circuit structure of the OSCN 130 of the embodiments of the disclosure is not limited thereto.

FIG. 10B is a circuit diagram of the OSCN 130 shown in FIG. 1 according to another embodiment of the disclosure. Referring to FIG. 1 and FIG. 10B, it is assumed here that the forward signal FW shown in FIG. 1 contains input signals $V_{IN22}$, $V_{IN23}$, and $V_{IN24}$ shown in FIG. 10B, and the output signal $SC_{OUT}$ shown in FIG. 1 contains input signals $V_{IN25}$ and $V_{IN26}$ shown in FIG. 10B. The first terminals of resistors R28, R29, and R30 respectively receive the input signals $V_{IN22}$, $V_{IN23}$, and $V_{IN24}$ and the second terminals of the resistors R28, R29, and R30 are coupled to the inverting input terminal of an operational amplifier 1030. The first terminal of a resistor R31 receives the input signal $V_{IN25}$ and the second terminal of the resistor R31 is coupled to the non-inverting input terminal of an operational amplifier 1030. The first terminal of a resistor R32 is coupled to the second terminal of the resistor R31 and the second terminal of the resistor R32 is coupled to a reference voltage (such as a ground voltage or other fixed voltages). The first terminal of a resistor R33 is coupled to the inverting input terminal of the operational amplifier 1030 and the second terminal of the resistor R33 is coupled to the output terminal of the operational amplifier 1030. The resistors R28, R29, R30, R31, R32, and/or R33 could be variable resistors.

The first terminal of a resistor R34 receives the output signal of the operational amplifier 1030 and the second terminal of the resistor R34 is coupled to the inverting input terminal of the operational amplifier 1040. The first terminal of a resistor R35 receives the input signal $V_{IN26}$ and the second terminal of the resistor R35 is coupled to the non-inverting input terminal of an operational amplifier 1040. The first terminal of a resistor R36 is coupled to the second terminal of the resistor R35 and the second terminal of the resistor R36 is coupled to a reference voltage (such as a ground voltage or other fixed voltages). The first terminal of a resistor R37 is coupled to the inverting input terminal of the operational amplifier 1040 and the second terminal of the resistor R37 is coupled to the output terminal of the operational amplifier 1040. The resistors R34, R35, R36, and/or R37 could be variable resistors. Therefore, the output terminal of the operational amplifier 1040 could correspondingly provide an output signal $V_{OUT9}$ to the output terminal of the OSCN 130 shown in FIG. 1 according to the combined results of the input signals $V_{IN22}$ to $V_{IN26}$. The input signals, the electrical devices, and the electrical coupling relationship in the OSCN 130 shown in FIG. 10B are exemplary. In other embodiments, the OSCN 130 could have different numbers or types of electrical devices, different numbers of input signals, and different electrical coupling relationships, and the circuit structure of the OSCN 130 of the embodiments of the disclosure is not limited thereto.

FIG. 10C is a circuit diagram of the OSCN 130 shown in FIG. 1 according to yet another embodiment of the disclosure. Referring to FIG. 1 and FIG. 10C, it is assumed here that the forward signal FW shown in FIG. 1 contains an input signal $V_{IN27}$ shown in FIG. 10C and the output signal $SC_{OUT}$ shown in FIG. 1 contains an input signal $V_{IN28}$ shown in FIG. 10C. The first terminal of a switch Φ5 receives the input signal $V_{IN27}$ and the second terminal of a switch Φ6 is coupled to the inverting input terminal of an operational amplifier 1050. The first terminal of a capacitor Cc is coupled to the second terminal of the switch Φ5 and the first terminal of the switch Φ6, and the second terminal of the capacitor Cc is coupled to a reference voltage (such as a ground voltage or other fixed voltages). The first terminal of a switch Φ7 is coupled to the inverting input terminal of the operational amplifier 1050 and the second terminal of a switch Φ8 is coupled to the output terminal of the operational amplifier 1050. The first terminal of a capacitor Cd is coupled to the second terminal of the switch Φ7 and the first terminal of the switch Φ8, and the second terminal of the capacitor Cd is coupled to a reference voltage (such as a ground voltage or other fixed voltages). During the sampling of the OSCN 130, the switch Φ5 and the switch Φ8 are turned on and the switch Φ6 and the switch Φ7 are turned off. As a result, the capacitor Cc could perform sampling on the input signal $V_{IN27}$ and the capacitor Cd could perform sampling on an output signal $V_{OUT10}$ of the operational amplifier 1050. During the feedback of the OSCN 130, the switch Φ5 and the switch Φ8 are turned off and the switch Φ6 and the switch Φ7 are turned on. As a result, the capacitor Cc and the capacitor Cd could share a charge with each other.

The first terminal of a resistor R38 receives the input signal $V_{IN28}$ and the second terminal of the resistor R38 is coupled to the non-inverting input terminal of the operational amplifier 1050. The first terminal of a resistor R39 is coupled to the second terminal of the resistor R38 and the second terminal of the resistor R39 is coupled to a reference voltage (such as a ground voltage or other fixed voltages). The capacitors Cc and/or Cd could be variable capacitors and the resistors R38 and/or R39 could be variable resistors. Therefore, the output terminal of the operational amplifier 1050 could correspondingly provide the output signal $V_{OUT10}$ to the output terminal of the OSCN 130 shown in FIG. 1 according to the combined results of the input signals $V_{IN27}$ to $V_{IN28}$. The input signals, the electrical devices, and the electrical coupling relationship in the OSCN 130 shown in FIG. 10C are exemplary. In other embodiments, the OSCN 130 could have different numbers or types of electrical devices, different numbers of input signals, and different electrical coupling relationships, and the circuit structure of the OSCN 130 of the embodiments of the disclosure is not limited thereto.

The input signals, the electric devices, and the electrical coupling relationship of the OSCN 130 shown in FIG. 10A to FIG. 10C are exemplary. In other embodiments, the OSCN 130 could also directly output the signal outputted by the output terminal of the SCN module 120 to serve as an output signal OUT of the CDF apparatus 100.

Accordingly, those skilled in the art could adjust the number of output signals and electrical coupling relationship with the OSCN 130 of the embodiments of the disclosure to obtain the output signal.

Referring to FIG. 1, the BCN 140 is coupled to the SCN module 120, wherein the BCN 140 senses the signal of the SCN module 120, senses the signal of the OSCN 130, or senses the signal of each of the SCN module 120 and the OSCN 130, and correspondingly generates at least one forward signal or at least one feedback signal for the ISCN 110 or the OSCN 130 according to the sensing result to perform bandwidth compensation.

Figure 11:
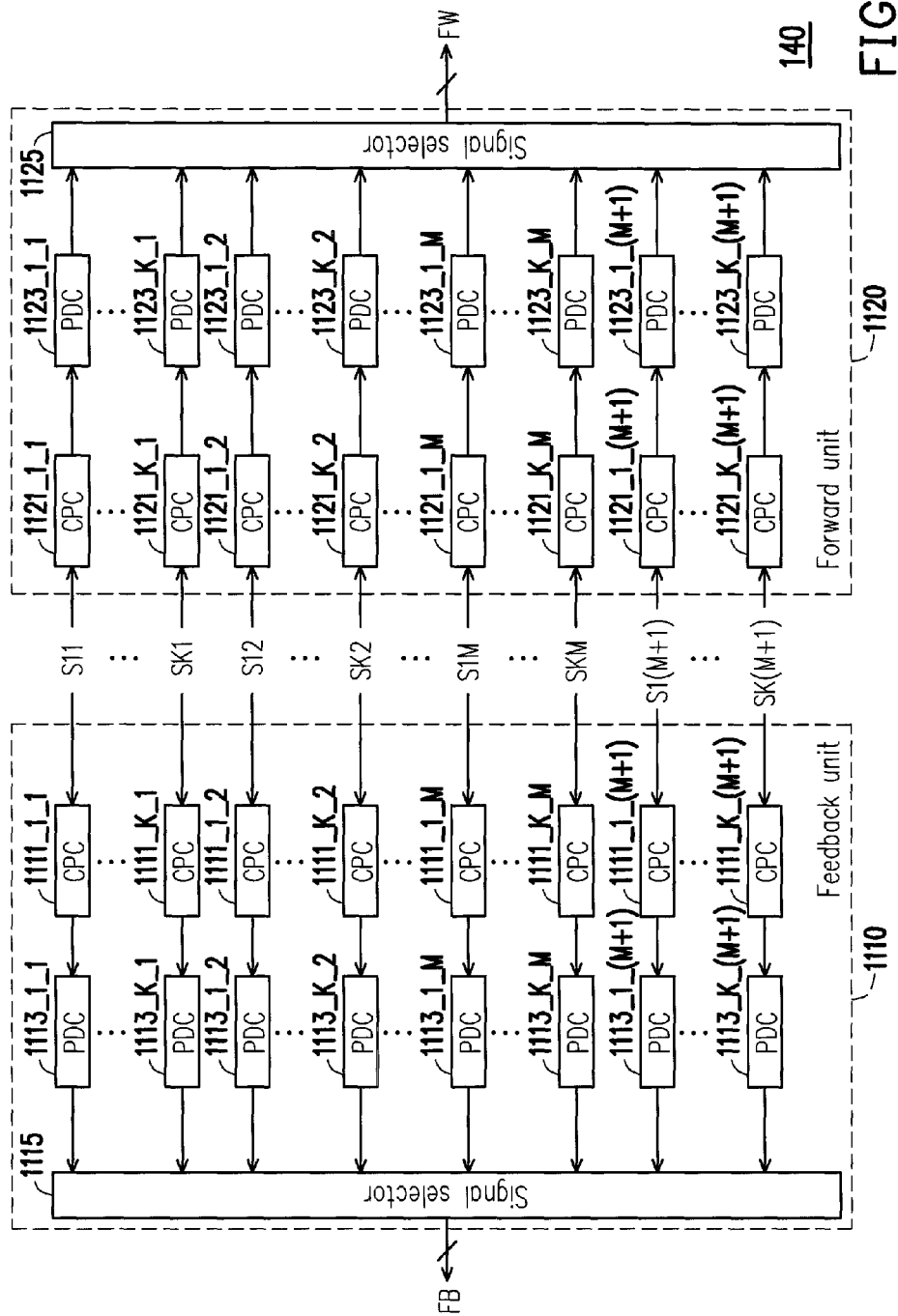
FIG. 11 is a block diagram of a BCN shown in FIG. 1 according to an embodiment of the disclosure.

FIG. 11 is a block diagram of the BCN 140 shown in FIG. 1 according to an embodiment of the disclosure. Referring to FIG. 8A and FIG. 11, sensing signals S11 to SK1 are respectively signals outputted by the SCN subgroups 1*1, 2*1, . . . , and K*1 of the first SCN group 321 in FIG. 8A. Sensing signals S12 to SK2 are respectively signals outputted by the SCN subgroups 1*2, 2*2, . . . , and K*2 of the second SCN group 329 in FIG. 8A. Similarly, sensing signals S1M to SKM are respectively signals outputted by the SCN subgroups 1*M, 2*M, . . . , and K*M of the $M^{th}$ SCN group 327 in FIG. 8A. S1(M+1) to SK(M+1) represent K output signals of the OSCN 130.

In the present embodiment, the BCN 140 includes a feedback unit 1110 and a forward unit 1120. In particular, the input terminal of the feedback unit 1110 is coupled to the SCN module 120 and the OSCN 130, and at least one output terminal of the feedback unit 1110 is coupled to the ISCN 110 to provide at least one feedback signal FB to the ISCN 110 to perform bandwidth compensation. The input terminal of the forward unit 1120 is coupled to the SCN module 120 and the OSCN 130, and at least one output terminal of the forward unit 1120 is coupled to the OSCN 130 to provide at least one forward signal FW to the OSCN 130 to perform bandwidth compensation.

The feedback unit 1110 includes a configurable power-reference cell (referred to as CPC, such as 1111_1_1 to 1111_K_1, 1111_1_2 to 1111_K_2, 1111_1_M to 1111_K_M, and 1111_1_(M+1) to 1111_K_(M+1) shown in FIG. 11), a programmable-delay cell (referred to as PDC, such as 1113_1_1 to 1113_K_1, 1113_1_2 to 1113_K_2, 1113_1_M to 1113_K_M, and 1113_1_(M+1) to 1113_K_(M+1) shown in FIG. 11), and a signal selector 1115. The CPCs 1111_1_1 to 1111_K_(M+1) adjust a portion or all of the signal of the SCN module 120 and the signal of the OSCN 130 to serve as at least one first sensing power. The CPCs 1111_1_1 to 1111_K_(M+1) could control/adjust a source power to achieve power or gain compensation of frequency response. Therefore, the CPCs 1111_1_1 to 1111_K_(M+1) could be referred to as power equalizers.

Figure 12:
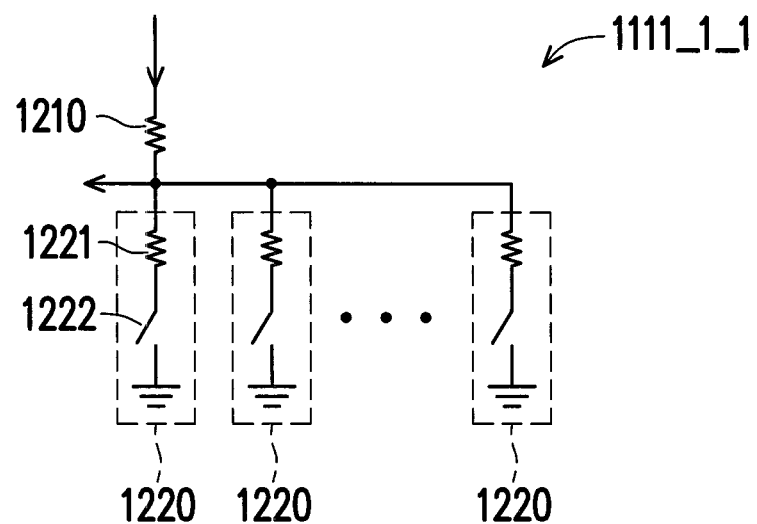
FIG. 12 is a circuit diagram of a configurable-power reference cell (CPC) 1111_1_1 shown in FIG. 11 according to an embodiment of the disclosure.

FIG. 12 is a circuit diagram of a CPC 1111_1_1 shown in FIG. 11 according to an embodiment of the disclosure. The other CPCs shown in FIG. 11 are as described for FIG. 12. Referring to FIG. 12, the CPC 1111_1_1 includes an upper dividing resistor 1210 and a plurality of lower dividing resistor units 1220. The first terminal of the upper dividing resistor 1210 is used as the input terminal of the CPC 1111_1_1. The second terminal of the upper dividing resistor 1210 is used as the output terminal of the CPC 1111_1_1. Each of the lower dividing resistor units 1220 includes a lower dividing resistor 1221 and a switch 1222. The first terminal of the lower dividing resistor 1221 is connected to the second terminal of the upper dividing resistor 1210. The first terminal of the switch 1222 is connected to the second terminal of the lower dividing resistor 1221. The second terminal of the switch 1222 is connected to a reference voltage (such as a ground voltage). By controlling the conducting state of each of the switches 1222, the resistance ratio of the upper and lower dividing resistors could be decided so as to adjust the power of a reference source. As a result, at least one sensing power is obtained, and the sensing power is sent to the PDC 1113_1_1. Therefore, the CPC 1111_1_1 could control/adjust the sensing power (feedback signal) to achieve power or gain compensation of frequency response.

The PDCs 1113_1_1 to 1113_K_1 (M+1) delay the first sensing power outputted by the CPCs 1111_1_1 to 1111_K_(M+1). Each of the PDCs 1113_1_1 to 1113_K_(M+1) could select a suitable delay time so as to output the first sensing power outputted by the CPCs 1111_1_1 to 1111_K_(M+1) to the signal selector 1115 after delaying the first sensing power. The signal selector 1115 selects a portion or all of the delayed first sensing power to serve as the feedback signal FB and outputs the feedback signal FB to the ISCN 110. Therefore, the CDF apparatus 100 could achieve frequency compensation of frequency response. The PDCs 1113_1_1 to 1113_K_(M+1) could be referred to as frequency equalizers. Therefore, the BCN 140 has a 2-D compensation solution.

Figure 13:
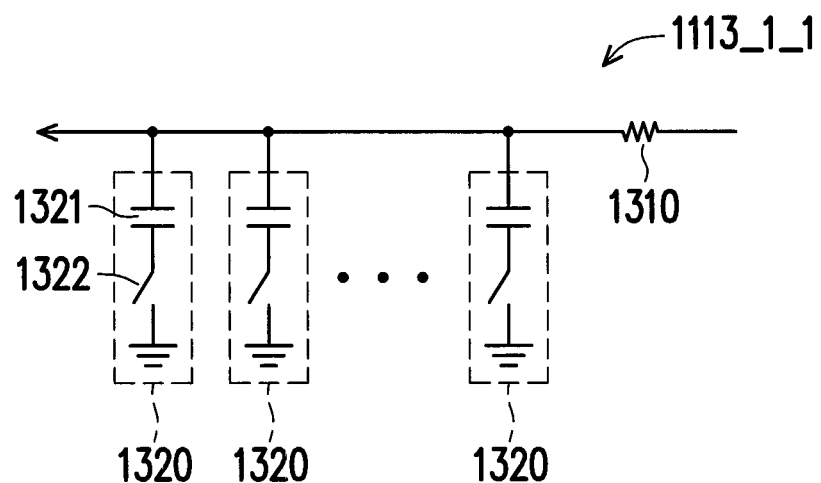
FIG. 13 is a circuit diagram of a programmable-delay cell (PDC) 1113_1_1 shown in FIG. 11 according to an embodiment of the disclosure.

FIG. 13 is a circuit diagram of a programmable-delay cell (PDC) 1113_1_1 shown in FIG. 11 according to an embodiment of the disclosure. The other PDCs shown in FIG. 11 are as described for FIG. 13. Referring to FIG. 13, the PDC 1113_1_1 includes one equivalent reference resistor 1310 and a plurality of delay units 1320. The first terminal of the equivalent reference resistor 1310 is connected to the input terminal of the PDC 1113_1_1. The second terminal of the equivalent reference resistor 1310 is connected to the output terminal of the PDC 1113_1_1 and the plurality of delay units 1320. Each of the delay units 1320 includes a delay capacitor 1321 and a delay switch 1322. The first terminal of the delay capacitor 1321 is connected to the second terminal of the equivalent reference resistor 1310 and the output terminal of the PDC 1113_1_1. The first terminal of the delay switch 1322 is connected to the second terminal of the delay capacitor 1321. The second terminal of the delay switch 1322 is connected to a reference voltage (such as a ground voltage). By controlling the conducting state of each of the delay switch 1322 and the equivalent reference resistor 1310, the total time constant of the PDC 1113_1_1 could be decided, thereby deciding the delay time of the PDC 1113_1_1. Therefore, the PDC 1113_1_1 makes the modulated sensing power (feedback signal) be outputted to the signal selector 1115 after the sensing power selects a suitable delay, thereby achieving frequency compensation of frequency response.

The feedback unit 1110 in the embodiment shown in FIG. 11 has K*(M+1) signal sensing channels. For instance, the CPC 1111_1_1 and the PDC 1113_1_1 could provide a signal sensing channel to sense the output signal of the SCN subgroup 1*1 of the first SCN group 321 in FIG. 8A. However, in other embodiments, the number of signal sensing channels in the feedback unit 1110 could be decided according to design needs. Moreover, each of the signal sensing channels of the feedback unit 1110 in the embodiment shown in FIG. 11 is provided with a CPC and a PDC. However, in other embodiments, according to design needs, each of the signal sensing channels could optionally be provided with a CPC or a PDC. Moreover, in some embodiments, a CPC and a PDC are omitted in a particular signal sensing channel in the feedback unit 1110, such that the signal (or the signal of the OSCN 130) of the SCN module 120 is directly transmitted to the signal selector 1115.

Referring to FIG. 11, the feedback unit 1120 includes a CPC (such as 1121_1_1 to 1121_K_1, 1121_1_2 to 1121_K_2, 1121_1_M to 1121_K_M, and 1121_1_(M+1) to 1121_K_(M+1)), a PDC (such as 1123_1_1 to 1123_K_1, 1123_1_2 to 1123_K_2, 1123_1_M to 1123_K_M, and 1123_1_(M+1) to 1123_K_(M+1)), and a signal selector 1125. The CPCs 1121_1_1 to 1121_K_(M+1) adjust a portion or all of the signal of the SCN module 120 and the signal of the OSCN 130 to serve as at least one second sensing power. The CPCs 1121_1_1 to 1121_K (M+1) could control/adjust a source power to achieve power or gain compensation of frequency response. The PDCs 1123_1_1 to 1123_K_(M+1) delay the second sensing power outputted by the CPCs 1121_1_1 to 1121_K_(M+1). Each of the PDCs 1123_1_1 to 1123_K_(M+1) could select a suitable delay time so as to output the second sensing power outputted by the CPCs 1121_1_1 to 1121_K_(M+1) to the signal selector 1125 after delaying the second sensing power. According to design needs, the signal selector 1125 selects a portion or all of the delayed second sensing power to serve as the forward signal FW and outputs the forward signal FW to the OSCN 130. Therefore, the CDF apparatus 100 could achieve frequency compensation of frequency response. Accordingly, the power and the delay time of frequency response could be more flexibly adjusted to obtain the frequency response.

The forward unit 1120 in the embodiment shown in FIG. 11 has K*(M+1) signal sensing channels. For instance, the CPC 1121_1_1 and the PDC 1123_1_1 could provide a signal sensing channel to sense the output signal of the SCN subgroup 1*1 of the first SCN group 321 in FIG. 8A. However, in other embodiments, the number of signal sensing channels in the forward unit 1120 could be decided according to design needs. Moreover, each of the signal sensing channels of the forward unit 1120 in the embodiment shown in FIG. 11 is provided with one CPC and one PDC. However, in other embodiments, according to design needs, each of the signal sensing channels could optionally be provided with a CPC or a PDC. Moreover, in some embodiments, a CPC and a PDC could be omitted in a particular signal sensing channel in the forward unit 1120, such that the signal (or the signal of the OSCN 130) of the SCN module 120 is directly transmitted to the signal selector 1125.

Figure 14:
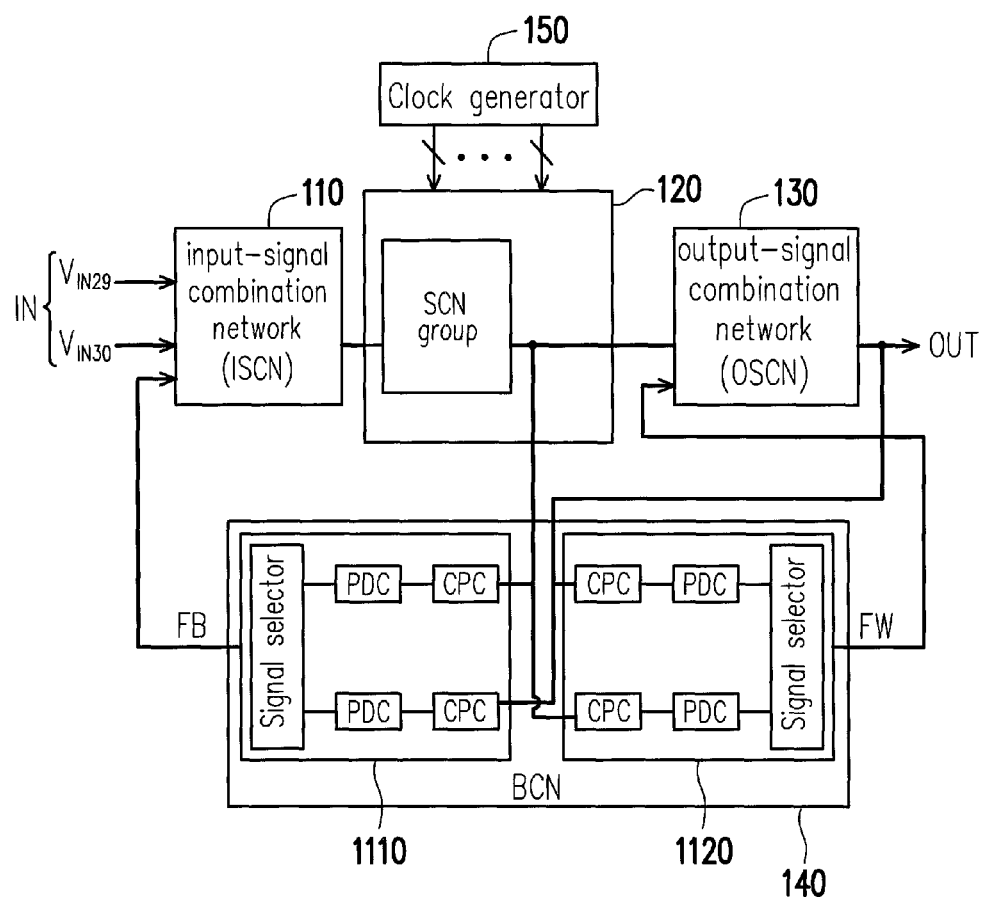
FIG. 14 is an implement example of a CDF apparatus according to an embodiment of the disclosure.

For instance, FIG. 14 is an implement example of a CDF apparatus according to an embodiment of the disclosure. Referring to FIG. 14, the embodiment of FIG. 14 is as described for the embodiments of FIG. 1 to FIG. 13. Referring to FIG. 1 and FIG. 14, it is assumed here that the input signal IN shown in FIG. 1 contains input signals $V_{IN29}$ and $V_{IN30}$ shown in FIG. 14. The ISCN 110 shown in FIG. 14 is as described for FIG. 2D, wherein the feedback signal FB is the $V_{IN14}$ in FIG. 2D, and the feedback signal FB is inputted to the inverting input terminal of the operational amplifier 250 in FIG. 2D. In the embodiment shown in FIG. 14, the SCN module 120 has a single SCN group, and the SCN group has a single SCN subgroup. The SCN subgroup is as described for FIG. 5 and is not repeated herein. The SCN subgroup receives the output signal of the ISCN 110 to perform a filtering operation and outputs the filtering result to the OSCN 130. The OSCN 130 shown in FIG. 14 is as described for FIG. 10C, wherein the forward signal FW is the $V_{IN27}$ in FIG. 10C, and the forward signal FW is inputted to the inverting input terminal of the operational amplifier 1050 in FIG. 10C.

In the embodiment shown in FIG. 14, an input terminal of the feedback unit 1110 of the BCN 140 receives the output signal of the SCN module 120, and another input terminal of the feedback unit 1110 receives the output signal of the OSCN 130. It could be known from the description for FIG. 11 that, the feedback unit 1110 could achieve power or gain compensation and/or frequency compensation of frequency response. Moreover, an input terminal of the forward unit 1120 receives the output signal of the SCN module 120, and another input terminal of the forward unit 1120 receives the output signal of the OSCN 130. It could be known from the description for FIG. 11 that, the forward unit 1120 could achieve power or gain compensation and/or frequency compensation of frequency response.

In the embodiments above, the BCN 140 outputs the feedback signal FB to the ISCN 110 and outputs the forward signal FW to the OSCN 130. In other embodiments, the BCN 140 could choose to output the feedback signal FB to the ISCN 110 or output the forward signal FW to the OSCN 130 according to design needs.

Figure 15:
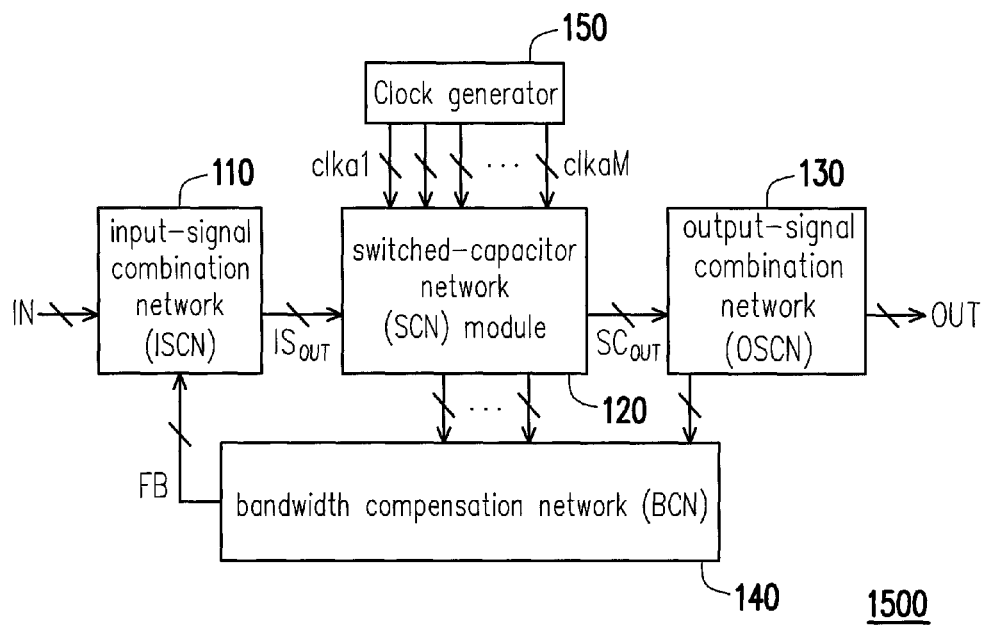
FIG. 15 is a block diagram of another CDF apparatus according to an embodiment of the disclosure.

For instance, FIG. 15 is a circuit block diagram of another CDF apparatus 1500 according to an embodiment of the disclosure. The CDF apparatus 1500 includes an ISCN 110, an SCN module 120, an OSCN 130, a BCN 140, and a clock generator 150. The ISCN 110, the SCN module 120, the OSCN 130, the BCN 140, and the clock generator 150 shown in FIG. 15 are as described for FIG. 1. Referring to FIG. 15, the BCN 140 senses the signal of the SCN module 120, senses the signal of the OSCN 130, or senses the signal of each of the SCN module 120 and the OSCN 130, and correspondingly generates at least one feedback signal FB for the ISCN 110 according to the sensing result to perform bandwidth compensation.

Figure 16A:
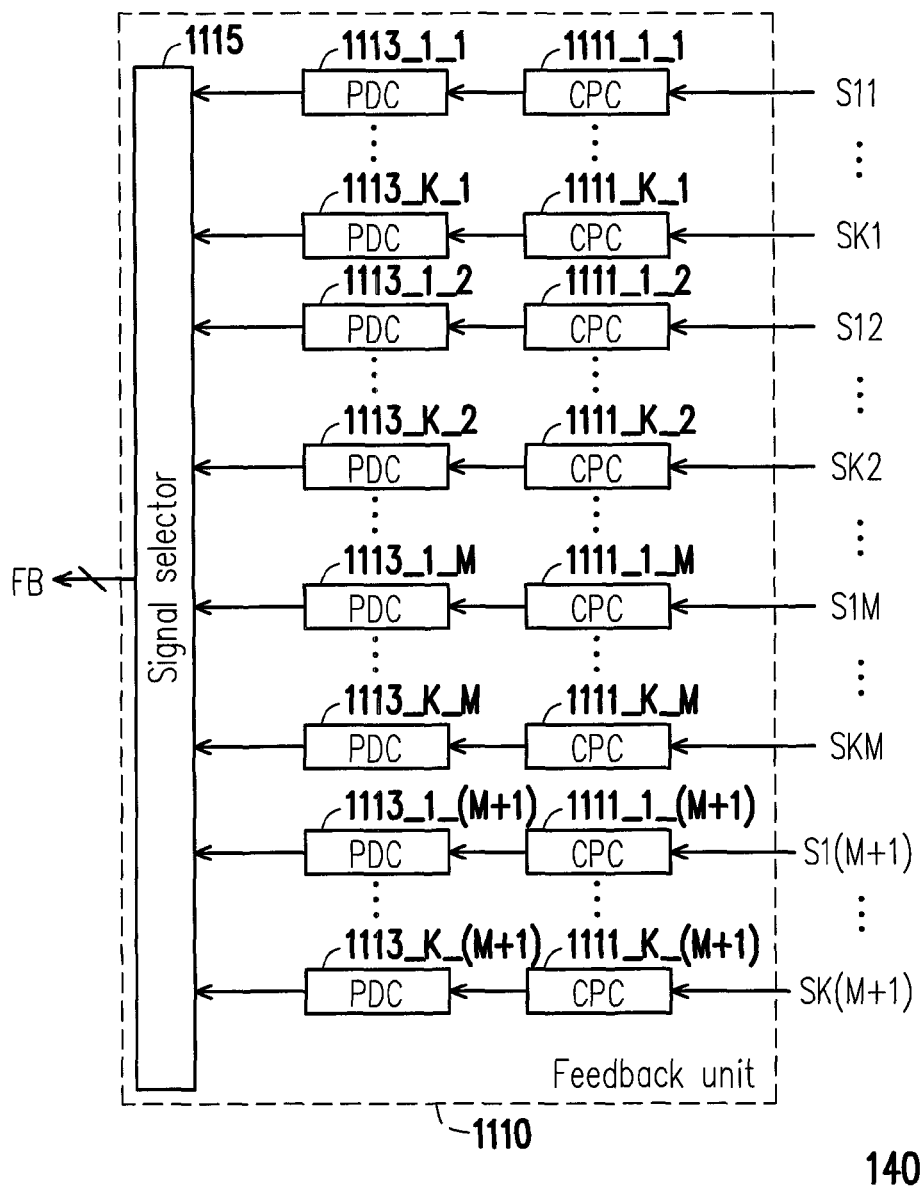
FIG. 16A to FIG. 16F are implement examples of a CDF apparatus shown in FIG. 15 according to an embodiment of the disclosure.

In the present embodiment, the BCN 140 could be implemented according to design needs. For instance, FIG. 16A to FIG. 16F are implement examples of the BCN 140 of FIG. 15 according to different embodiments of the disclosure. Referring to FIG. 16A, the embodiment of FIG. 16A is as described for the feedback unit 1110 in the embodiment of FIG. 11. The difference between the present embodiment and the embodiment shown in FIG. 11 is that in the present embodiment, the BCN 140 does not include a forward unit 1120. In other embodiments, the feedback unit 1110 could optionally be provided with a CPC or a PDC. Moreover, in some embodiments, a CPC and a PDC may be omitted in the feedback unit 1110, such that the signal (or the signal of the OSCN 130) of the SCN module 120 is directly transmitted to the signal selector 1115.

Figure 16B:
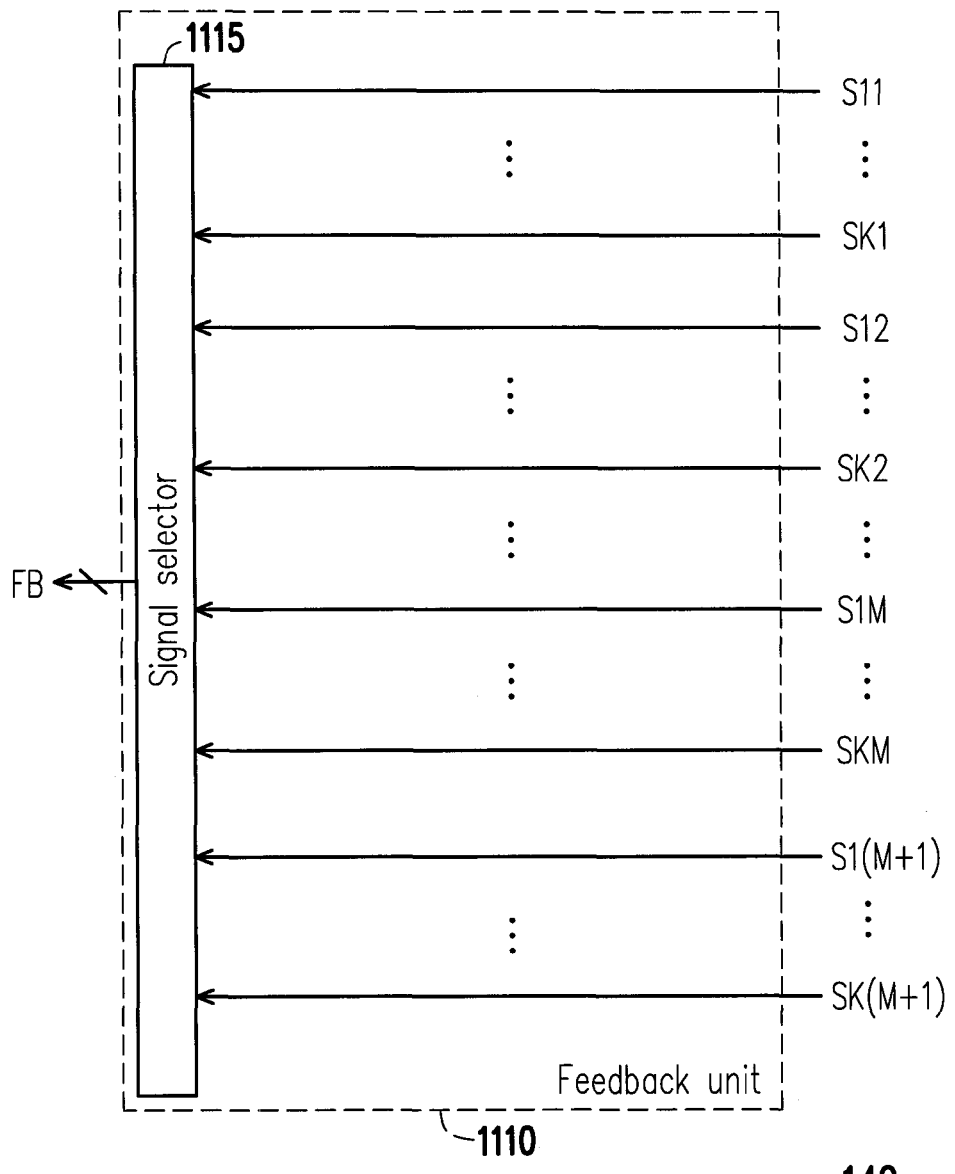

For instance, referring to FIG. 16B, the embodiment of FIG. 16B is as described for the feedback unit 1110 in FIG. 11 and FIG. 16A. The difference between the present embodiment and the embodiment shown in FIG. 16A is that in the present embodiment, the feedback unit 1110 does not include a CPC and a PDC. The signal selector 1115 could select a portion or all of the signal of the SCN module 120 and the signal of the OSCN 130 to serve as at least one feedback signal FB and outputs the feedback signal FB to the ISCN 110.

Figure 16C:
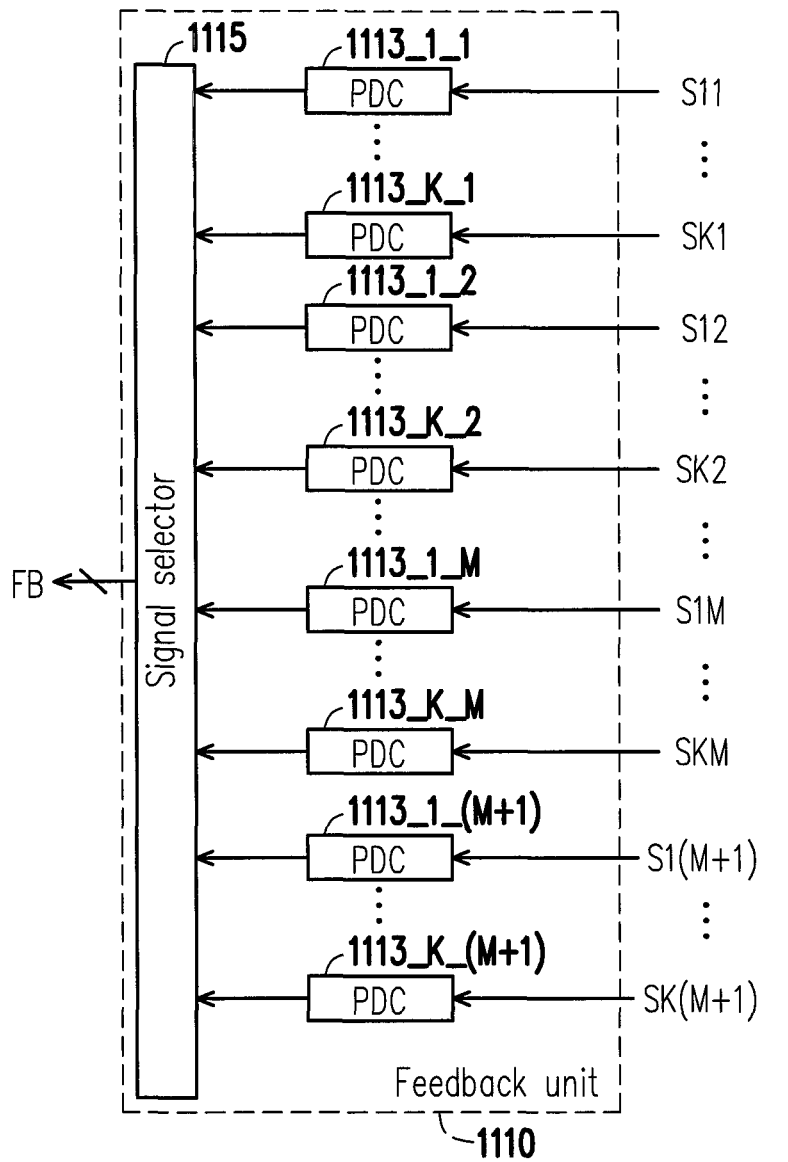

Moreover, referring to FIG. 16C, the embodiment of FIG. 16C is as described for FIG. 11 and FIG. 16A. The difference between the present embodiment and the embodiment shown in FIG. 16A is that the feedback unit 1110 shown in FIG. 16C does not include a CPC. In the present embodiment, the feedback unit 1110 includes a PDCs 1113_1_1 to 1113_K_(M+1) and a signal selector 1115. The PDCs 1113_1_1 to 1113_K_(M+1) delay a portion or all of the signal of the SCN module 120 and the signal of the OSCN 130 to serve as at least one first sensing power. The signal selector 1115 selects a portion or all of the at least one first sensing power to serve as at least one feedback signal FB and outputs the feedback signal FB to the ISCN 110.

Figure 16D:
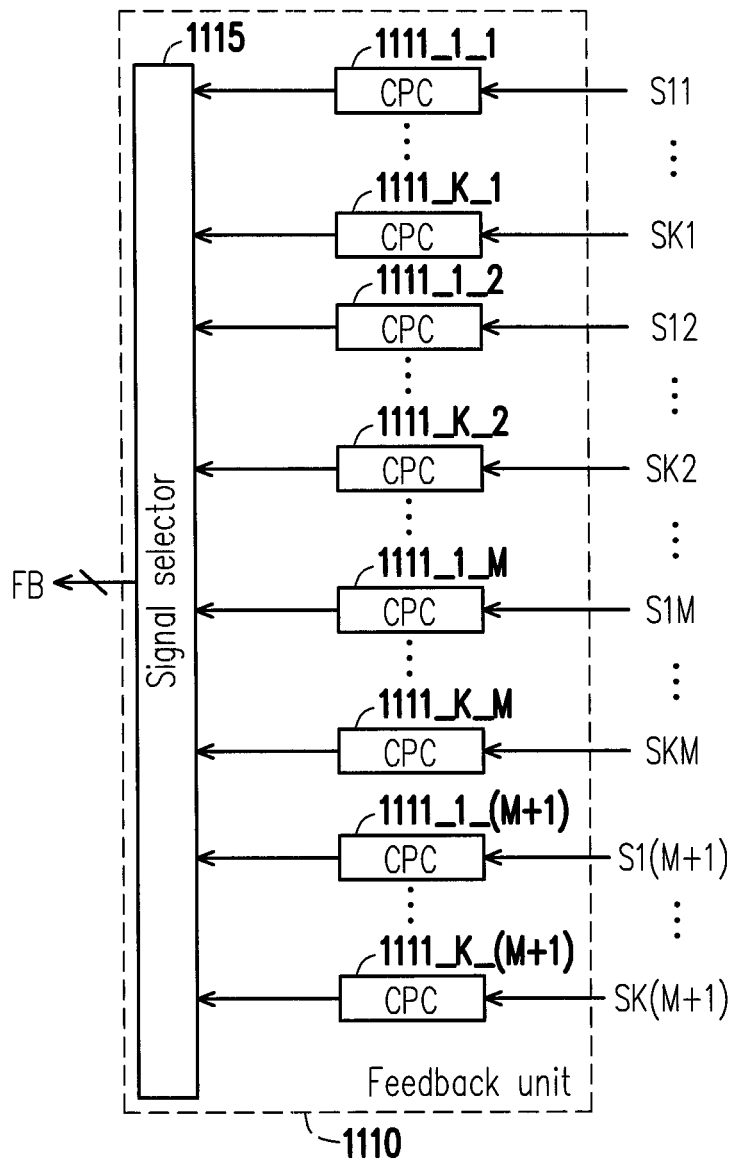

Referring to FIG. 16D, the embodiment of FIG. 16D is as described for FIG. 11 and FIG. 16A. The difference between the present embodiment and the embodiment shown in FIG. 16A is that the feedback unit 1110 shown in FIG. 16D does not include a PDC. In the present embodiment, the feedback unit 1110 includes CPCs 1111_1_1 to 1111_K_(M+1) and a signal selector 1115. The CPCs 1111_1_1 to 1111_K_(M+1) adjust a portion or all of the signal of the SCN module 120 and the signal of the OSCN 130 to serve as at least one first sensing power. The signal selector 1115 selects a portion or all of the at least one first sensing power to serve as at least one feedback signal FB and outputs the feedback signal FB to the ISCN 110.

Figure 16E:
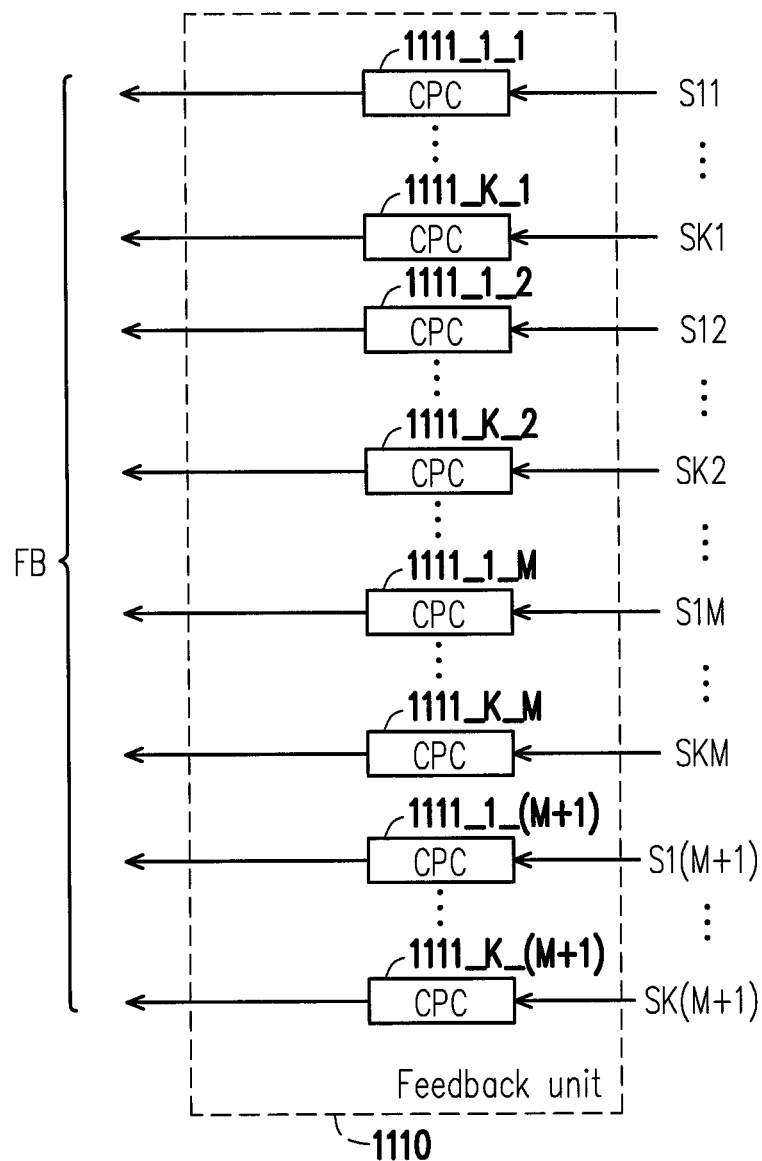

Referring to FIG. 16E, the embodiment of FIG. 16E is as described for FIG. 11 and FIG. 16A. The difference between the present embodiment and the embodiment shown in FIG. 16A is that the feedback unit 1110 shown in FIG. 16E does not include a PDC and a signal selector. In the present embodiment, the feedback unit 1110 includes CPCs 1111_1_1 to 1111_K_(M+1). The CPCs 1111_1_1 to 1111_K_(M+1) adjust a portion or all of the signal of the SCN module 120 and the signal of the OSCN 130 to serve as the feedback signal FB and outputs the feedback signal FB to the ISCN 110.

Figure 16F:
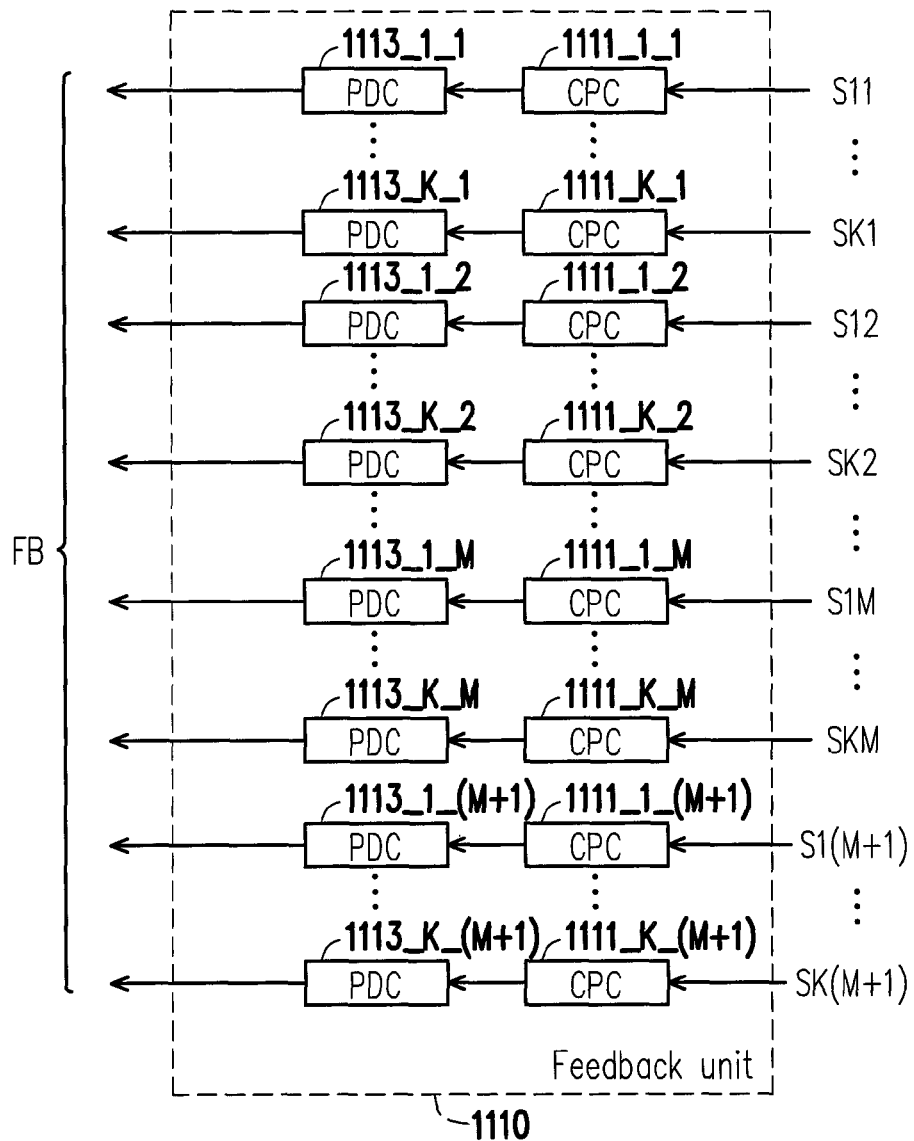

Referring to FIG. 16F, the embodiment of FIG. 16F is as described for FIG. 11 and FIG. 16A. The difference between the present embodiment and the embodiment shown in FIG. 16A is that the feedback unit 1110 shown in FIG. 16F does not include a signal selector. In the present embodiment, the feedback unit 1110 includes CPCs 1111_1_1 to 1111_K_(M+1) and PDCs 1113_1_1 to 1113_K_(M+1). The CPCs 1111_1_1 to 1111_K_(M+1) adjust a portion or all of the signal of the SCN module 120 and the signal of the OSCN 130 to serve as at least one first sensing power. The PDCs 1113_1_1 to 1113_K_(M+1) delay the at least one first sensing power, uses the delayed at least one first sensing power to serve as the feedback signal FB, and outputs the feedback signal FB to the ISCN 110.

Figure 17:
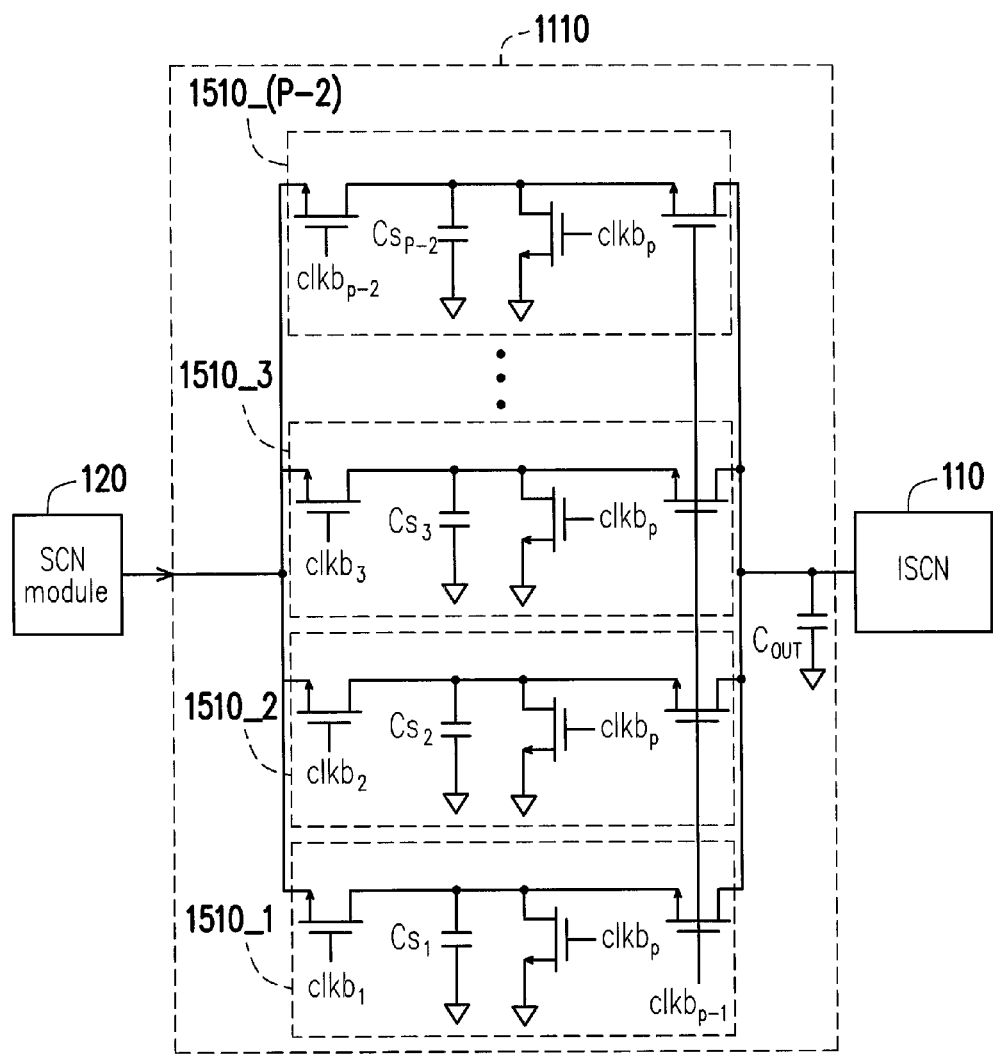
FIG. 17 is an implement example of a feedback unit according to an embodiment of the disclosure.

In other embodiments, the feedback unit 1110 could be implemented with a plurality of SCNs. For instance, FIG. 17 is a circuit block diagram of the feedback unit 1110 in the BCN 140 according to an embodiment of the disclosure. In some embodiments, the feedback unit 1110 could be provided with a single circuit shown in FIG. 17 to sense one of the signal of the SCN module 120 and the signal of the OSCN 130. In other embodiments, the feedback unit 1110 could be provided with a plurality of the circuit shown in FIG. 17 to respectively sense a portion or all of the signal of the SCN module 120 and the signal of the OSCN 130. Referring to FIG. 15, the feedback unit 1110 includes sampling units 1510_1, 1510_2, 1510_3, . . . , and 1510_(P−2), wherein P is a positive integer. Each of the sampling units 1510_1 to 1510_(P−2) performs sampling on the signal (or the signal of the OSCN 130) of the SCN module 120 with a different phase.

Figure 18:
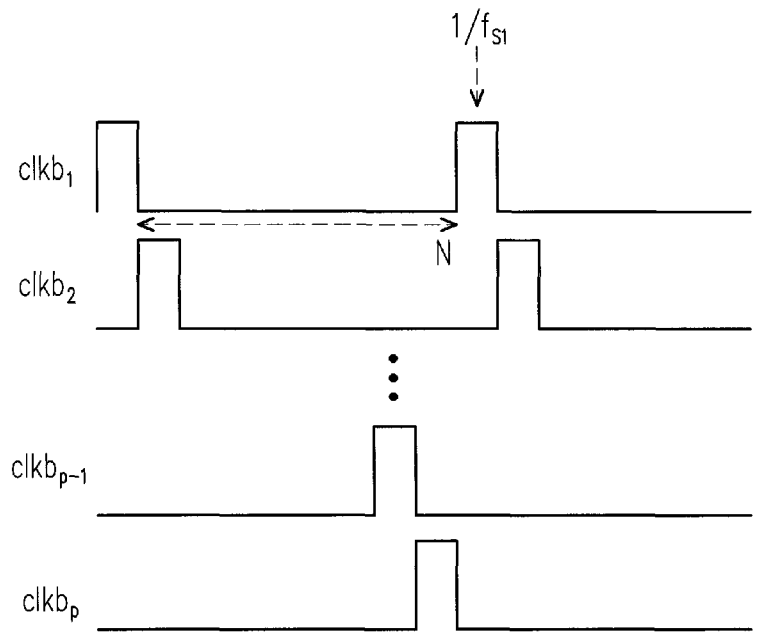
FIG. 18 is a timing diagram of signals of clock input terminals shown in FIG. 15 according to an embodiment of the disclosure.

The control terminals of the sampling switches of the sampling units 1510_1 to 1510_(P−2) respectively receive clock signals $clkb_1$, $clkb_2$, . . . , and $clkb_{P-2}$. FIG. 18 is a timing diagram of clock signals $clkb_1$, $clkb_2$, . . . , and $clkb_P$ in FIG. 17 according to an embodiment of the disclosure. Please refer to FIG. 17 and FIG. 18. The tap-length of the SCN is P and the sampling frequency thereof is fs1. The sampling units 1510_1 to 1510_(P−2) perform sampling on the signal of the SCN module 120 or the signal of the OSCN 130 in order and store the sampling results in sampling capacitors $Cs_1$, $Cs_2$, $Cs_3$, . . . , and $Cs_{P-2}$. After the sampling units 1510_1 to 1510_(P−2) all completed sampling, a clock signal $clkb_{P-1}$ triggers the output switch of each of the sampling units 1510_1 to 1510_(P−2) to output each of the sampling results to an output capacitor $C_{OUT}$. After each of the sampling units 1510_1 to 1510_(P−2) outputted each of the sampling results to the output capacitor $C_{OUT}$, the clock signal $clkb_P$ triggers the reset switch of each of the sampling units 1510_1 to 1510_(P−2) so as to reset each of the sampling results to a certain initial value (such as 0 volts). By changing the equivalent capacitance of the output capacitor $C_{OUT}$, the bandwidth could be changed/compensated.

In another embodiment, the reset switches controlled by the clock signal $clkb_{P-1}$ in the sampling units 1510_1 to 1510_(P−2) could be omitted according to design needs.

In other embodiments, at least one input terminal of the feedback unit 1110 is coupled to the SCN module 120 or coupled to the OSCN 130. According to design needs, the SCN module 120 or a portion or all of the output terminals coupled to the OSCN 130 are selected to be connected to different input terminals of the feedback unit 1110.

Figure 19:
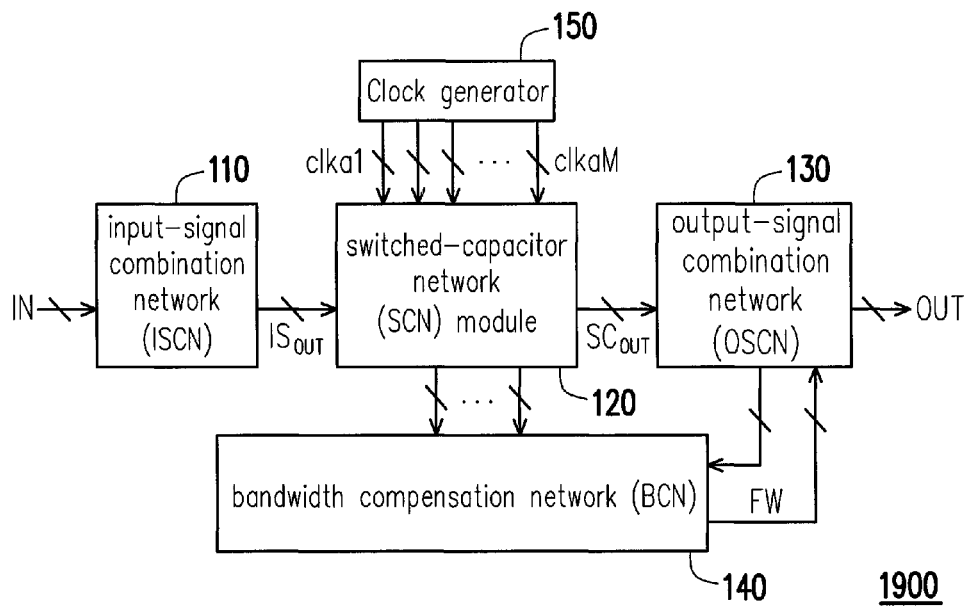
FIG. 19 is a block diagram of another CDF apparatus according to an embodiment of the disclosure.

FIG. 19 is a circuit block diagram of another CDF apparatus 1900 according to yet another embodiment of the disclosure. The CDF apparatus 1900 includes an ISCN 110, an SCN module 120, an OSCN 130, a BCN 140, and a clock generator 150. Referring to FIG. 19, the ISCN 110, the SCN module 120, the OSCN 130, the BCN 140, and the clock generator 150 shown in the embodiment of FIG. 19 are as described for the embodiment of FIG. 1. The difference between the present embodiment and the embodiment shown in FIG. 1 is that in the present embodiment, the BCN 140 does not include a feedback signal FB. In particular, at least one input terminal of the BCN 140 is coupled to the SCN module 120 and/or the OSCN 130. The BCN 140 could be implemented according to design needs.

Figure 20A:
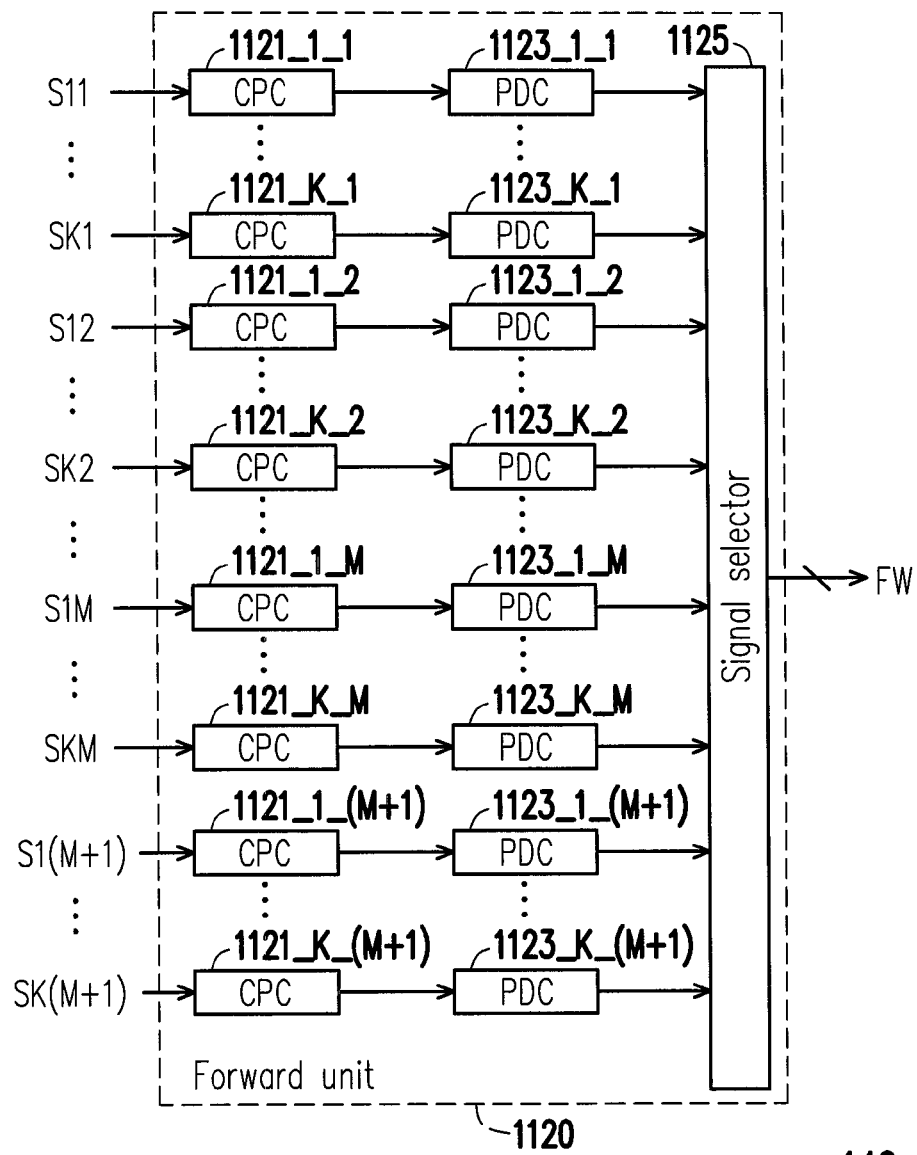
FIG. 20A to FIG. 20F are implement examples of a CDF apparatus shown in FIG. 19 according to an embodiment of the disclosure.

For instance, FIG. 20A to FIG. 20F are implement examples of the BCN 140 shown in FIG. 19 according to different embodiments of the disclosure. Referring to FIG. 20A, the difference between the present embodiment and the embodiment shown in FIG. 11 is that the BCN 140 shown in FIG. 20A does not include a feedback unit 1110. In the embodiment shown in FIG. 20A, the BCN 140 includes a forward unit 1120. The implementation of the forward unit 1120 in the embodiment of FIG. 20A is as described for the feedback unit 1110 shown in the embodiment of FIG. 11 or the embodiments of FIG. 16A to FIG. 16F and FIG. 17. The signal selector 1125 selects a portion or all of the delayed second sensing power to serve as the forward signal FW and outputs the forward signal FW to the OSCN 130.

Figure 20B:
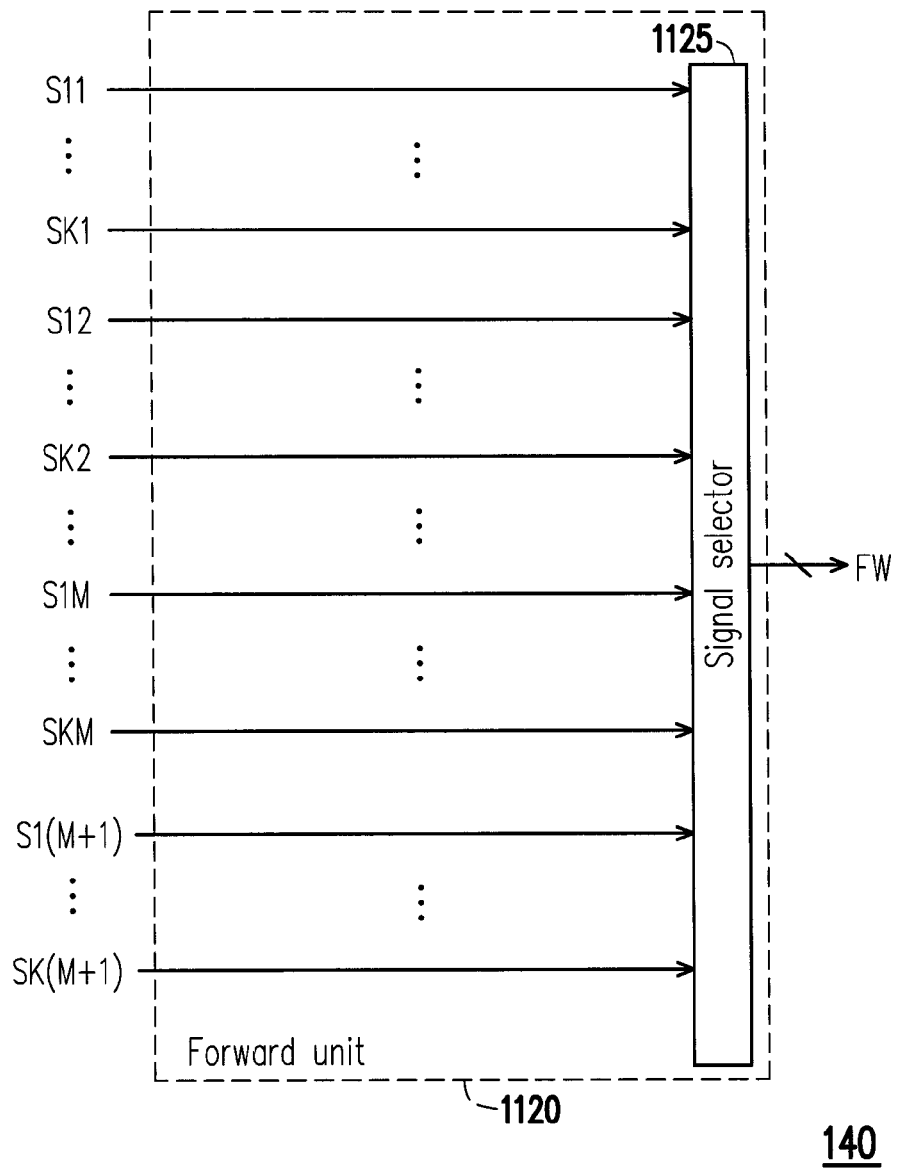

In other embodiments, the forward unit 1120 could optionally be provided with a CPC or a PDC. Moreover, in some embodiments, a CPC and a PDC may be omitted in the forward unit 1120, such that the signal (or the signal of the OSCN 130) of the SCN module 120 is directly transmitted to the signal selector 1125. For instance, referring to FIG. 20B, the embodiment of FIG. 20B is as described for FIG. 11 and FIG. 20A. The difference between the present embodiment and the embodiment shown in FIG. 20A is that in the present embodiment, the forward unit 1120 does not include a CPC and a PDC. The signal selector 1125 selects a portion or all of the signal of the SCN module 120 and the signal of the OSCN 130 to serve as at least one forward signal FW and outputs the forward signal FW to the OSCN 130.

Figure 20C:
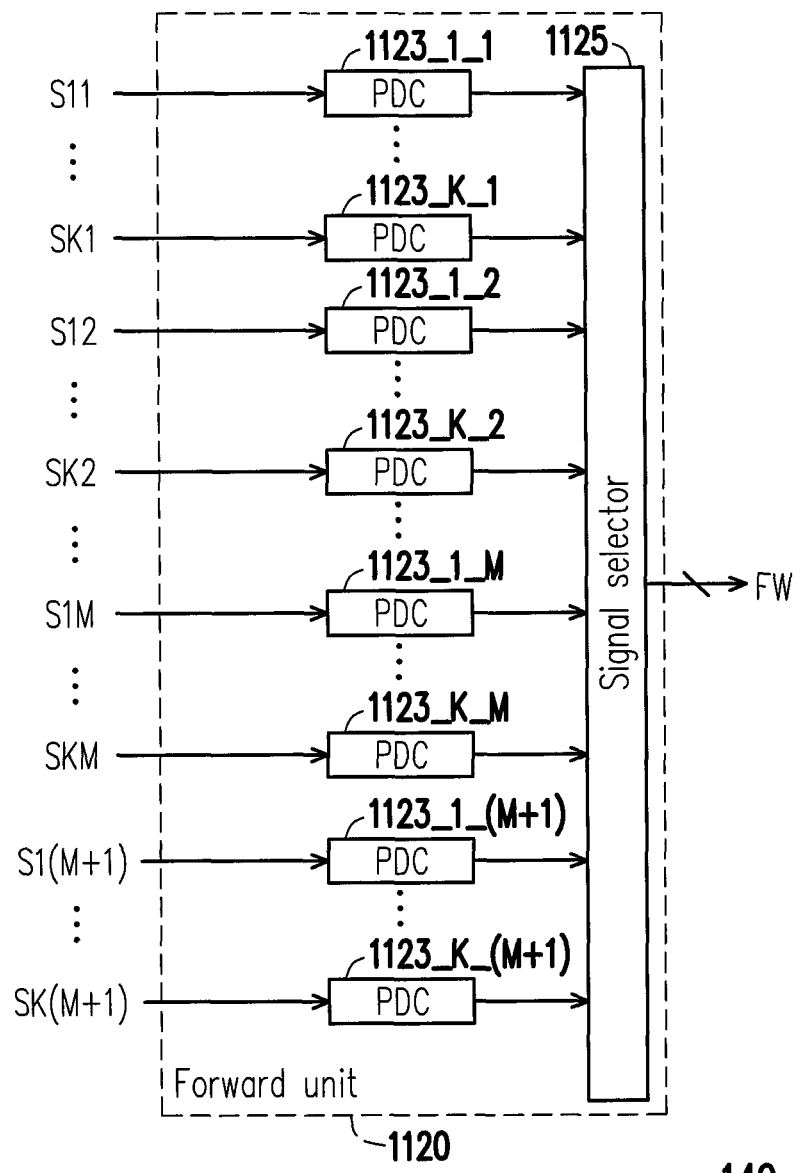

Moreover, referring to FIG. 20C, the embodiment of FIG. 20C is as described for FIG. 11 and FIG. 20A. The difference between the present embodiment and the embodiment shown in FIG. 20A is that the forward unit 1120 shown in FIG. 20C does not include a CPC. In the present embodiment, the forward unit 1120 includes PDCs 1123_1_1 to 1123_K_(M+1) and a signal selector 1125. The PDCs 1123_1_1 to 1123_K_(M+1) delay a portion or all of the signal of the SCN module 120 and the signal of the OSCN 130 to serve as at least one second sensing power. The signal selector 1125 selects a portion or all of the second sensing power to serve as the forward signal FW and outputs the forward signal FW to the OSCN 130.

Figure 20D:
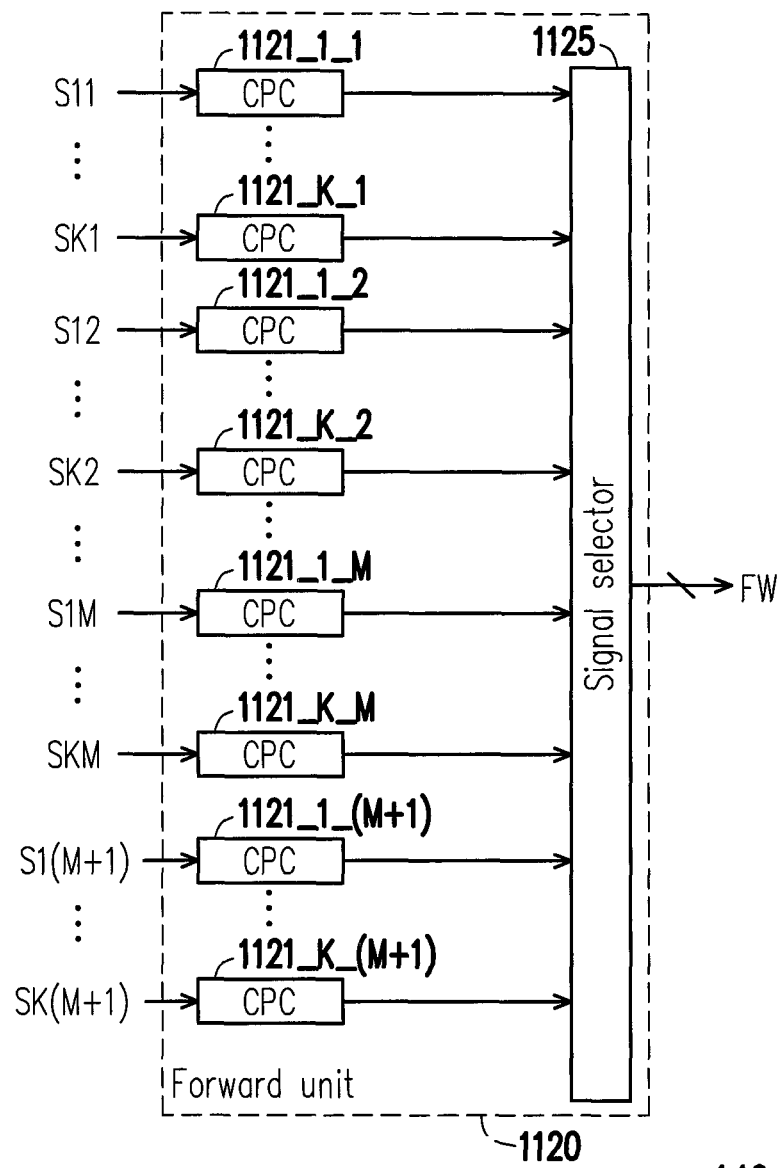

Referring to FIG. 20D, the embodiment of FIG. 20D is as described for FIG. 11 and FIG. 20A. The difference between the present embodiment and the embodiment shown in FIG. 20A is that the forward unit 1120 shown in FIG. 20D does not include a PDC. In the present embodiment, the forward unit 1120 includes CPCs 1121_1_1 to 1121_K_(M+1) and a signal selector 1125. The CPCs 1121_1_1 to 1121_K (M+1) adjust a portion or all of the signal of the SCN module 120 and the signal of the OSCN 130 to serve as at least one second sensing power. The signal selector 1125 selects a portion or all of the second sensing power to serve as the forward signal FW and outputs the forward signal FW to the OSCN 130.

Figure 20E:
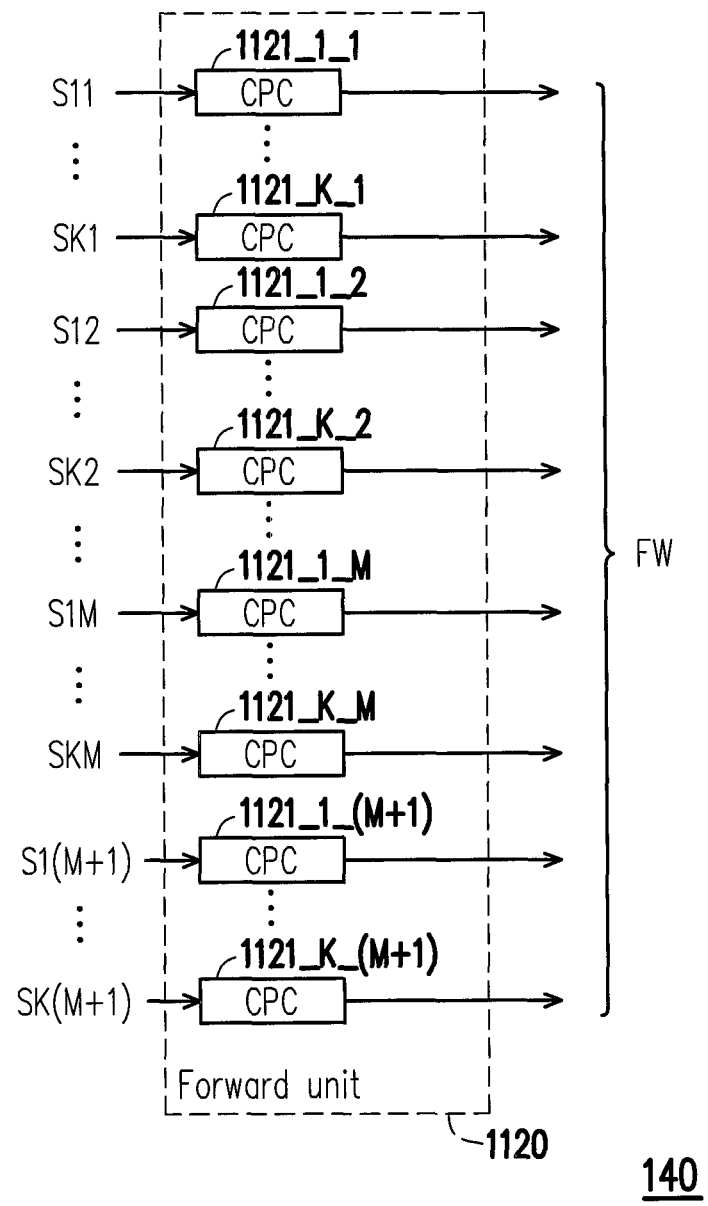

Referring to FIG. 20E, the embodiment of FIG. 20E is as described for FIG. 11 and FIG. 20A. The difference between the present embodiment and the embodiment shown in FIG. 20A is that the forward unit 1120 shown in FIG. 20E does not include a PDC and a signal selector. In the present embodiment, the forward unit 1120 includes CPCs 1121_1_1 to 1121_K_(M+1). The CPCs 1121_1_1 to 1121_K_(M+1) adjust a portion or all of the signal of the SCN module 120 and the signal of the OSCN 130 to serve as the forward signal FW and outputs the forward signal FW to the OSCN 130.

Figure 20F:
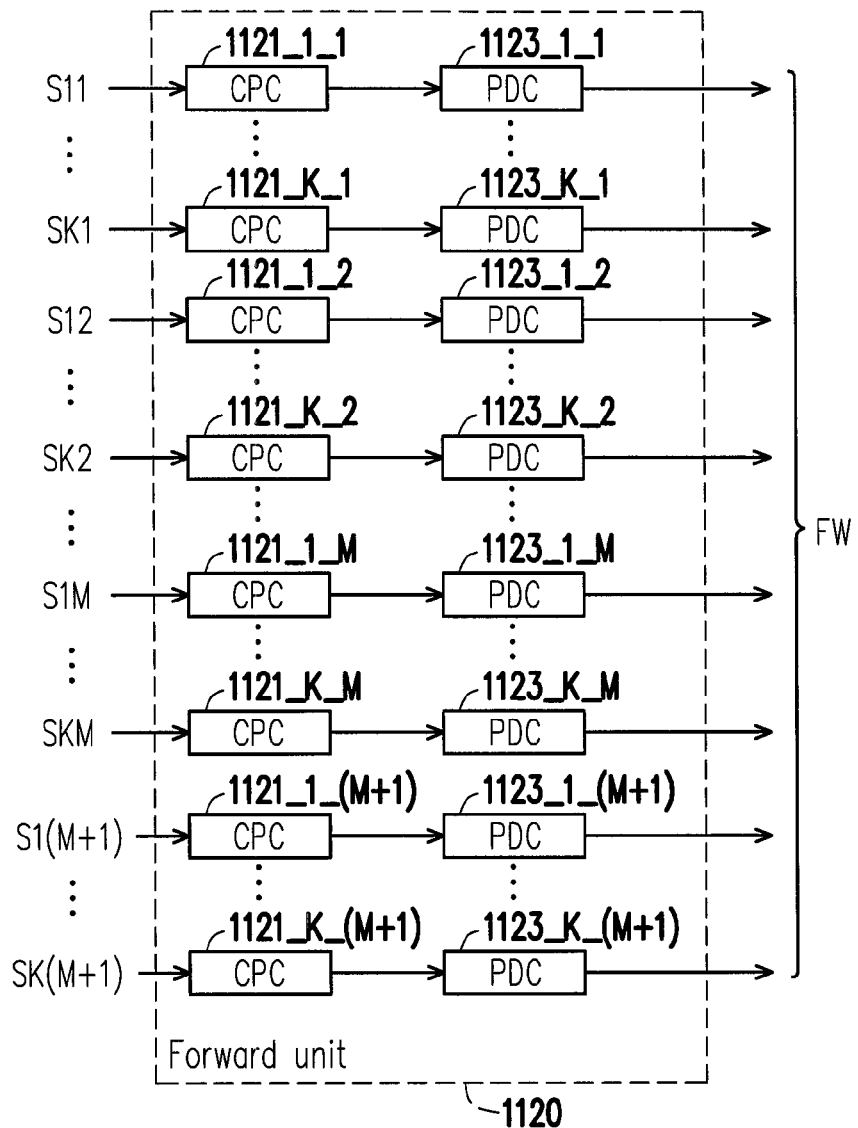

Referring to FIG. 20F, the embodiment of FIG. 20F is as described for FIG. 11 and FIG. 20A. The difference between the present embodiment and the embodiment shown in FIG. 20A is that the forward unit 1120 shown in FIG. 20F does not include a signal selector. In the present embodiment, the forward unit 1120 includes CPCs 1121_1_1 to 1121_K_(M+1) and PDCs 1123_1_1 to 1123_K_(M+1). The CPCs 1121_1_1 to 1121_K_(M+1) adjust a portion or all of the signal of the SCN module 120 and the signal of the OSCN 130 to serve as at least one second sensing power. The PDCs 1123_1_1 to 1123_K_(M+1) delay the second sensing power, uses the delayed second sensing power to serve as the forward signal FW, and outputs the forward signal FW to the OSCN 130.

Figure 21:
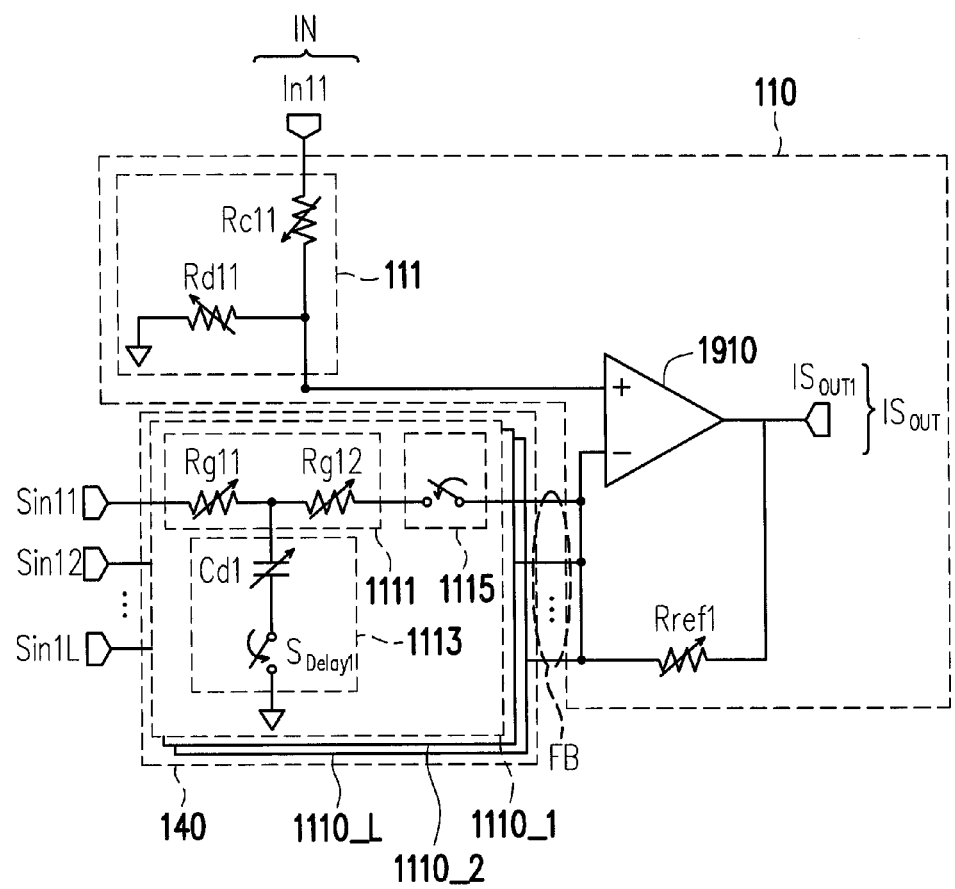
FIG. 21 is an implement example of an ISCN and a BCN shown in FIG. 1 according to an embodiment of the disclosure.

FIG. 21 is an implement example of the ISCN 110 and the BCN 140 shown in FIG. 1 according to yet another embodiment of the disclosure. The ISCN 110 includes an input signal circuit 111, an operational amplifier 1910, and a resistor Rref1. FIG. 21 illustrates one input signal circuit 111 receiving a signal In11 of the input signal IN. In other embodiments, the ISCN 110 may have a different number of the input signal circuit having different devices and a different coupling relationship.

The input signal circuit 111 includes resistors Rc11 and Rd11. The resistor Rc11 and/or the resistor Rd11 could be variable resistors. The first terminal of the resistor Rc11 receives the input signal In11 and the second terminal of the resistor Rc11 is coupled to the non-inverting input terminal of the operational amplifier 1910. The first terminal of the resistor Rd11 is coupled to the second terminal of the resistor Rc11 and the second terminal of the resistor Rd11 is coupled to a reference voltage (such as a ground voltage or other fixed voltages). The first terminal of the resistor Rref1 is coupled to the inverting input terminal of the operational amplifier 1910 and the second terminal of the resistor Rref1 is coupled to the output terminal of the operational amplifier 1910. The output terminal of the operational amplifier 1910 outputs a signal $IS_{OUT}$ of the output signal $IS_{OUT}$ to the SCN module 120.

Referring to FIG. 8A and FIG. 21, sensing signals Sin11, Sin12, . . . , and Sin1L in FIG. 21 could be all or a portion of the signal outputted by each of the SCN subgroups 1*1 to K*1, 1*2 to K*2, . . . , and 1*M to K*M and the output signal of the OSCN 130 in FIG. 8A, wherein L is a positive integer. FIG. 21 illustrates another implement example of the BCN 140. In the embodiment shown in FIG. 21, the BCN 140 includes L feedback units 1110_1, 1110_2, . . . , and 1110_L. The input terminals of the feedback units 1110_1 to 1110_L receive the sensing signals Sin11, Sin12, . . . , and Sin1L. The output terminals of the feedback units 1110_1 to 1110_L are jointly coupled to the inverting input terminal of the operational amplifier 1910 in the ISCN 110. The BCN 140 shown in FIG. 21 is as described for FIG. 11. For instance, the sensing signals Sin11 to Sin1L shown in FIG. 21 could be a portion or all of the plurality of sensing signals S11 to SK(M+1) shown in FIG. 11. In the following, the implement method of the feedback unit 1110_1 is described, and the rest of the feedback units 1110_2 to 1110_L are as described for the feedback unit 1110_1.

Referring to FIG. 21, the feedback unit 1110 includes a CPC 1111, a PDC 1113, and a signal selector 1115. The CPC 1111 includes resistors Rg11 and Rg12. The PDC 1113 includes a resistor Rg11, a capacitor Cd1, and a switch $S_{Delay1}$. The first terminal of the resistor Rg11 receives the signal Sin11. The second terminal of the resistor Rg11 is coupled to the first terminal of the resistor Rg12 and the first terminal of the capacitor Cd1. The first terminal of the switch $S_{Delay1}$ is coupled to the second terminal of the capacitor Cd1. The second terminal of the switch $S_{Delay1}$ is coupled to a reference voltage (such as a ground voltage or other fixed voltages). The first terminal of the signal selector 1115 is coupled to the second terminal of the resistor Rg12. The second terminal of the signal selector 1115 is coupled to the inverting input terminal of the operational amplifier 1910 in the ISCN 110.

By using and adjusting the resistance of each of the resistors Rg11, Rg12, and Rref1, the sensing signal Sin11 could generate a negative gain variation (inverting amplification). By using and adjusting the resistance of each of the resistors Rc11, Rd11, and Rref1, the input signal In11 could generate an equivalent positive gain variation (non-inverting amplification). Accordingly, controlling/deciding the resistance of each of the resistors Rc11, Rd11, Rg11, Rg12, and Rref1 could change the gain. Therefore, the feedback unit 1110_1 could achieve power or gain compensation of frequency response.

The capacitor Cd1 and the resistors Rg11 and Rg12 could form an equivalent delay circuit and use the switch $S_{Delay1}$ to decide whether to activate the delay circuit. When the switch $S_{Delay1}$ is turned on, by using and adjusting the capacitance of the capacitor Cd1 and/or the resistance of each of the resistors Rg11 and Rg12, the sensing signal Sin11 could have a delay time. The signal selector 1115 could select/decide whether to feedback the output signal (gained and/or delayed sensing signal Sin11) of the feedback unit 1110_1 to the inverting input terminal of the amplifier 1910. Therefore, the feedback unit 1110_1 could achieve frequency compensation of frequency response.

Figure 22:
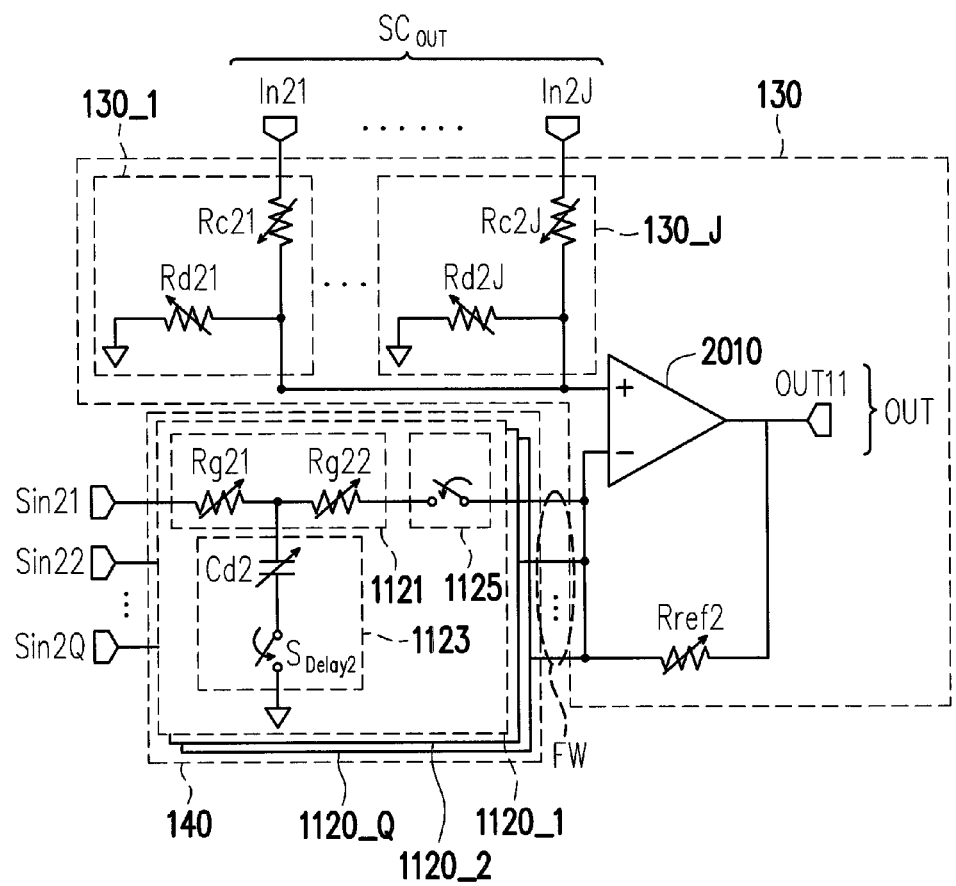
FIG. 22 is an implement example of an OSCN and a BCN shown in FIG. 1 according to an embodiment of the disclosure.

FIG. 22 is an implement example of the OSCN 130 and the BCN 140 shown in FIG. 1 according to another embodiment of the disclosure. The OSCN 130 includes an input signal circuit (such as 130_1_, . . . , and 130_J shown in FIG. 22, wherein J is a positive integer), an operational amplifier 2010, and a resistor Rref2. The first terminal of the resistor Rref2 is coupled to the inverting input terminal of the operational amplifier 2010 and the second terminal of the resistor Rref2 is coupled to the output terminal of the operational amplifier 2010. The output terminal of the operational amplifier 2010 provides a signal $OUT_{11}$ of the output signal OUT of the OSCN 130.

It is assumed here that the output signal $SC_{OUT}$ includes input signals In21, . . . , and In2J shown in FIG. 22. An input signal circuit 130_1 includes resistors Rc21 and Rd21. The resistor Rc21 and/or the resistor Rd21 could be variable resistors. The first terminal of the resistor Rc21 receives the input signal In21 and the second terminal of the resistor Rc21 is coupled to the non-inverting input terminal of an operational amplifier 2010. The first terminal of the resistor Rd21 is coupled to the second terminal of the resistor Rc21 and the second terminal of the resistor Rd21 is coupled to a reference voltage (such as a ground voltage or other fixed voltages). The rest of the input signal circuits in the OSCN 130 are as described for the ISCN 130_1. For instance, the input signal circuit 130_J includes resistors Rc2J and Rd2J. The first terminal of the resistor Rc2J receives the input signal In2J and the second terminal of the resistor Rc2J is coupled to the non-inverting input terminal of the operational amplifier 2010. The first terminal of the resistor Rd2J is coupled to the second terminal of the resistor Rc2J and the second terminal of the resistor Rd2J is coupled to a reference voltage (such as a ground voltage or other fixed voltages).

Referring to FIG. 8A and FIG. 22, Q sensing signals Sin21, Sin22, . . . , and Sin2Q in FIG. 22 could be all or a portion of the signal outputted by each of the SCN subgroups **1\*1 to K\*1, 1\*2 to K\*2, . . . , and 1\*M to K\*M and the output signal of the OSCN 130 in FIG. 8A, wherein Q is a positive integer. FIG. 22 illustrates another implement example of the BCN 140. In the embodiment shown in FIG. 22, the BCN 140 includes Q feedback units 1120_1, 1120_2, . . . , and 1120_Q**.

The input terminals of the feedback units 1120_1 to 1120_Q receive the sensing signals Sin21, Sin22, . . . , and Sin2Q. The output terminals of the feedback units 1120_1 to 1120_Q are jointly coupled to the inverting input terminal of the operational amplifier 2010 in the OSCN 130. The BCN 140 shown in FIG. 22 is as described for FIG. 11. For instance, the sensing signals Sin21 to Sin2Q shown in FIG. 22 could be a portion or all of the plurality of sensing signals S11 to SK(M+1) shown in FIG. 11. In the following, the implement method of the forward unit 1120_1 is described, and the rest of the forward units 1120_2 to 1120_Q are as described for the forward unit 1120_1.

Referring to FIG. 1 and FIG. 22, the forward unit 1120_1 includes a CPC 1121, a PDC 1123, and a signal selector 1125. The CPC 1121 includes resistors Rg21 and Rg22. The PDC 1123 includes a resistor Rg21, a capacitor Cd2, and a switch $S_{Delay2}$. The first terminal of the resistor Rg21 receives the signal Sin21. The second terminal of the resistor Rg21 is coupled to the first terminal of the resistor Rg22 and the first terminal of the capacitor Cd2. The first terminal of the switch $S_{Delay2}$ is coupled to the second terminal of the capacitor Cd2. The second terminal of the switch $S_{Delay2}$ is coupled to a reference voltage (such as a ground voltage or other fixed voltages). The first terminal of the signal selector 1125 is coupled to the second terminal of the resistor Rg22. The second terminal of the signal selector 1125 is coupled to the inverting input terminal of the operational amplifier 2010 in the OSCN 130.

By using and adjusting the resistance of each of the resistors Rg21, Rg22, and Rref2, the sensing signal Sin21 could generate a negative gain variation (inverting amplification). By using and adjusting the resistance of each of the resistors Rc21, Rd21, and Rref2, the input signal In21 could generate an equivalent positive gain variation (non-inverting amplification). Controlling/deciding the resistance of each of the resistors Rc21, Rd21, Rc2J, Rd2J, Rg21, Rg22, and Rref2 could change the gain. Therefore, the forward unit 1120_1 could achieve power or gain compensation of frequency response.

The capacitor Cd2 and the resistors Rg21 and Rg22 could form an equivalent delay circuit and use the switch $S_{Delay2}$ to decide whether to activate the delay circuit. When the switch $S_{Delay1}$ is turned on, by using and adjusting the capacitance of the capacitor Cd2 and/or the resistance of each of the resistors Rg21 and Rg22, the sensing signal Sin21 could have a delay time. The signal selector 1125 could select/decide whether to feedback the output signal (gained and/or delayed sensing signal Sin21) of the forward unit 1120_1 to the inverting input terminal of the amplifier 2010. Therefore, the forward unit 1120_1 could achieve frequency compensation of frequency response.

Accordingly, the CDF apparatus 100 could flexibly use the BCN 140 and select a forward or feedback signal according to the frequency response to compensate the ISCN 110 or the OSCN 130 to achieve the bandwidth, reduce folding frequency, and filter out clock feed-through from each of the SCN subgroups. As a result, stop-band attenuation is improved and sinc-function distortion is eliminated. Moreover, even if the number of SCNs in each of the SCN subgroups is not equal to the number of clock signals, by performing time-interleaving to increase the sampling frequency outputted, the M SCN groups shown in FIG. 3 could improve stop-band attenuation with decimation. Whenever the performance of the SCNs is processed in the z domain, configurable bandwidth could be achieved through the variable clock frequency and the IIR treatment from the SCNs.

Figure 23:
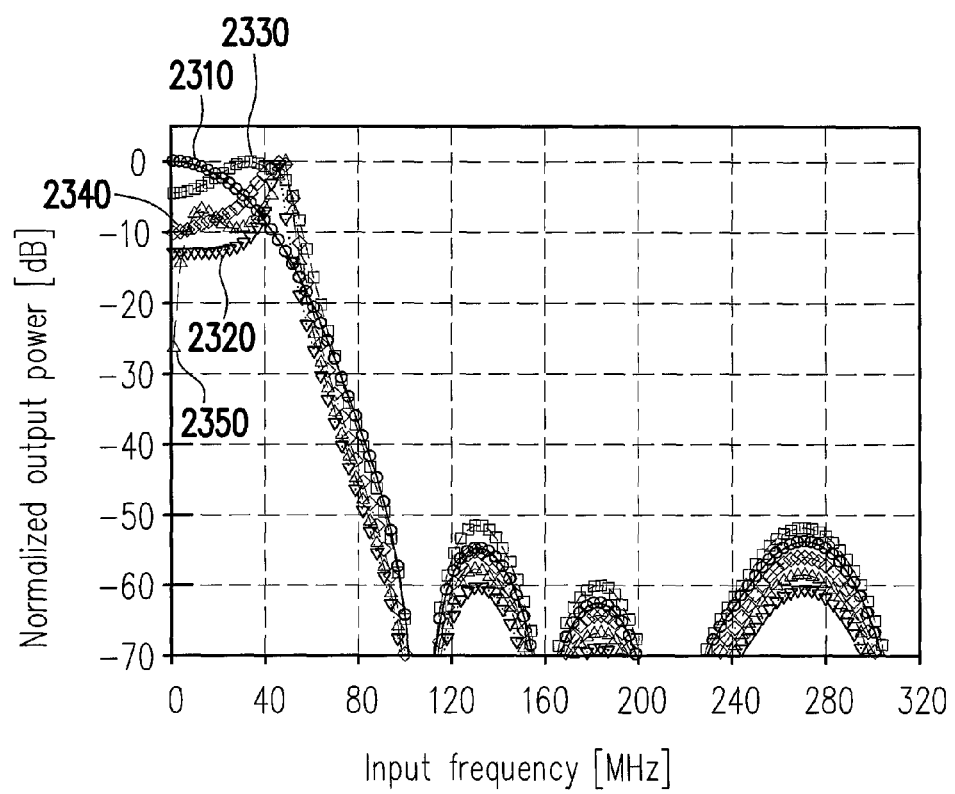
FIG. 23 is a simulation diagram of bandwidth compensation with a feedback signal according to an embodiment of the disclosure.

FIG. 23 is a simulation diagram of frequency response of a CDF apparatus with bandwidth compensation performed on a feedback signal FB according to an embodiment of the disclosure. FIG. 23 shows a simulation diagram of frequency response in accordance to the structure of FIG. 15 in which the sampling frequency is equal to 640 MS/s. In FIG. 23, the vertical axis shown represents normalized output power (in units of dB) and the horizontal axis represents input frequency (in units of MHz). For in-band compensation, in the embodiments of the disclosure, a signal selector is provided to allow the selection of a feedback signal of zero to four signal sensing channels. When no feedback signal of a signal sensing channel is selected, the frequency response of the CDF apparatus shown in FIG. 15 is as shown for a frequency response curve 2310 of FIG. 23. It could be known from the frequency response curve 2310 that the influence of the sinc-function is very significant and the channel bandwidth is very narrow.

When the signal selector of the BCN 140 selects to output the feedback signal of one or a plurality of signal sensing channels to the ISCN 110, the phenomenon of gain-peaking occurs to the frequency response curve. For instance, under the condition that the signal selector selects to output the feedback signal of one signal sensing channel to the ISCN 110, the frequency response of the CDF apparatus shown in FIG. 15 is as shown for a frequency response curve 2320 of FIG. 23. It could be known from the frequency response curve 2320 that significant gain-peaking occurs near 50 MHz. The frequency response curves 2330, 2340, and 2350 respectively describe the frequency response of the signal selector selecting to output the feedback signals of two, three, and four signal sensing channels to the ISCN 110. Moreover, under the condition that the signal selector selects to output the feedback signals of four signal sensing channels to the ISCN 110, as shown in the frequency response curve 2350, gain-peaking not only occurs near 50 MHz, gain reduction also occurs to the frequency response of direct current (DC).

Figure 24:
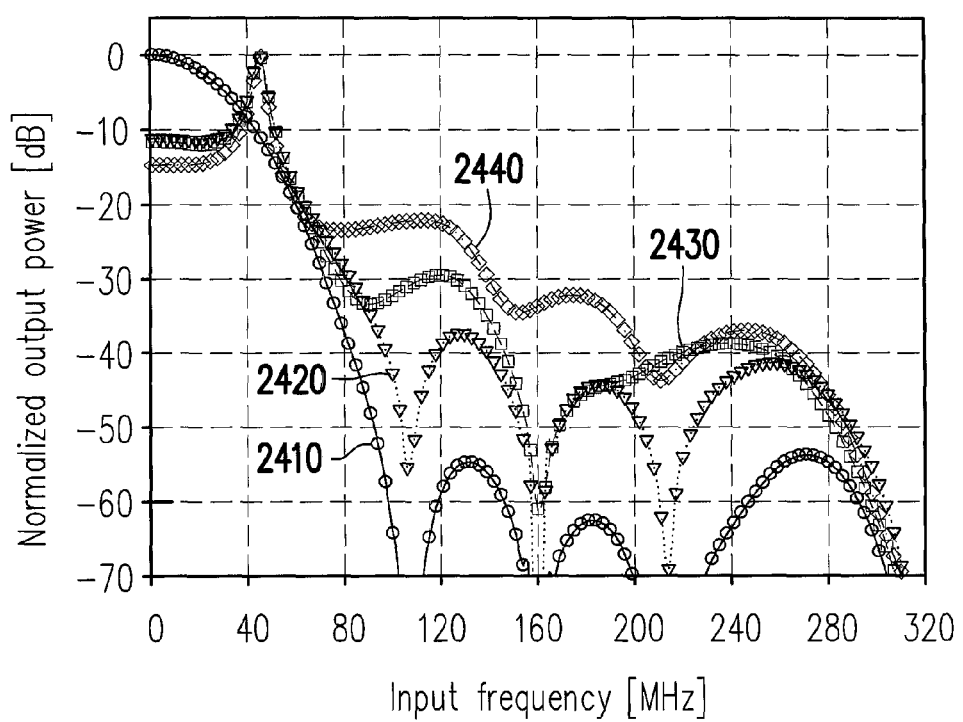
FIG. 24 is a simulation diagram of bandwidth compensation with a feedback signal and a forward signal according to an embodiment of the disclosure.

FIG. 24 is a simulation diagram of frequency response of a CDF apparatus with bandwidth compensation performed on a feedback signal FB and a forward signal FW according to an embodiment of the disclosure. The sampling frequency shown in FIG. 24 is equal to 640 MS/s and is in accordance with the simulation diagram of frequency response of the structure of FIG. 1. In FIG. 24, the vertical axis shown represents normalized output power (in units of dB) and the horizontal axis represents input frequency (in units of MHz). Referring to FIG. 24, when no feedback signal of a signal sensing channel of the feedback unit 1110 is selected, and no forward signal of a signal sensing channel of the forward unit 1120 is selected, the frequency response of the CDF apparatus shown in FIG. 1 is as shown for a frequency response curve 2410 of FIG. 24. It could be known from the frequency response curve 2410 that the influence of the sinc-function is very significant and the channel bandwidth is very narrow.

For the control of a stop-band, in the embodiments of the disclosure, the feedback unit 1110 is provided with a signal selector to allow the selection of one feedback signal, and the forward unit 1120 is provided with a signal selector to allow the selection of one or a plurality of forward signals. When the signal selector of the feedback unit 1110 of the BCN 140 chooses to output the feedback signal of a signal sensing channel to the ISCN 110, and the signal selector of the forward unit 1120 of the BCN 140 chooses to output a forward signal to the OSCN 130, the frequency response of the CDF apparatus shown in FIG. 1 is as shown for a frequency response curve 2420 of FIG. 24. It could be known from FIG. 24 that gain-peaking occurs to the frequency response curve 2420. Moreover, the frequency response curves 2430 and 2440 respectively describe the frequency response of the signal selector of the forward unit 1120 of the BCN 140 selecting to output the forward signals of two and three signal sensing channels to the OSCN 130. By properly controlling the CPCs and the PDCs in the BCN 140, the BCN 140 could increase stop-band attenuation. Therefore, the bandwidth compensation structure disclosed in the embodiments of the disclosure for a CDF apparatus could eliminate influences from sine-function distortion and low pass filter (LPF) distortion.

The operation method of the CDF apparatus in the embodiments is described herein. First, an ISCN, an SCN module, and an OSCN are provided in a CDF apparatus. In particular, at least one input terminal of the ISCN receives at least one input signal; at least one input terminal of the SCN module is respectively connected to at least one output terminal of the ISCN; at least one input terminal of the OSCN is respectively connected to at least one output terminal of the SCN module, and the OSCN outputs at least one output signal. Then, the signal of the SCN module, the signal of the OSCN, or the signal of each of the SCN module and the OSCN are sensed to obtain a sensing result. Then, at least one feedback signal or at least one forward signal is correspondingly generated for the ISCN or the OSCN according to the sensing result to perform bandwidth compensation.

In some embodiments, the operation method further includes: configuring M SCN groups in the SCN module, wherein M is a positive integer; and configuring M routing circuits in the SCN module. In particular, at least one input terminal of the first SCN group in the SCN groups is respectively connected to the at least one output terminal of the ISCN; an $i^{th}$ routing circuit in the routing circuits is coupled between at least one output terminal of an $i^{th}$ SCN group in the SCN groups and at least one input terminal of an $(i+1)^{th}$ SCN group in the SCN groups so as to configure the coupling relation between the at least one output terminal of the $i^{th}$ SCN group and the at least one input terminal of the $(i+1)^{th}$ SCN group; and an $M^{th}$ routing circuit in the routing circuits is coupled between at least one output terminal of an $M^{th}$ SCN group in the SCN groups and the at least one input terminal of the OSCN so as to configure a coupling relation between the at least one input terminal of the $M^{th}$ SCN group and the at least one input terminal of the OSCN, wherein i is between 1 and M. In some embodiments, a portion or all of the output terminals of the SCN groups provide the signal of the SCN module to the BCN.

In some embodiments, the operation method of the CDF apparatus further includes: configuring a feedback unit in the BCN, and/or configuring a forward unit in the BCN. In particular, at least one input terminal of the feedback unit is coupled to the SCN module, coupled to the OSCN, or coupled to the SCN module and the OSCN. At least one output terminal of the feedback unit is coupled to the ISCN to provide the at least one feedback signal to the ISCN to perform bandwidth compensation. In particular, at least one input terminal of the forward unit is coupled to the SCN module, coupled to the OSCN, or coupled to the SCN module and the OSCN. At least one input terminal of the forward unit is coupled to the OSCN to provide the at least one forward signal to the OSCN to perform bandwidth compensation.

In some embodiments, the operation method of the CDF apparatus further includes: adjusting a portion or all of the signal of the SCN module and the signal of the OSCN with at least one CPC of the feedback unit to serve as at least one first sensing power; delaying the at least one first sensing power with at least one PDC of the feedback unit; and selecting a portion or all of the delayed at least one first sensing power to serve as the at least one feedback signal and outputting the at least one feedback signal to the ISCN with the signal selector of the feedback unit.

In some other embodiments, the operation method of the CDF apparatus further includes: adjusting a portion or all of the signal of the SCN module and the signal of the OSCN with at least one CPC of the feedback unit to serve as at least one first sensing power; and selecting a portion or all of the at least one first sensing power to serve as the at least one feedback signal and outputting the at least one feedback signal to the ISCN with the signal selector of the feedback unit.

In some other embodiments, the operation method of the CDF apparatus further includes: delaying a portion or all of the signal of the SCN module and the signal of the OSCN with at least one PDC of the feedback unit to serve as at least one first sensing power; and selecting a portion or all of the at least one first sensing power to serve as the at least one feedback signal and outputting the at least one feedback signal to the ISCN with the signal selector of the feedback unit.

In some other embodiments, the operation method of the CDF apparatus further includes: adjusting a portion or all of the signal of the SCN module and the signal of the OSCN with at least one CPC of the feedback unit to serve as the at least one feedback signal and outputting the at least one feedback signal to the ISCN.

In some other embodiments, the operation method of the CDF apparatus further includes: selecting a portion or all of the signal of the SCN module and the signal of the OSCN to serve as the at least one feedback signal and outputting the at least one feedback signal to the ISCN with the signal selector of the feedback unit.

In some other embodiments, the operation method of the CDF apparatus further includes: adjusting a portion or all of the signal of the SCN module and the signal of the OSCN with at least one CPC of the feedback unit to serve as at least one first sensing power; and delaying the at least one first sensing power with at least one PDC of the feedback unit, using the delayed at least one first sensing power to serve as the at least one feedback signal, and outputting the at least one feedback unit to the ISCN.

In some embodiments, the operation method of the CDF apparatus further includes: adjusting a portion or all of the signal of the SCN module and the signal of the OSCN with at least one CPC of the forward unit to serve as at least one first sensing power; delaying the at least one first sensing power with at least one PDC of the forward unit; and selecting a portion or all of the delayed at least one first sensing power to serve as the at least one forward signal and outputting the at least one forward signal to the OSCN with the signal selector of the forward unit.

In some other embodiments, the operation method of the CDF apparatus further includes: adjusting a portion or all of the signal of the SCN module and the signal of the OSCN with at least one CPC of the forward unit to serve as at least one first sensing power; and selecting a portion or all of the at least one first sensing power to serve as the at least one forward signal and outputting the at least one forward signal to the OSCN with the signal selector of the forward unit.

In some other embodiments, the operation method of the CDF apparatus further includes: delaying a portion or all of the signal of the SCN module and the signal of the OSCN with at least one PDC of the forward unit to serve as at least one first sensing power; and selecting a portion or all of the delayed at least one first sensing power to serve as the at least one forward signal and outputting the at least one forward signal to the OSCN with the signal selector of the forward unit.

In some other embodiments, the operation method of the CDF apparatus further includes: adjusting a portion or all of the signal of the SCN module and the signal of the OSCN with at least one CPC of the forward unit to serve as the at least one forward signal and outputting the at least one forward signal to the OSCN.

In some other embodiments, the operation method of the CDF apparatus further includes: selecting a portion or all of the signal of the SCN module and the signal of the OSCN to serve as the at least one forward signal and outputting the at least one forward signal to the OSCN with the signal selector of the forward unit.

In some other embodiments, the operation method of the CDF apparatus further includes: adjusting a portion or all of the signal of the SCN module and the signal of the OSCN with at least one CPC of the forward unit to serve as at least one first sensing power; and delaying the at least one first sensing power with at least one PDC of the forward unit, using the delayed at least one first sensing power to serve as the at least one forward signal, and outputting the at least one forward unit to the OSCN.

In some other embodiments, the operation method of the CDF apparatus further includes: adjusting the phase difference of a plurality of clock signals according to a first control signal, or adjusting the pulse width of the clock signals according to a second control signal; and providing the clock signals to the SCN module.

Based on the above, the embodiments of the disclosure provide a BCN having a flexible structure so as to achieve frequency compensation and/or power or gain compensation of frequency response according to design needs. In some embodiments, the ISCN selects the input signal and performs sampling, filtering, and decimation on the signal through the SCN module to significantly attenuate the power of folding noise of a portion of the frequency. The BCN could provide 2-D compensation of bandwidth to the CDF apparatus. Moreover, according to design needs, a feedback or forward signal is selected to adjust the feedback or forward signal to the bandwidth and gain of frequency response and improve sinc-function distortion.

It will be apparent to those skills in the art that various modifications and variations could be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A charge-domain filter (CDF) apparatus, comprising:
an input-signal combination network (ISCN), wherein at least one input terminal of the ISCN receives at least one input signal;
a switched-capacitor network (SCN) module, wherein at least one input terminal of the SCN module is respectively connected to at least one output terminal of the ISCN;
an output-signal combination network (OSCN), wherein at least one input terminal of the OSCN is respectively connected to at least one output terminal of the SCN module, and the OSCN outputs at least one output signal; and
a bandwidth compensation network (BCN) coupled to the SCN module, wherein the BCN senses a signal of the SCN module, senses a signal of the OSCN, or senses a signal of each of the SCN module and the OSCN, and correspondingly generates at least one feedback signal or at least one forward signal for the ISCN or the OSCN to perform bandwidth compensation according to a sensing result, wherein the BCN comprises:

a forward unit, wherein at least one input terminal of the forward unit is coupled to the SCN module, coupled to the OSCN, or coupled to the SCN module and the OSCN, and at least one output terminal of the forward unit is coupled to the OSCN to provide the at least one forward signal to the OSCN to perform bandwidth compensation, wherein the forward unit comprises:

at least one configurable power-reference cell adjusting a portion or all of the signal of the SCN module and the signal of the OSCN to serve as at least one first sensing power;

at least one programmable-delay cell delaying the at least one first sensing power; and a signal selector, selecting a portion or all of the at least one first sensing power delayed to serve as the at least one forward signal, and outputting the at least one forward signal to the OSCN.

2. The CDF apparatus of claim 1, wherein the SCN module comprises:

M SCN groups, wherein M is a positive integer, and at least one input terminal of a first SCN group in the SCN groups is respectively connected to the at least one output terminal of the ISCN; and M routing circuits, wherein an $i^{th}$ routing circuit in the routing circuits is coupled between at least one output terminal of an $i^{th}$ SCN group in the SCN groups and at least one input terminal of an $(i+1)^{th}$ SCN group in the SCN groups so as to configure a coupling relation between the at least one output terminal of the $i^{th}$ SCN group and the at least one input terminal of the $(i+1)^{th}$ SCN group; and an $M^{th}$ routing circuit in the routing circuits is coupled between at least one output terminal of an $M^{th}$ SCN group in the SCN groups and the at least one input terminal of the OSCN so as to configure a coupling relation between the at least one output terminal of the $M^{th}$ SCN group and the at least one input terminal of the OSCN, wherein i is between 1 and M.

3. The CDF apparatus of claim 2, wherein a portion or all of the output terminals of the SCN groups are coupled to the BCN to provide the signal of the SCN module.

4. The CDF apparatus of claim 2, wherein each of the routing circuits comprises an interleaver, wherein the interleaver of the $i^{th}$ routing circuit configures the coupling relation between the at least one output terminal of the $i^{th}$ SCN group and the at least one input terminal of the $(i+1)^{th}$ SCN group.

5. The CDF apparatus of claim 2, wherein each of the SCN groups comprise at least one SCN subgroup.

6. The CDF apparatus of claim 2, wherein the $i^{th}$ SCN group comprises y SCN subgroups and the $(i+1)^{th}$ SCN group comprises z SCN subgroups, wherein y and z are positive integers and y is not equal to z.

7. The CDF apparatus of claim 5, wherein a SCN of one of the SCN subgroups comprises:

a plurality of sampling units, wherein sampling terminals of the sampling units are connected to an input terminal of the SCN and each of the sampling units performs sampling on the input terminal of the SCN in a different phase; and a summing unit, having an input terminal connected to output terminals of the sampling units, and summing a sampling result of the sampling units.

8. The CDF apparatus of claim 7, wherein one of the sampling units comprises:

a sampling switch, having a first terminal connected to the input terminal of the SCN;

a sampling capacitor connected to a second terminal of the sampling switch;

a reset switch, having a first terminal connected to the sampling capacitor and a second terminal connected to a reference voltage; and an output switch, having a first terminal connected to the sampling capacitor and a second terminal connected to the input terminal of the summing unit.

9. The CDF apparatus of claim 7, wherein the summing unit comprises:

a summing capacitor connected to the output terminals of the sampling units.

10. The CDF apparatus of claim 9, wherein the summing unit further comprises:

a first switch, having a first terminal connected to the output terminals of the sampling units; and a first capacitor connected to a second terminal of the first switch.

11. The CDF apparatus of claim 9, wherein the summing unit further comprises:

a second switch, having a first terminal connected to the summing capacitor; and a third switch, having a first terminal connected to a second terminal of the second switch, and a second terminal connected to a reference voltage.

12. The CDF apparatus of claim 1, wherein the BCN comprises:

a feedback unit, wherein at least one input terminal of the feedback unit is coupled to the SCN module, coupled to the OSCN, or coupled to the SCN module and the OSCN, and at least one output terminal of the feedback unit is coupled to the ISCN to provide the at least one feedback signal to the ISCN to perform bandwidth compensation.

13. The CDF apparatus of claim 12, wherein the feedback unit comprises:

at least one configurable power-reference cell adjusting a portion or all of the signal of the SCN module and the signal of the OSCN to serve as at least one first sensing power;

at least one programmable-delay cell delaying the at least one first sensing power; and a signal selector, selecting a portion or all of the at least one first sensing power delayed to serve as the at least one feedback signal and outputting the at least one feedback signal to the ISCN.

14. The CDF apparatus of claim 12, wherein the feedback unit comprises:

at least one configurable power-reference cell adjusting a portion or all of the signal of the SCN module and the signal of the OSCN to serve as at least one first sensing power; and a signal selector, selecting a portion or all of the at least one first sensing power to serve as the at least one feedback signal and outputting the at least one feedback signal to the ISCN.

15. The CDF apparatus of claim 12, wherein the feedback unit comprises:

at least one programmable-delay cell delaying a portion or all of the signal of the SCN module and the signal of the OSCN to serve as at least one first sensing power; and a signal selector, selecting a portion or all of the at least one first sensing power to serve as the at least one feedback signal and outputting the at least one feedback signal to the ISCN.

16. The CDF apparatus of claim 12, wherein the feedback unit comprises:

at least one configurable power-reference cell adjusting a portion or all of the signal of the SCN module and the signal of the OSCN to serve as the at least one feedback signal and outputting the at least one feedback signal to the ISCN.

17. The CDF apparatus of claim 12, wherein the feedback unit comprises:

a signal selector, selecting a portion or all of the signal of the SCN module and the signal of the OSCN to serve as the at least one feedback signal and outputting the at least one feedback signal to the ISCN.

18. The CDF apparatus of claim 12, wherein the feedback unit comprises:

at least one configurable power-reference cell adjusting a portion or all of the signal of the SCN module and the signal of the OSCN to serve as at least one first sensing power; and at least one programmable-delay cell delaying the at least one first sensing power, using the at least one first sensing power delayed to serve as the at least one feedback signal, and outputting the at least one feedback signal to the ISCN.

19. The CDF apparatus of claim 12, wherein the feedback unit comprises:

a first resistor, having a first terminal coupled to the SCN module or the OSCN;

a first capacitor, having a first terminal coupled to a second terminal of the first resistor;

a first switch, having a first terminal coupled to a second terminal of the first capacitor, and a second terminal coupled to a reference voltage;

a second resistor, having a first terminal coupled to the second terminal of the first resistor; and a second switch, having a first terminal coupled to a second terminal of the second resistor, and a second terminal coupled to the OSCN.

20. The CDF apparatus of claim 19, wherein the ISCN comprises:

a third resistor, having a first terminal used as an input terminal of the ISCN;

a fourth resistor, having a first terminal coupled to a second terminal of the third resistor, and a second terminal coupled to the reference voltage;

an amplifier, having a non-inverting input terminal coupled to the second terminal of the third resistor, an inverting input terminal coupled to the second terminal of the second switch, and an output terminal used as an output terminal of the ISCN; and a fifth resistor, wherein a first terminal and a second terminal of the fifth resistor are respectively coupled to the non-inverting input terminal and the output terminal of the amplifier.

21. The CDF apparatus of claim 1, wherein the ISCN comprises at least one of an operational amplifier, a current adder, and a transconductance amplifier.

22. The CDF apparatus of claim 1, wherein the OSCN comprises at least one of an operational amplifier, a current adder, and a transconductance amplifier.

23. The CDF apparatus of claim 1, further comprising a clock generator, coupled to the SCN module to provide a plurality of clock signals, wherein the clock generator adjusts a phase difference of the clock signals according to a first control signal, or adjusts pulse width of the clock signals according to a second control signal.

24. An operation method of a charge-domain filter (CDF) apparatus, comprising:

configuring an input-signal combination network (ISCN), wherein at least one input terminal of the ISCN receives at least one input signal;

configuring a switched-capacitor network (SCN) module, wherein at least one input terminal of the SCN module is respectively connected to at least one output terminal of the ISCN;

configuring an output-signal combination network (OSCN), wherein at least one input terminal of the OSCN is respectively connected to at least one output terminal of the SCN module, and the OSCN outputs at least one output signal;

sensing a signal of the SCN module, sensing a signal of the OSCN, or sensing a signal of each of the SCN module and the OSCN, to obtain a sensing result;

correspondingly generating at least one feedback signal or at least one forward signal for the ISCN or the OSCN to perform bandwidth compensation according to the sensing result;

configuring a forward unit in the BCN, wherein at least one input terminal of the forward unit is coupled to the SCN module, coupled to the OSCN, or coupled to the SCN module and the OSCN, and at least one output terminal of the forward unit is coupled to the OSCN to provide the at least one forward signal to the OSCN to perform bandwidth compensation;

adjusting a portion or all of the signal of the SCN module and the signal of the OSCN with at least one configurable power-reference cell of the forward unit to serve as at least one first sensing power;

delaying the at least one first sensing power with at least one programmable-delay cell of the forward unit; and selecting a portion or all of the at least one first sensing power delayed to serve as the at least one forward signal and outputting the at least one forward signal to the OSCN with a signal selector of the forward unit.

25. The operation method of claim 24, further comprising:

configuring M SCN groups in the SCN module, wherein M is a positive integer, and at least one input terminal of a first SCN group in the SCN groups is respectively connected to the at least one output terminal of the ISCN; and configuring M routing circuits in the SCN module, wherein an $i^{th}$ routing circuit in the routing circuits is coupled between at least one output terminal of an $i^{th}$ SCN group in the SCN groups and at least one input terminal of an $(i+1)^{th}$ SCN group in the SCN groups so as to configure a coupling relation between the at least one output terminal of the $i^{th}$ SCN group and the at least one input terminal of the $(i+1)^{th}$ SCN group; and an $M^{th}$ routing circuit in the routing circuits is coupled between at least one output terminal of an $M^{th}$ SCN group in the SCN groups and the at least one input terminal of the OSCN so as to configure a coupling relation between the at least one output terminal of the $M^{th}$ SCN group and the at least one input terminal of the OSCN, wherein i is between 1 and M.

26. The operation method of claim 25, wherein a portion or all of the output terminals of the SCN groups provide the signal of the SCN module to the BCN.

27. The operation method of claim 24, further comprising:
configuring a feedback unit in the BCN, wherein at least one input terminal of the feedback unit is coupled to the SCN module, coupled to the OSCN, or coupled to the SCN module and the OSCN, and at least one output terminal of the feedback unit is coupled to the ISCN to provide the at least one feedback signal to the ISCN to perform bandwidth compensation.

28. The operation method of claim 27, further comprising:
adjusting a portion or all of the signal of the SCN module and the signal of the OSCN with at least one configurable power-reference cell of the feedback unit to serve as at least one first sensing power;
delaying the at least one first sensing power with at least one programmable-delay cell of the feedback unit; and
selecting a portion or all of the at least one first sensing power delayed to serve as the at least one feedback signal and outputting the at least one feedback signal to the ISCN with a signal selector of the feedback unit.

29. The operation method of claim 27, further comprising:
adjusting a portion or all of the signal of the SCN module and the signal of the OSCN with at least one configurable power-reference cell of the feedback unit to serve as at least one first sensing power; and
selecting a portion or all of the at least one first sensing power to serve as the at least one feedback signal and outputting the at least one feedback signal to the ISCN with a signal selector of the feedback unit.

30. The operation method of claim 27, further comprising:
delaying a portion or all of the signal of the SCN module and the signal of the OSCN with at least one programmable-delay cell of the feedback unit to serve as at least one first sensing power; and
selecting a portion or all of the at least one first sensing power to serve as the at least one feedback signal and outputting the at least one feedback signal to the ISCN with a signal selector of the feedback unit.

31. The operation method of claim 27, further comprising:
adjusting a portion or all of the signal of the SCN module and the signal of the OSCN with at least one configurable power-reference cell of the feedback unit to serve as the at least one feedback signal, and outputting the at least one feedback signal to the ISCN.

32. The operation method of claim 27, further comprising:
selecting a portion or all of the signal of the SCN module and the signal of the OSCN to serve as the at least one feedback signal and outputting the at least one feedback signal to the ISCN with a signal selector of the feedback unit.

33. The operation method of claim 27, further comprising:
adjusting a portion or all of the signal of the SCN module and the signal of the OSCN with at least one configurable power-reference cell of the feedback unit to serve as at least one first sensing power; and
delaying the at least one first sensing power with at least one programmable-delay cell of the feedback unit, using the at least one first sensing power delayed to serve as the at least one feedback signal, and outputting the at least one feedback signal to the ISCN.

34. An operation method of a charge-domain filter (CDF) apparatus, comprising:
configuring an input-signal combination network (ISCN), wherein at least one input terminal of the ISCN receives at least one input signal;
configuring a switched-capacitor network (SCN) module, wherein at least one input terminal of the SCN module is respectively connected to at least one output terminal of the ISCN;
configuring an output-signal combination network (OSCN), wherein at least one input terminal of the OSCN is respectively connected to at least one output terminal of the SCN module, and the OSCN outputs at least one output signal;
sensing a signal of the SCN module, sensing a signal of the OSCN, or sensing a signal of each of the SCN module and the OSCN, to obtain a sensing result;
correspondingly generating at least one feedback signal or at least one forward signal for the ISCN or the OSCN to perform bandwidth compensation according to the sensing result;
configuring a forward unit in the BCN, wherein at least one input terminal of the forward unit is coupled to the SCN module, coupled to the OSCN, or coupled to the SCN module and the OSCN, and at least one output terminal of the forward unit is coupled to the OSCN to provide the at least one forward signal to the OSCN to perform bandwidth compensation;
adjusting a portion or all of the signal of the SCN module and the signal of the OSCN with at least one configurable power-reference cell of the forward unit to serve as at least one first sensing power; and
delaying the at least one first sensing power with at least one programmable-delay cell of the forward unit, using the at least one first sensing power delayed to serve as the at least one forward signal, and outputting the at least one forward signal to the OSCN.

35. The operation method of claim 24, further comprising:
adjusting a phase difference of plurality of clock signals according to a first control signal, or adjusting a pulse width of the clock signals according to a second control signal; and
providing the clock signals to the SCN module.

* * * * *